(12) United States Patent
Katsuoka et al.

(10) Patent No.: US 7,575,636 B2
(45) Date of Patent: Aug. 18, 2009

(54) SUBSTRATE PROCESSING APPARATUS AND SUBSTRATE PROCESSING METHOD

(75) Inventors: Seiji Katsuoka, Tokyo (JP); Masahiko Sekimoto, Tokyo (JP); Toshio Yokoyama, Tokyo (JP); Teruyuki Watanabe, Tokyo (JP); Takahiro Ogawa, Tokyo (JP); Kenichi Kobayashi, Tokyo (JP); Mitsuru Miyazaki, Tokyo (JP); Yasuyuki Motoshima, Tokyo (JP); Akira Owatari, Tokyo (JP); Naoki Dai, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 11/455,777

(22) Filed: Jun. 20, 2006

(65) Prior Publication Data

US 2006/0243205 A1    Nov. 2, 2006

Related U.S. Application Data

(62) Division of application No. 10/712,348, filed on Nov. 14, 2003, now Pat. No. 7,087,117.

(30) Foreign Application Priority Data

| Nov. 15, 2002 | (JP) | 2002-332944 |
| Jan. 24, 2003 | (JP) | 2003-016727 |
| Mar. 7, 2003 | (JP) | 2003-061368 |
| Mar. 12, 2003 | (JP) | 2003-067211 |
| Mar. 17, 2003 | (JP) | 2003-072328 |
| May 23, 2003 | (JP) | 2003-146641 |

(51) Int. Cl.
*B05C 3/02* (2006.01)

(52) U.S. Cl. .............. 118/428; 118/429; 118/500; 204/270; 204/278; 204/297.01

(58) Field of Classification Search ........... 118/500, 118/428, 429; 269/20, 21; 204/298.01, 224 R, 204/270, 278, 297.01; 451/388, 289; 205/148, 205/96
See application file for complete search history.

(56) References Cited

U.S. PATENT DOCUMENTS

| 3,489,608 | A | | 1/1970 | Jacobs et al. |
| 3,916,937 | A | | 11/1975 | Nystrom |
| 4,174,261 | A | | 11/1979 | Pellegrino |
| 4,254,590 | A | * | 3/1981 | Eisele et al. ........ 451/55 |
| 5,377,708 | A | | 1/1995 | Bergman et al. |

(Continued)

FOREIGN PATENT DOCUMENTS

JP    11-350148    12/1999

(Continued)

*Primary Examiner*—Laura Edwards
(74) *Attorney, Agent, or Firm*—Wenderoth, Lind & Ponack, L.L.P.

(57) ABSTRACT

The present invention relates to a substrate processing apparatus useful for plating a substrate or processing a substrate by dipping a substrate in a processing liquid. A substrate processing apparatus of the present invention includes: a loading/unloading area for carrying in and out a substrate; a cleaning area for cleaning the substrate; and a plating area for plating the substrate. The loading/unloading area is provided with a substrate transfer robot having a plurality of hands of dry-use design, a loading port mounted with a cassette for housing substrates, and a reversing machine of dry-use design for reversing the substrate from face up to face down.

13 Claims, 57 Drawing Sheets

U.S. PATENT DOCUMENTS

| | | |
|---|---|---|
| 5,573,023 A | 11/1996 | Thompson et al. |
| 5,795,215 A * | 8/1998 | Guthrie et al. .............. 451/286 |
| 6,074,544 A * | 6/2000 | Reid et al. ................... 205/157 |
| 6,077,412 A * | 6/2000 | Ting et al. .................... 205/143 |
| 6,258,220 B1 * | 7/2001 | Dordi et al. ................. 204/198 |
| 6,294,059 B1 | 9/2001 | Hongo et al. |
| 6,352,623 B1 | 3/2002 | Volodarsky et al. |
| 6,390,904 B1 * | 5/2002 | Gleason et al. ............. 451/286 |
| 6,964,792 B1 * | 11/2005 | Mayer et al. ............. 427/430.1 |
| 2001/0017105 A1 * | 8/2001 | Ishida et al. ................ 118/429 |
| 2002/0127956 A1 * | 9/2002 | Ashjaee et al. ................ 451/54 |
| 2004/0040131 A1 | 3/2004 | Miyazaki et al. |

FOREIGN PATENT DOCUMENTS

WO    2003/105200    12/2003

\* cited by examiner

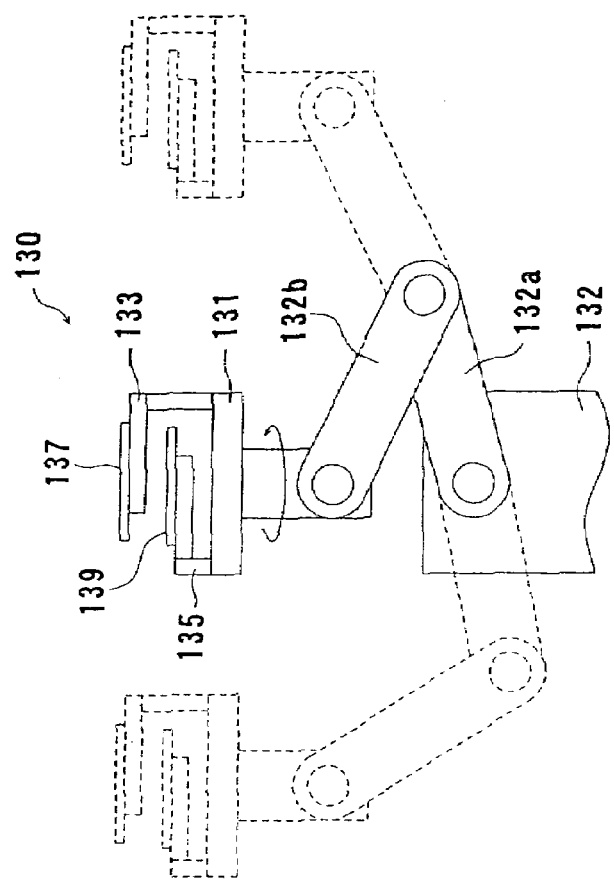
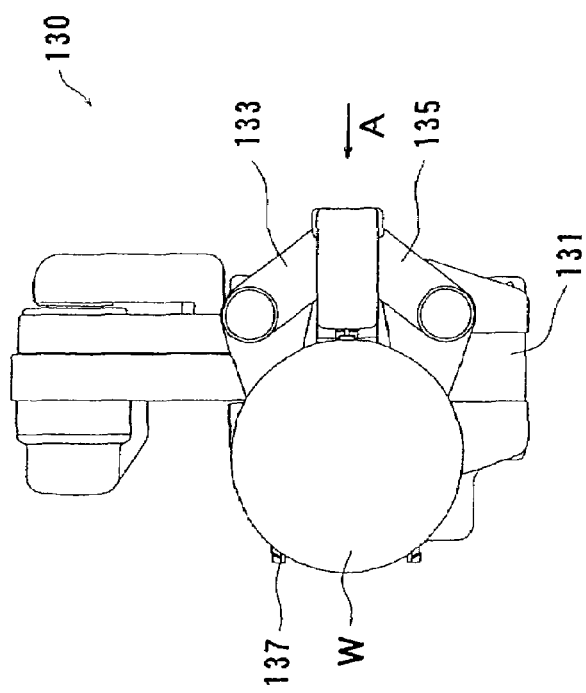
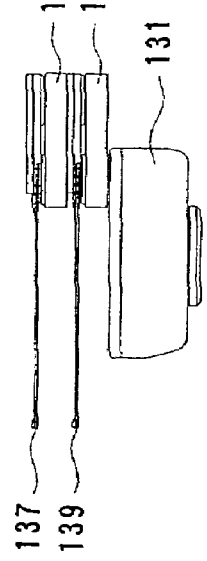

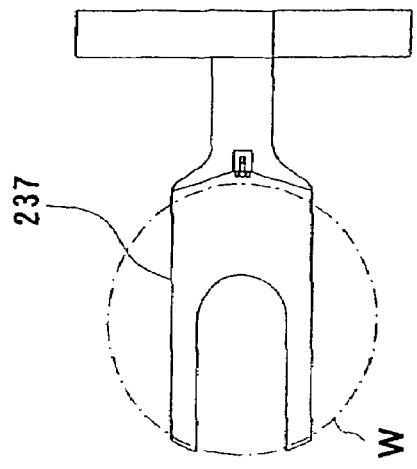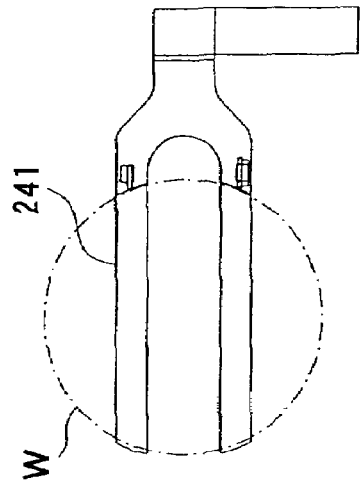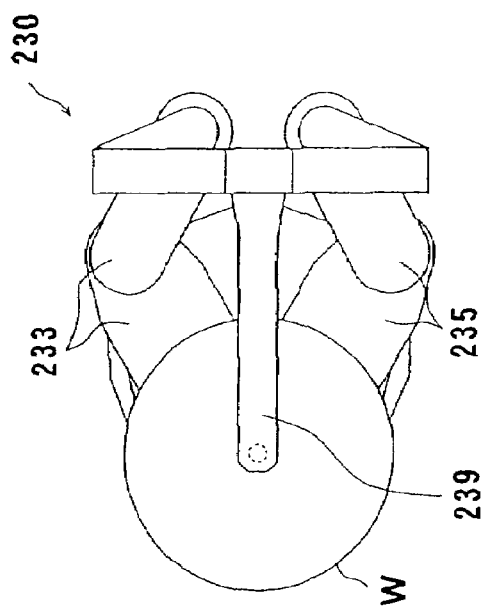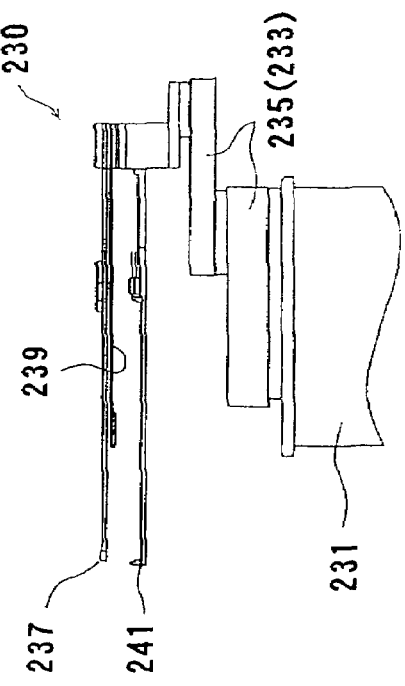

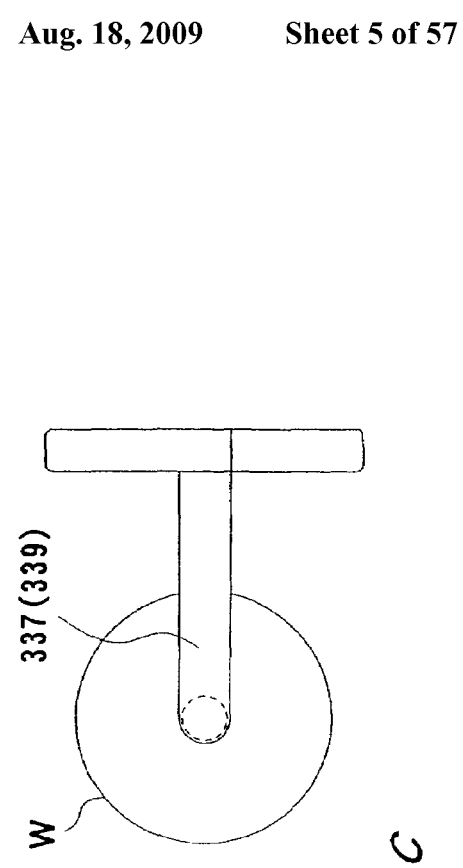
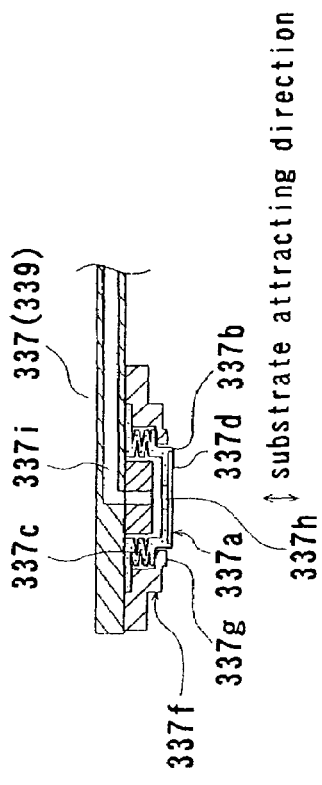
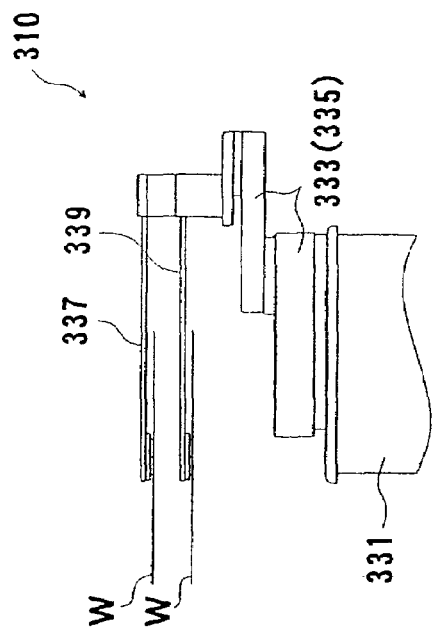

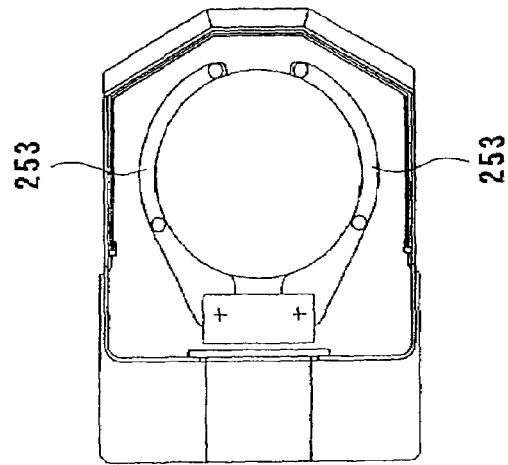
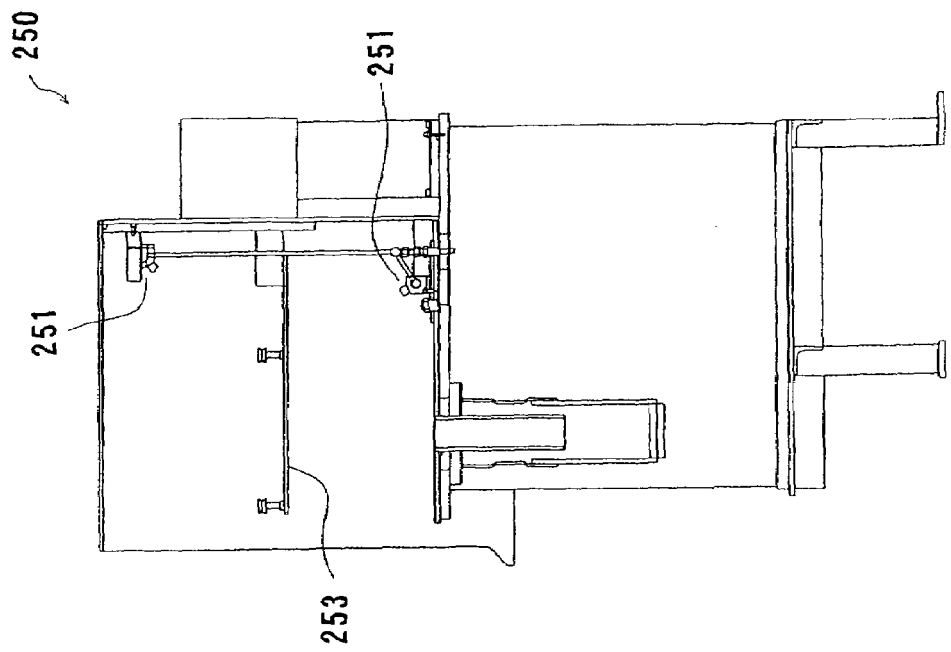

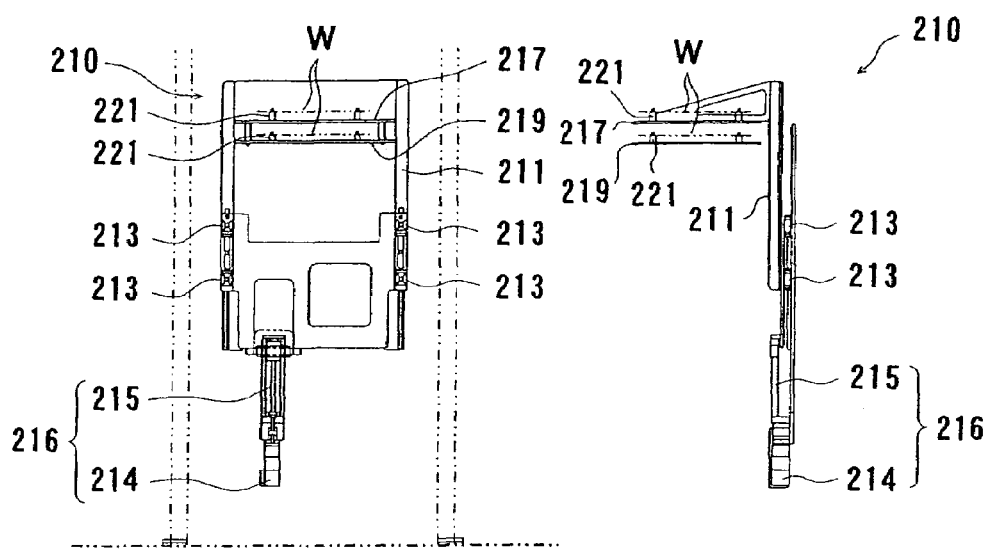
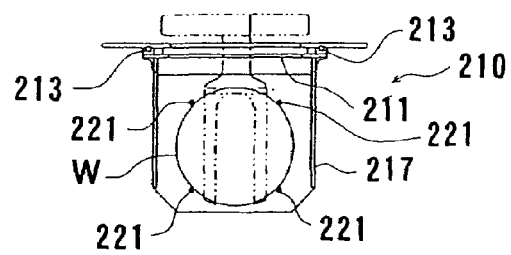

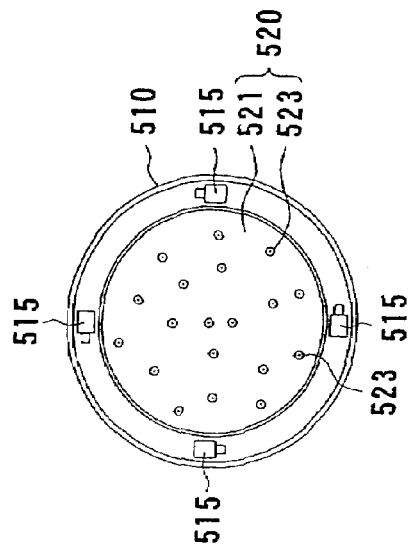
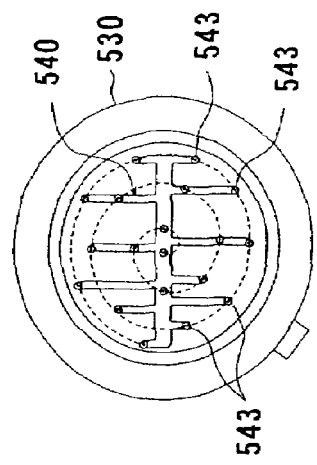
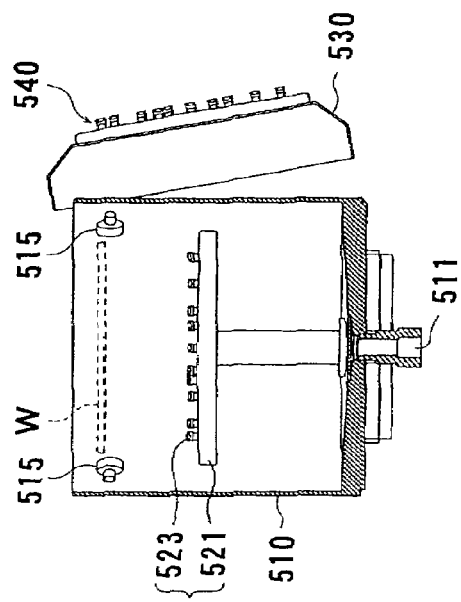
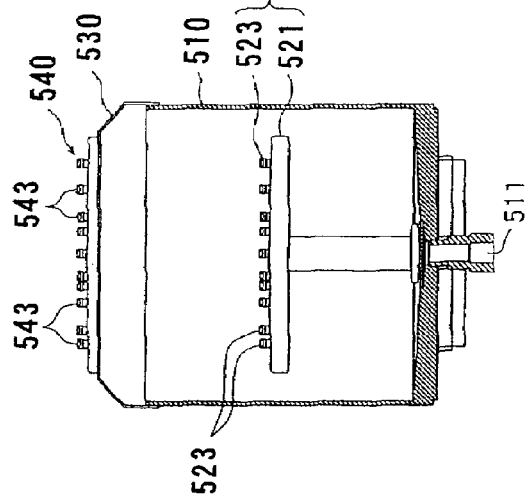

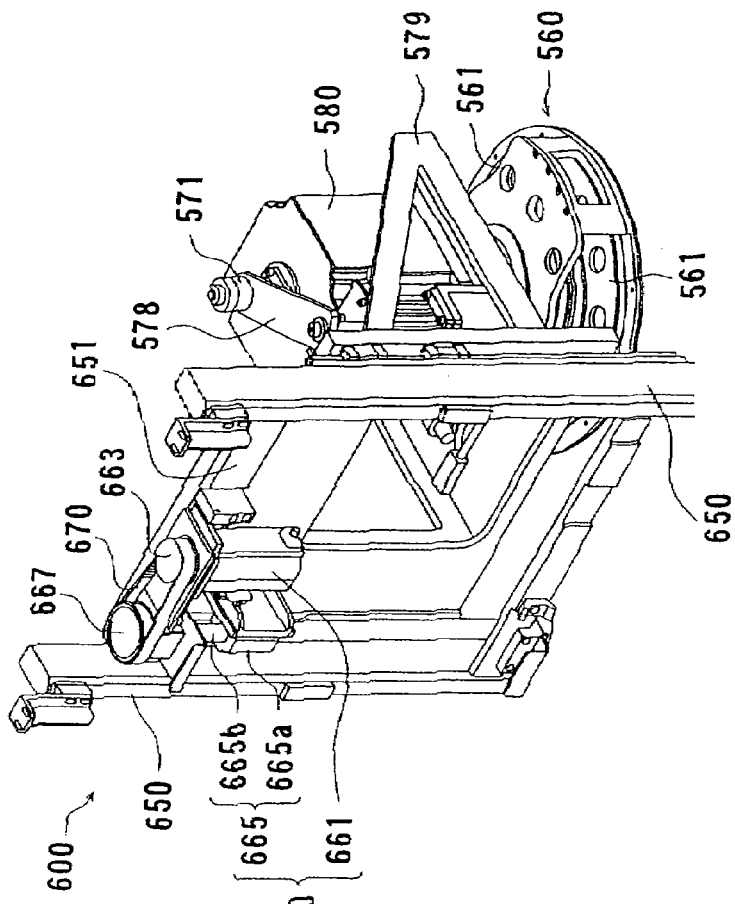
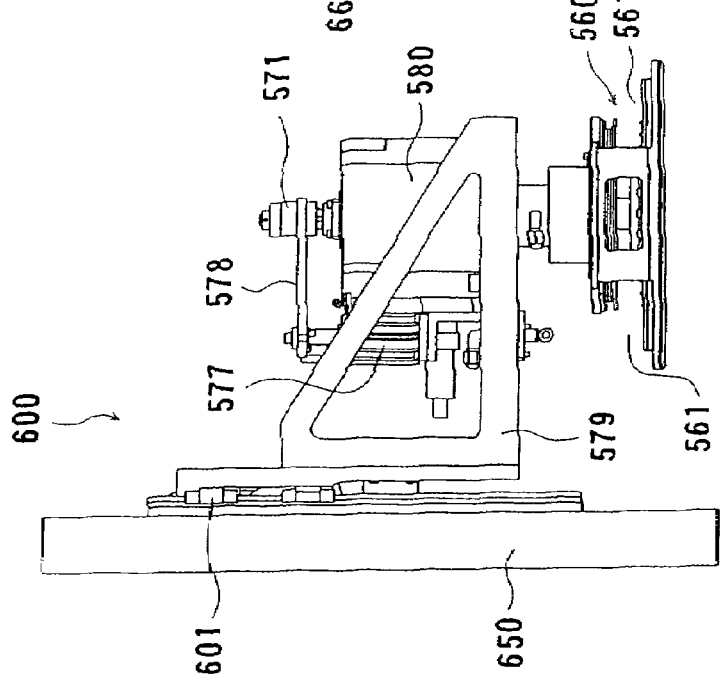
FIG.12A
FIG.12B

F I G. 1 3
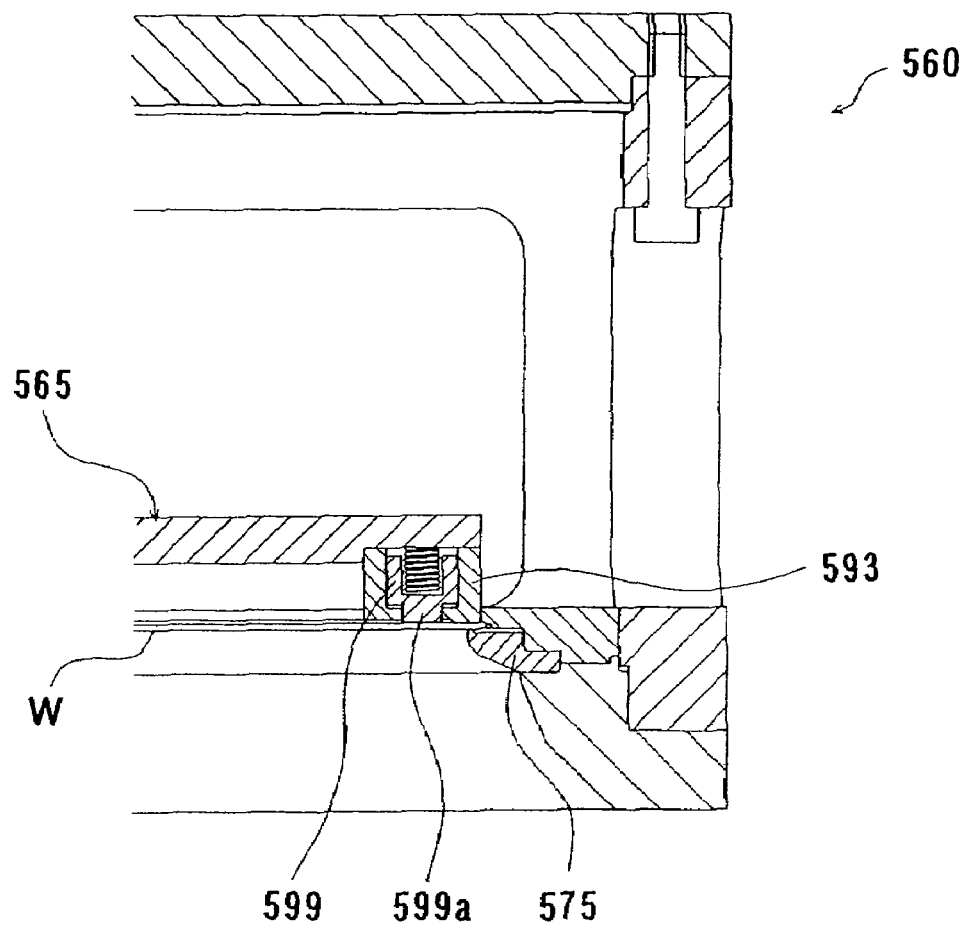

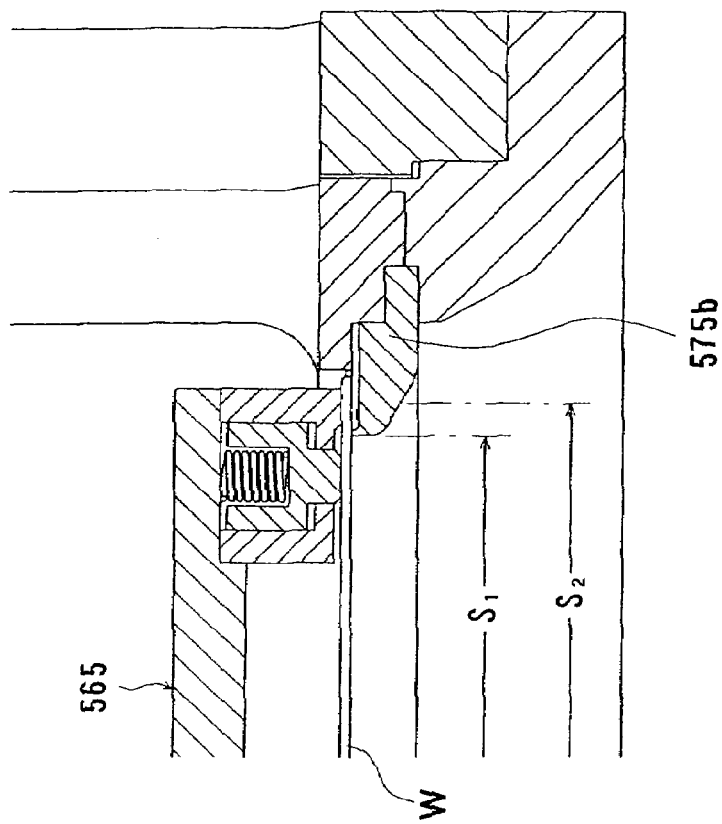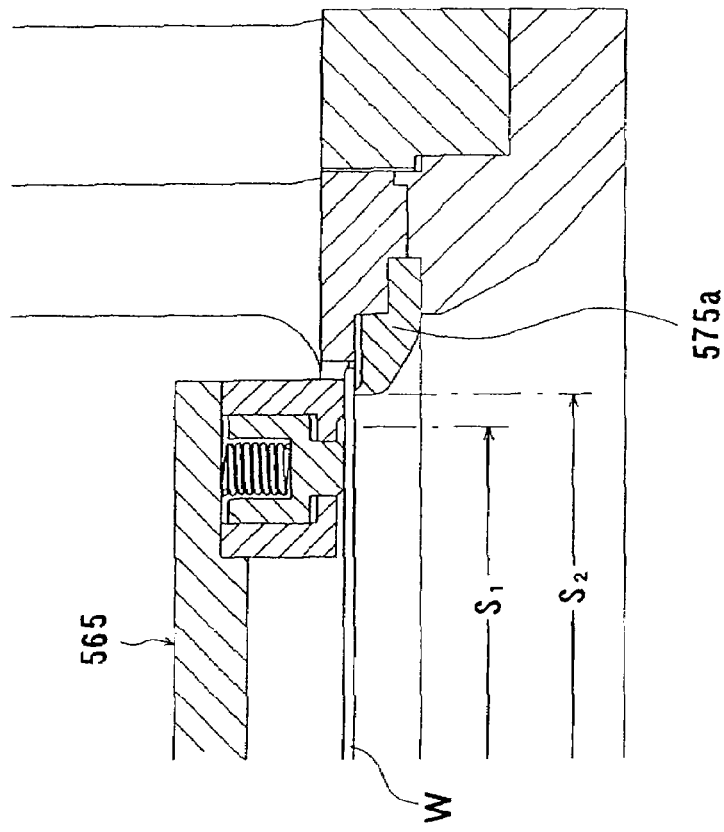

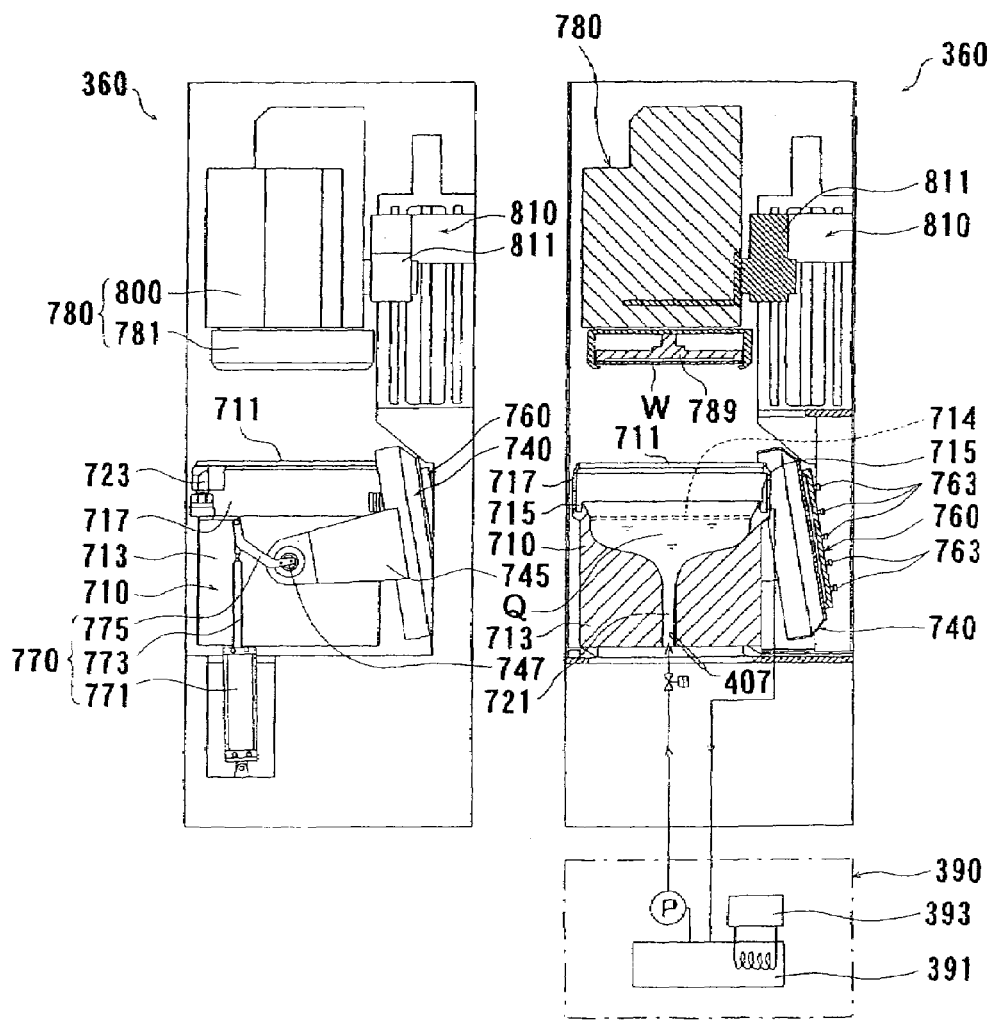

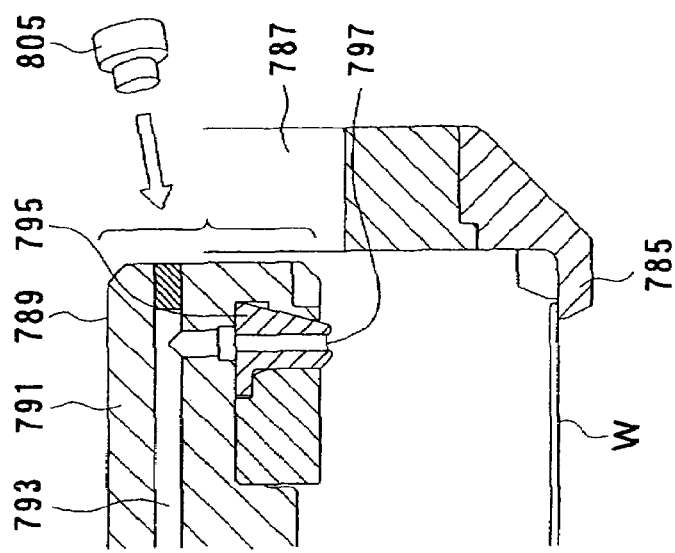
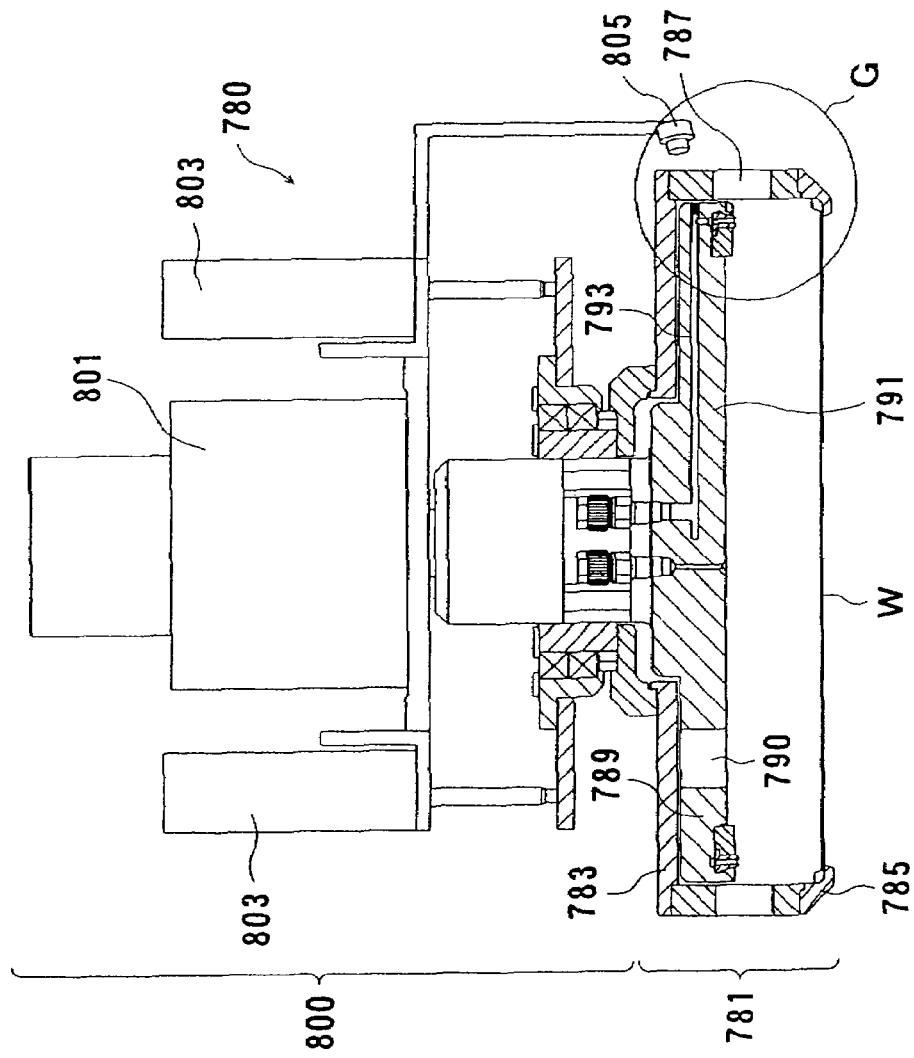

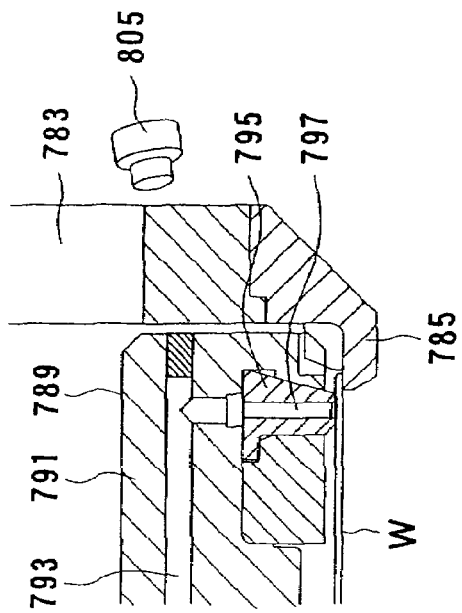
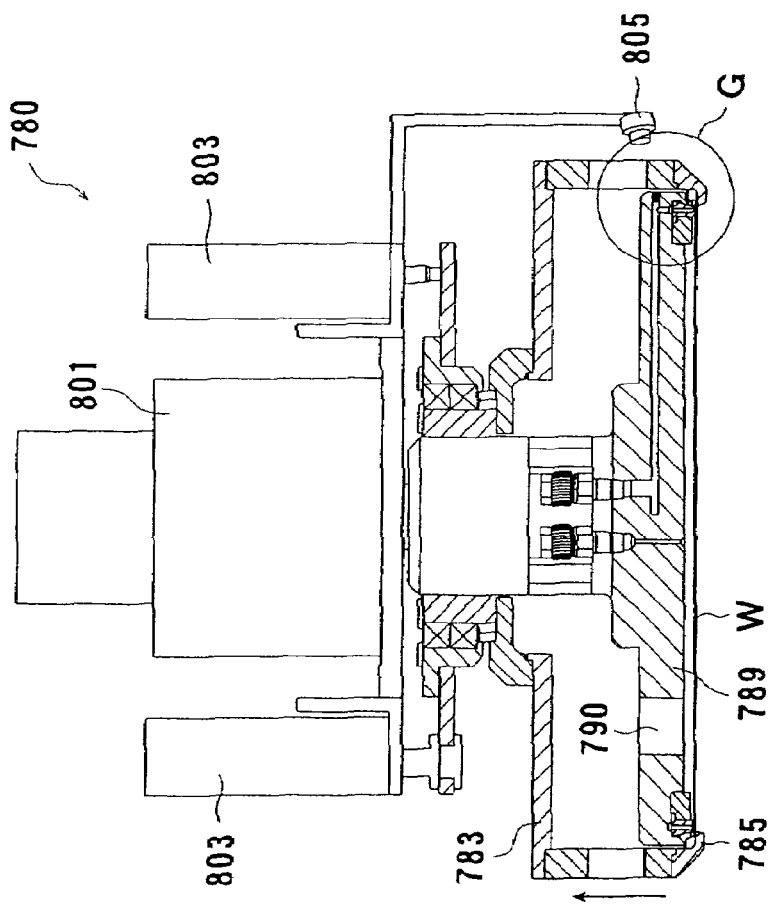
FIG. 19A
FIG. 19B

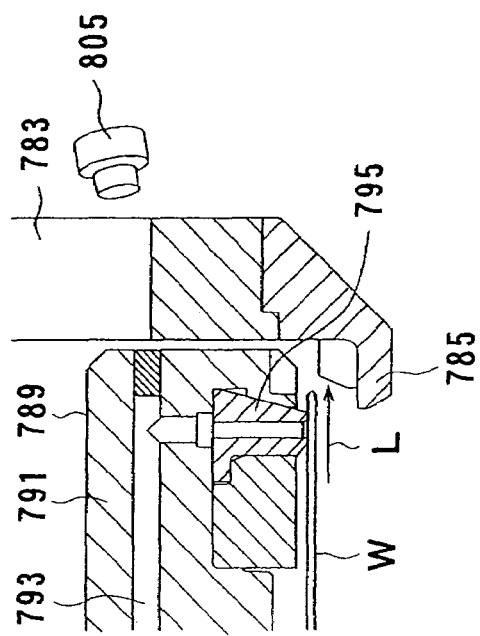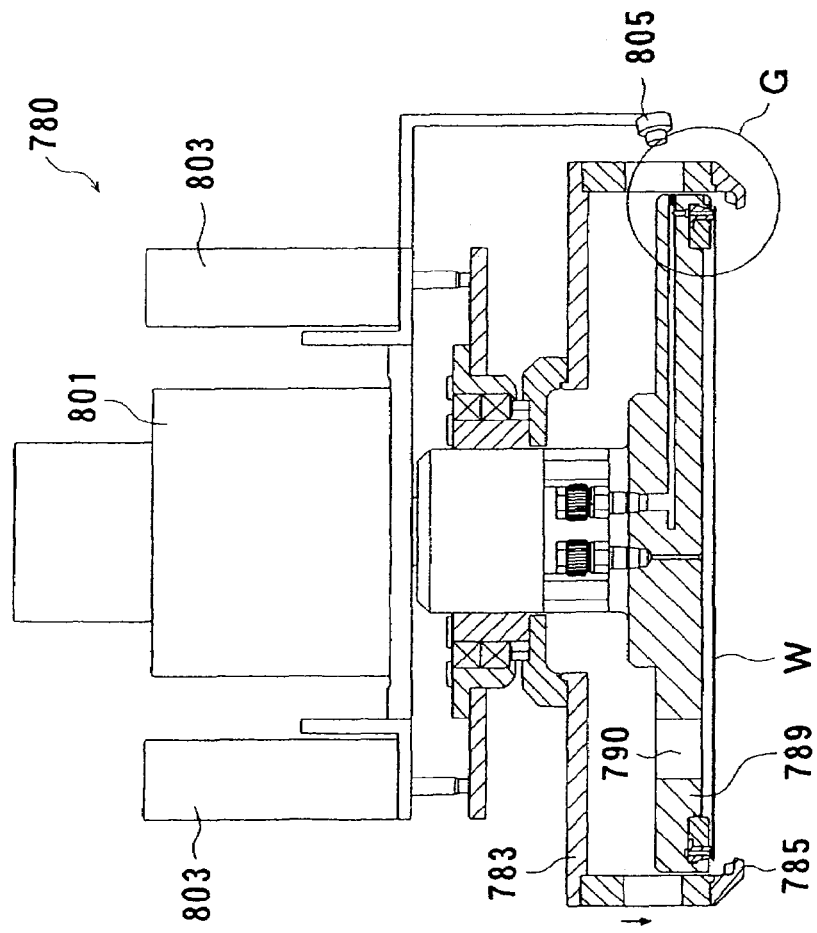

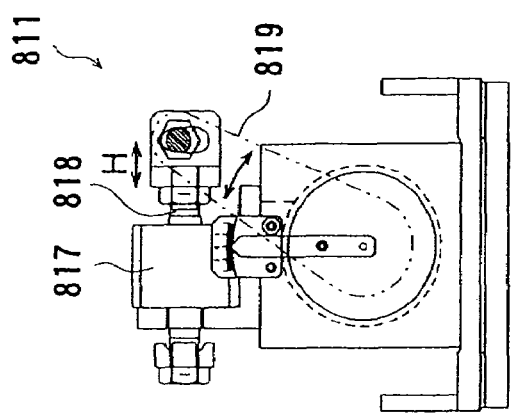
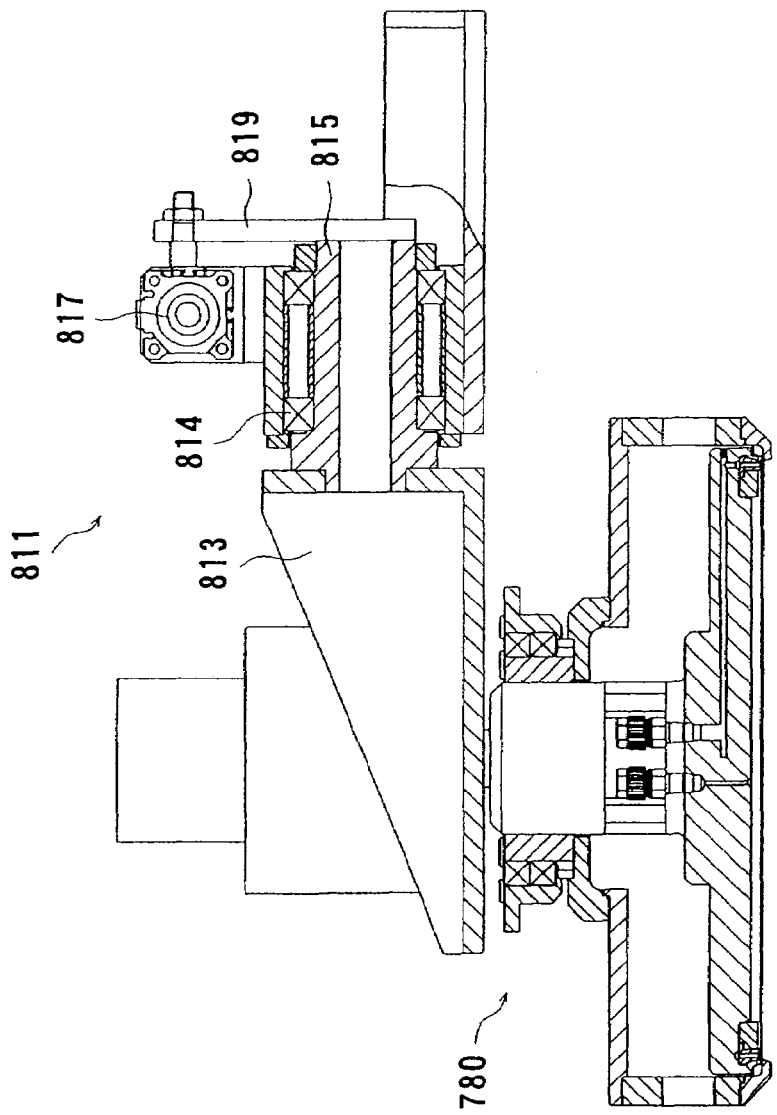

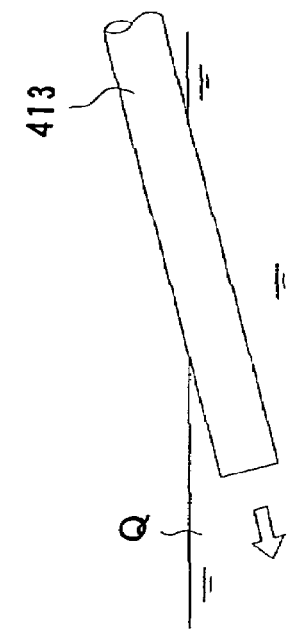
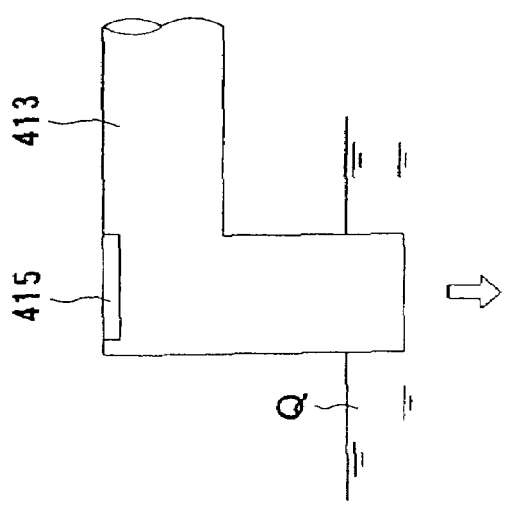
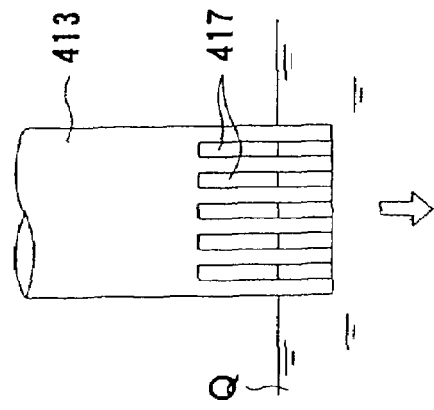

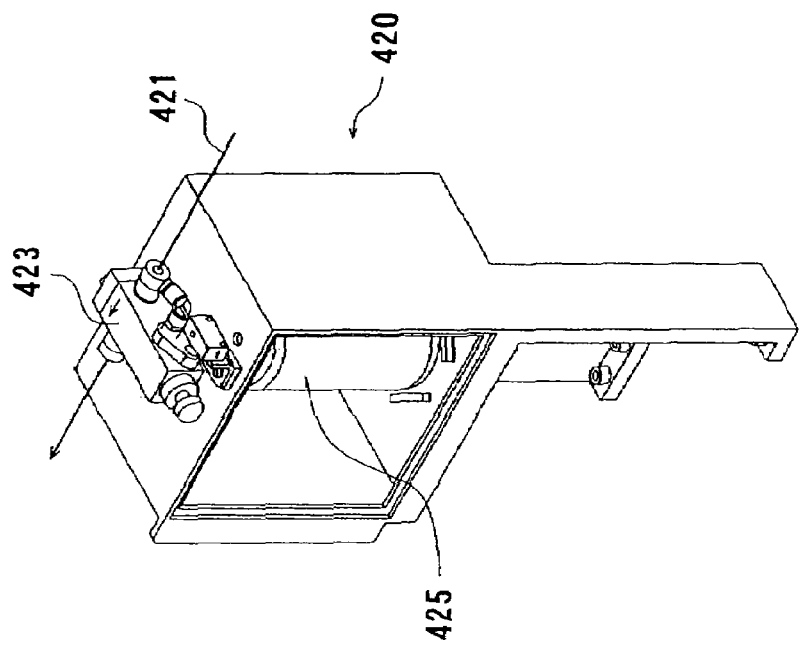
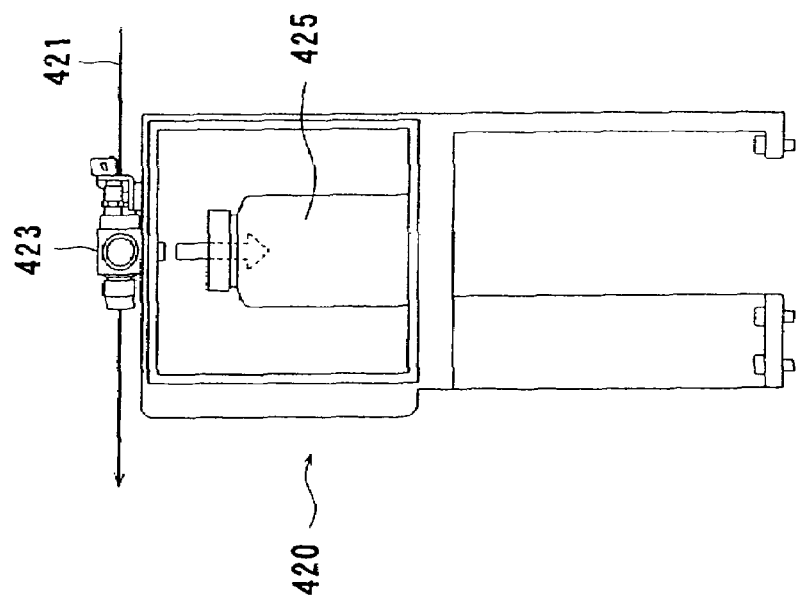

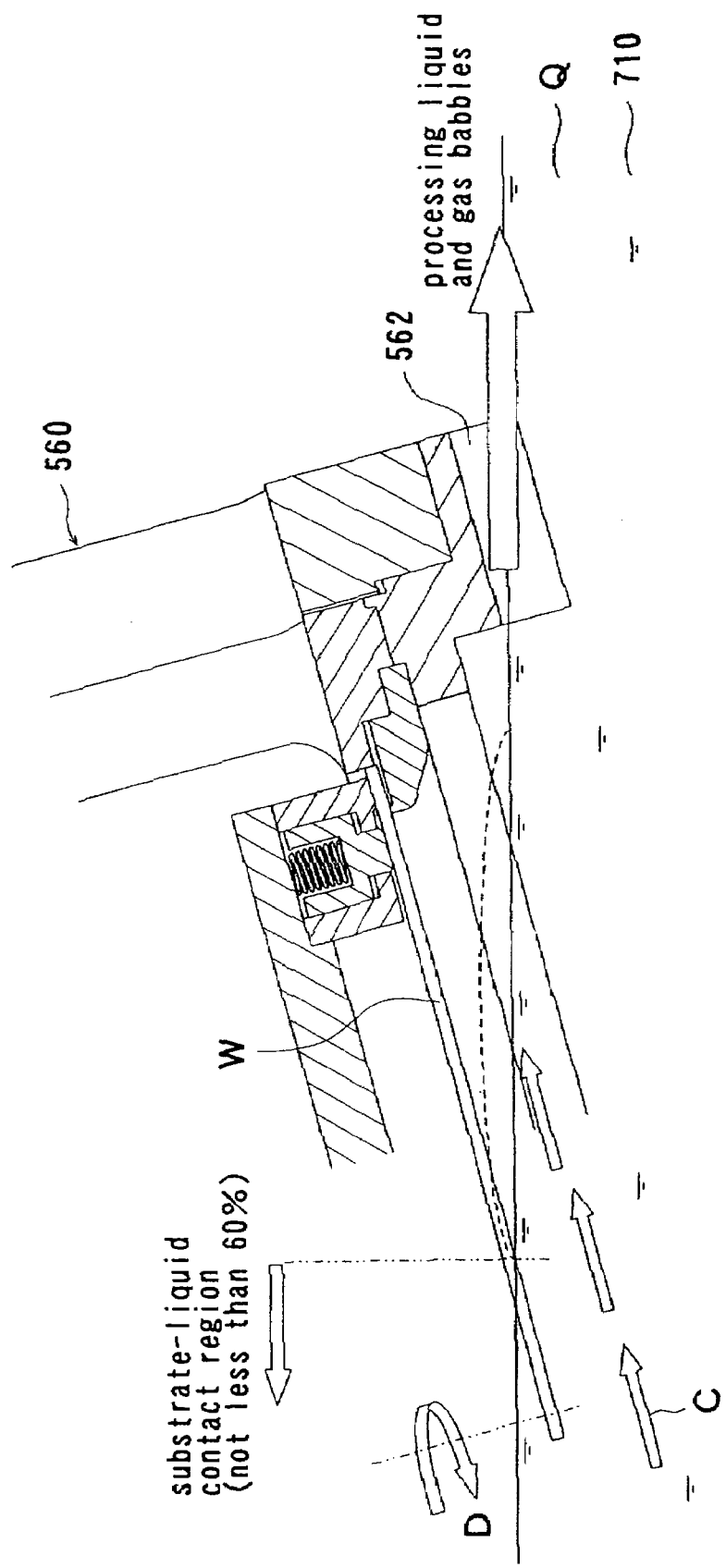

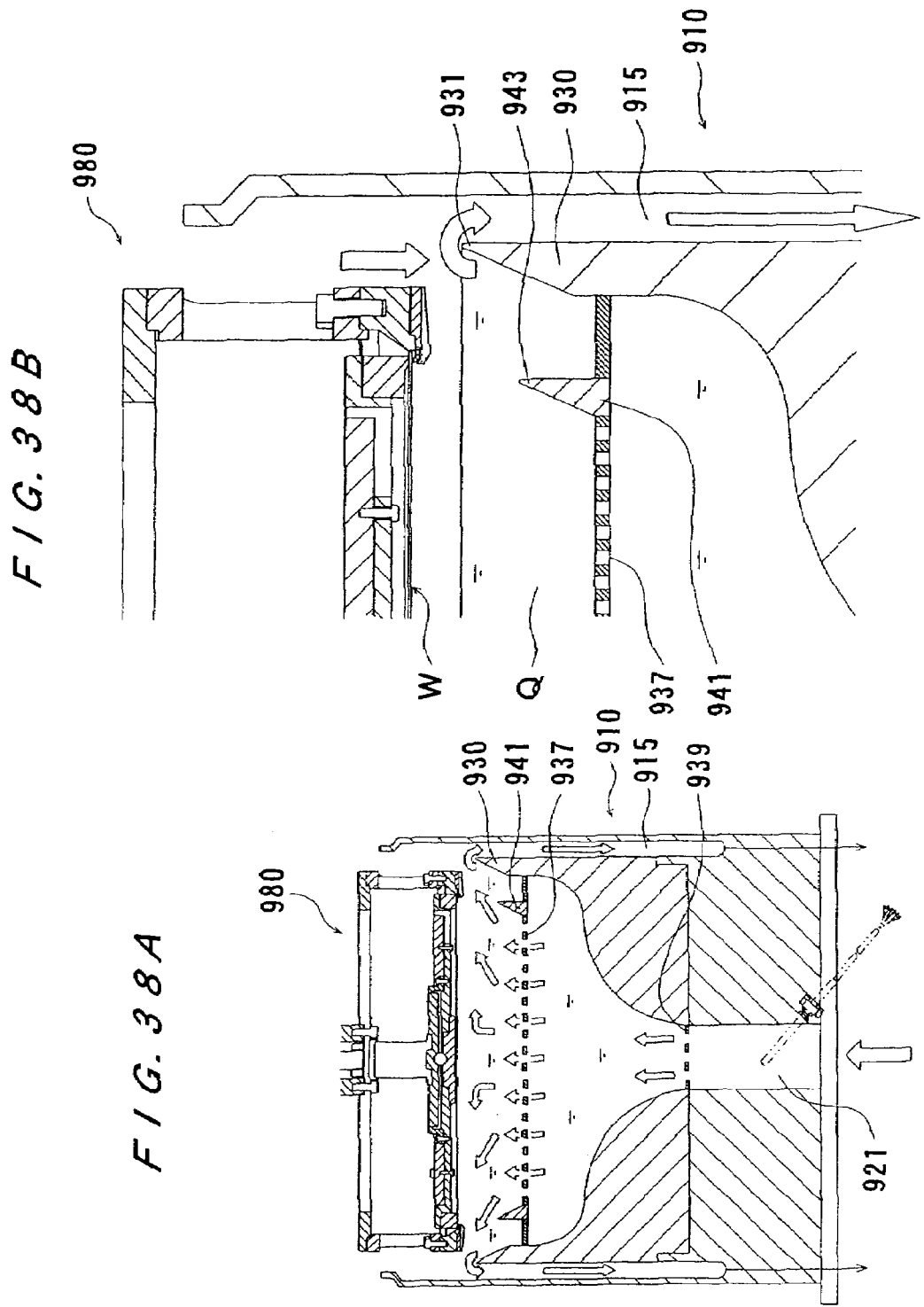

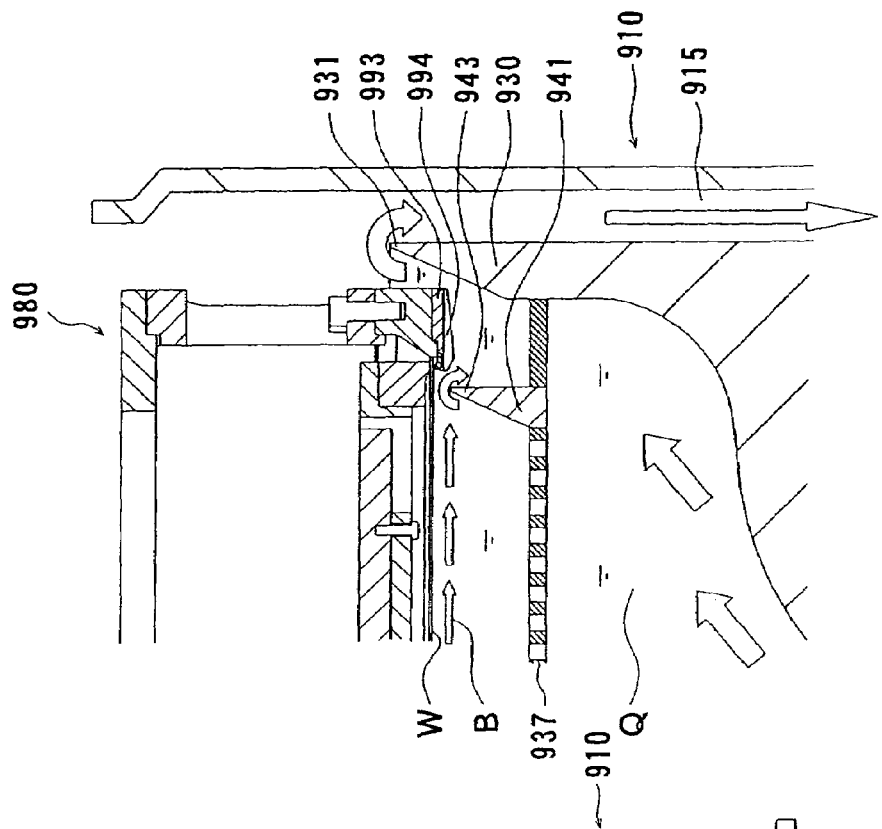
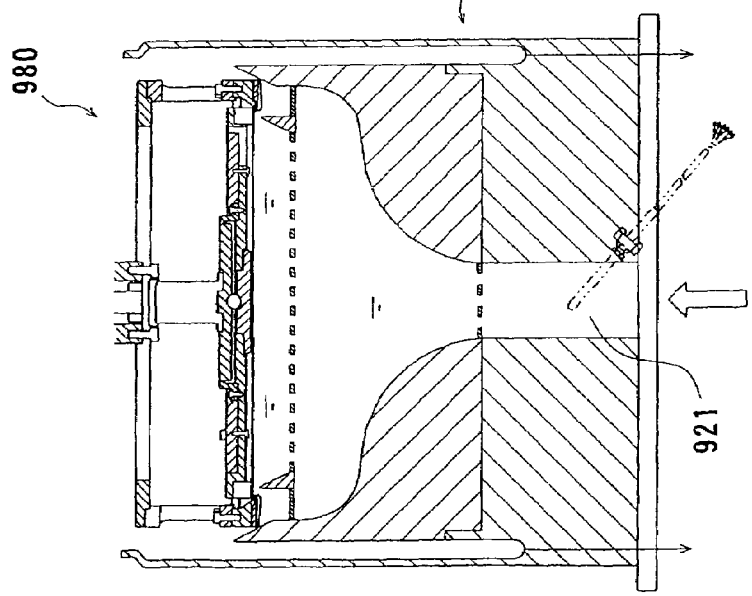
FIG. 39A
FIG. 39B

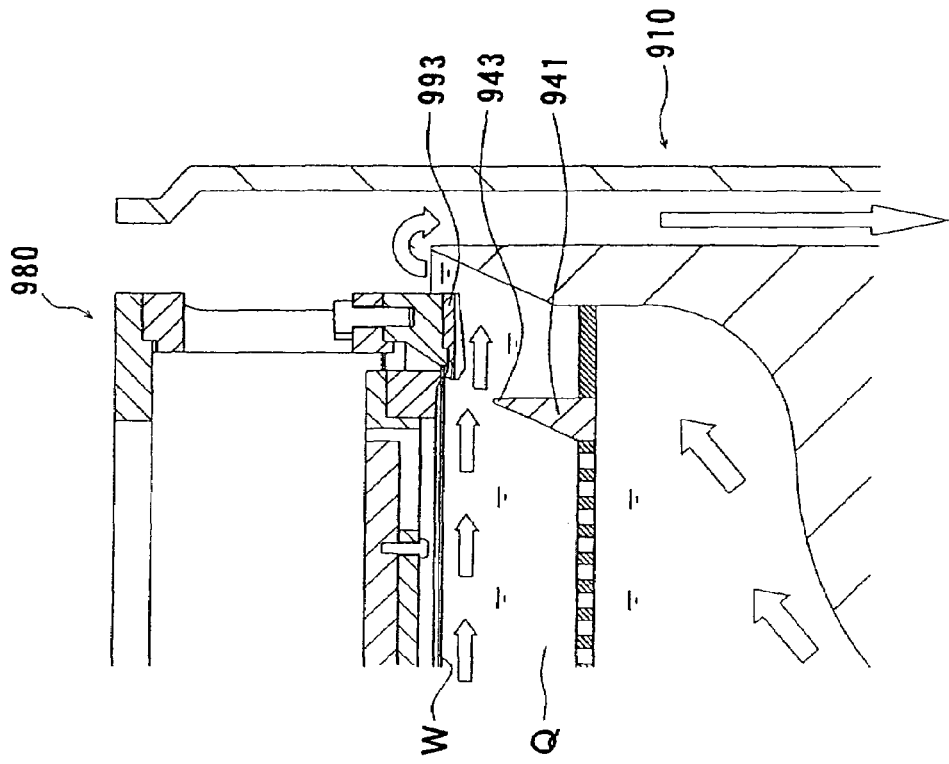
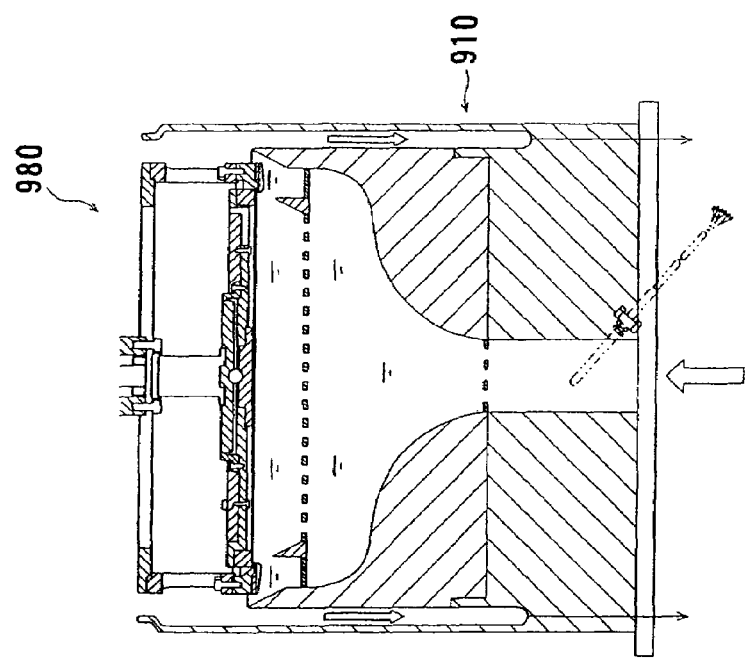
FIG. 40B
FIG. 40A

FIG. 41A
FIG. 41B
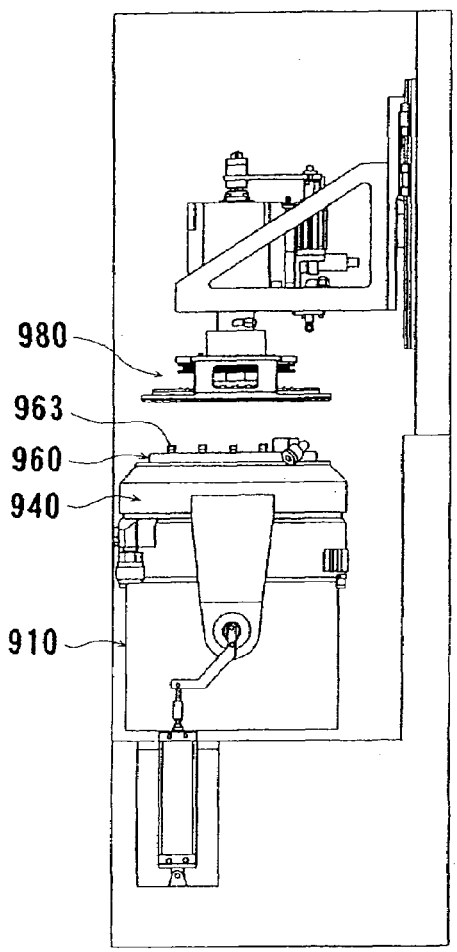
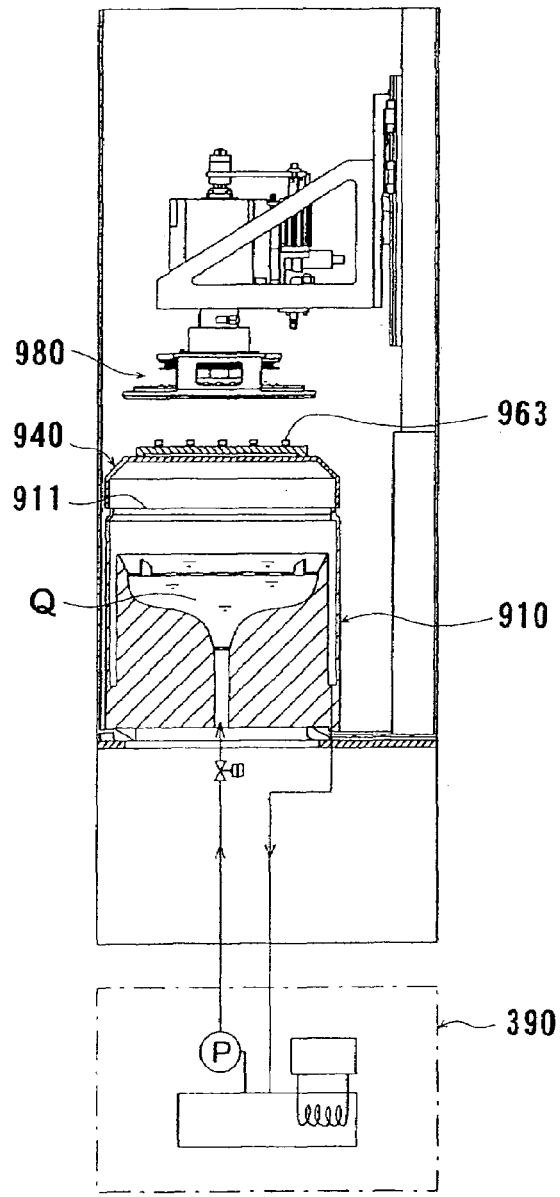

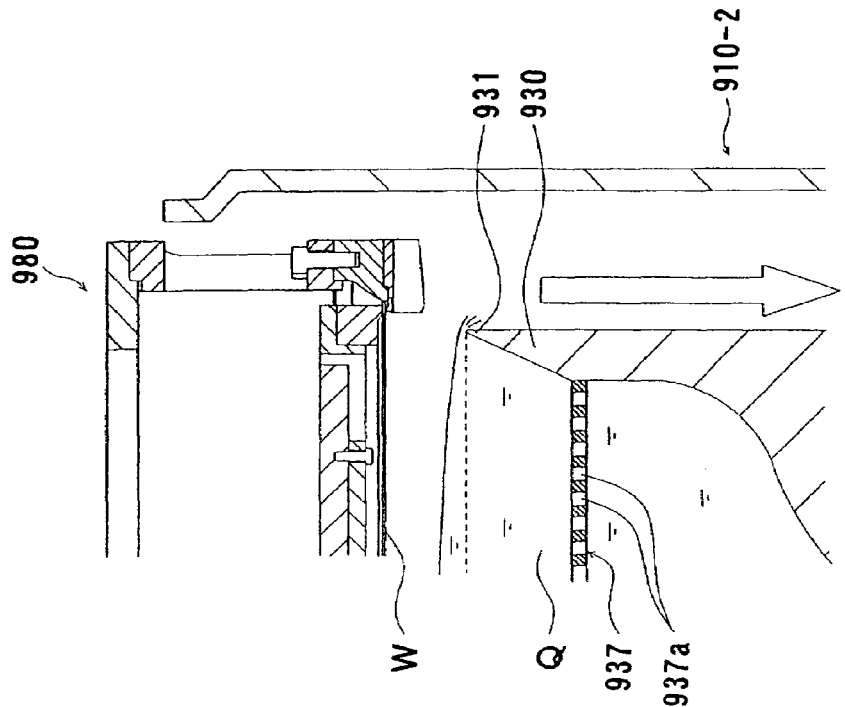
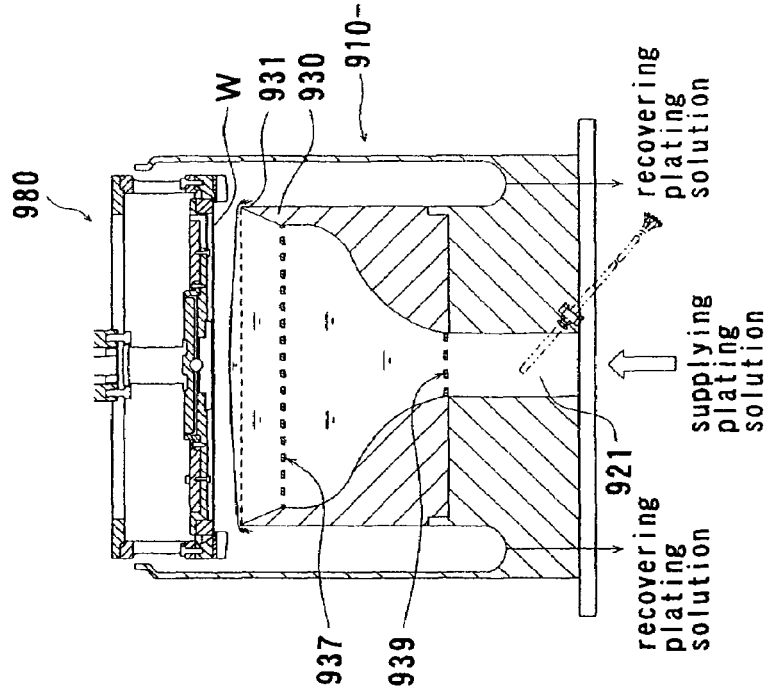

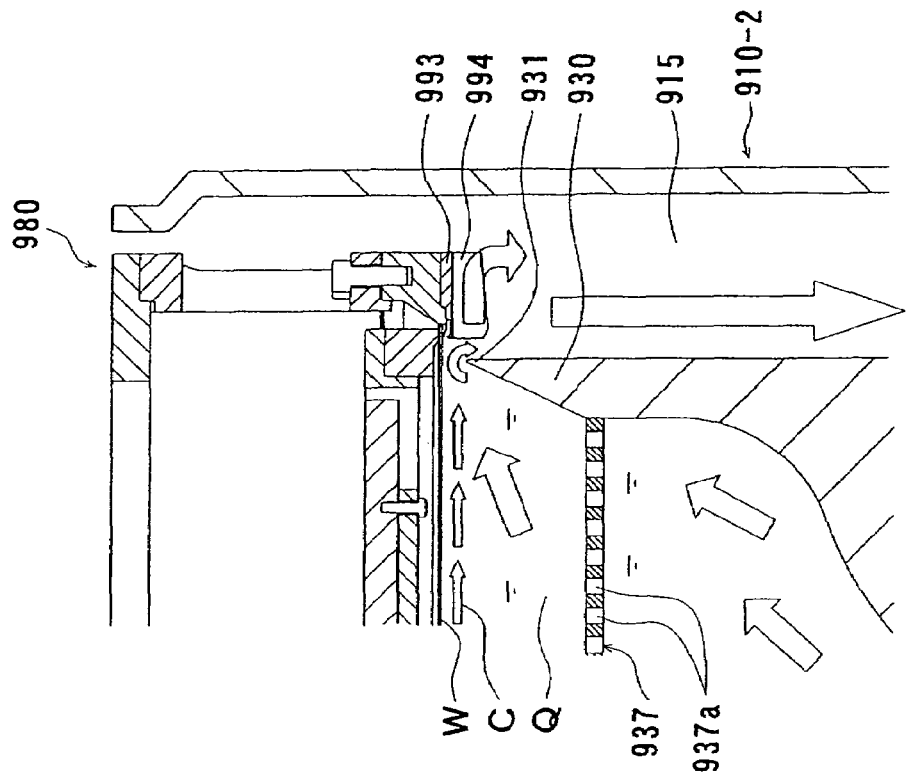
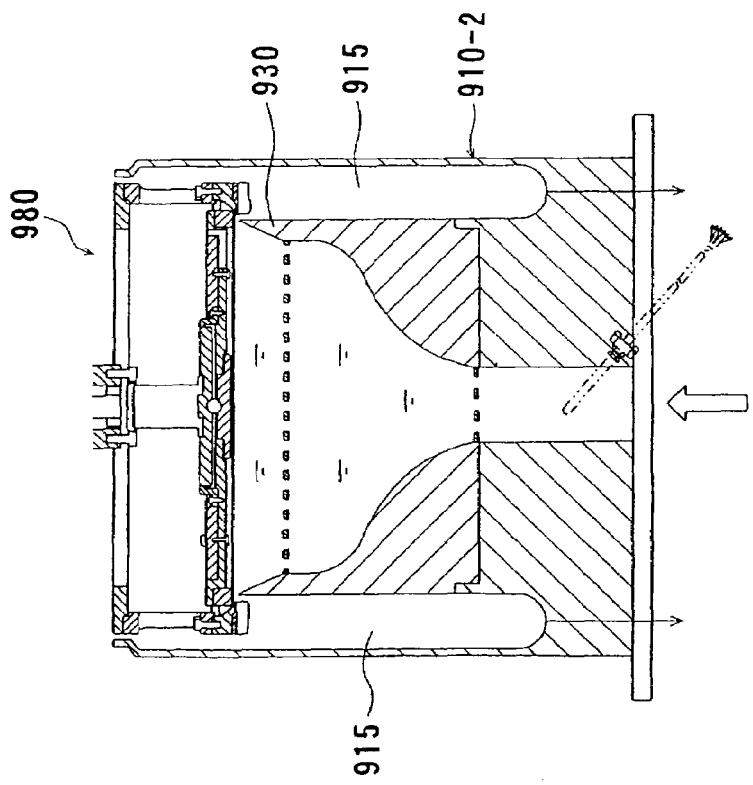
FIG. 43A
FIG. 43B

F I G. 45
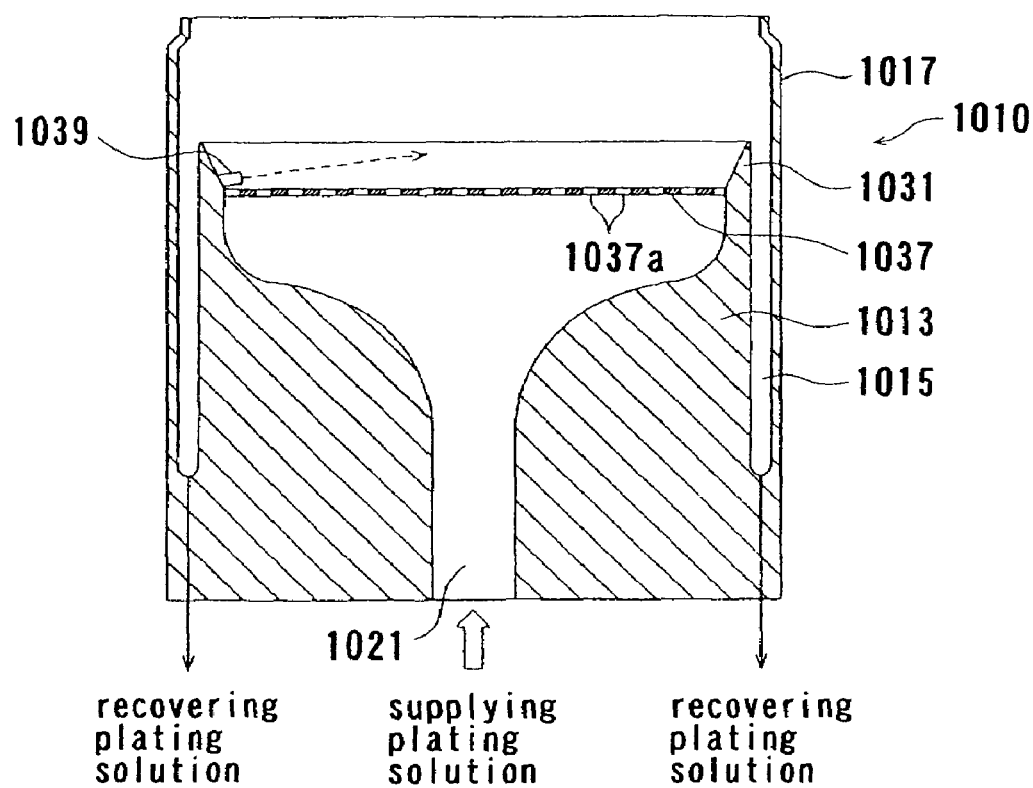

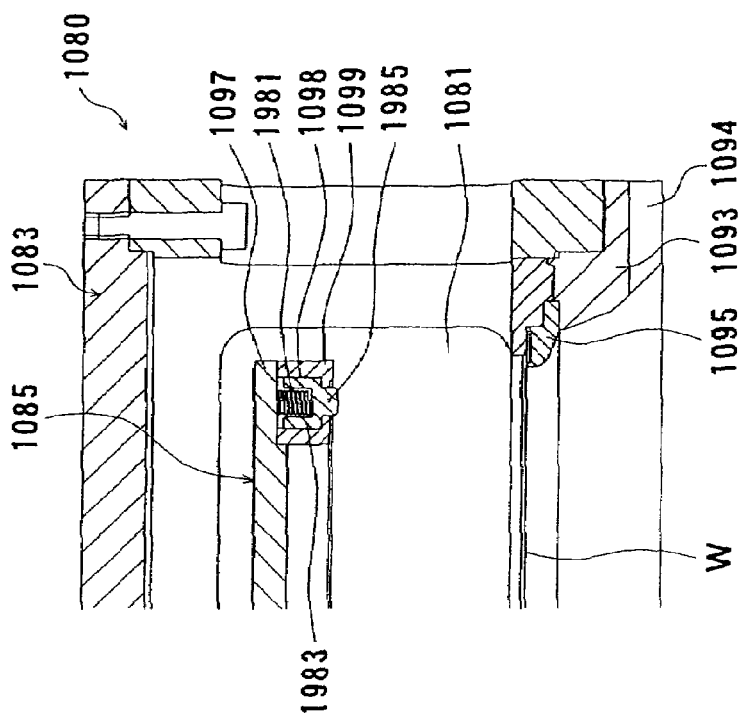
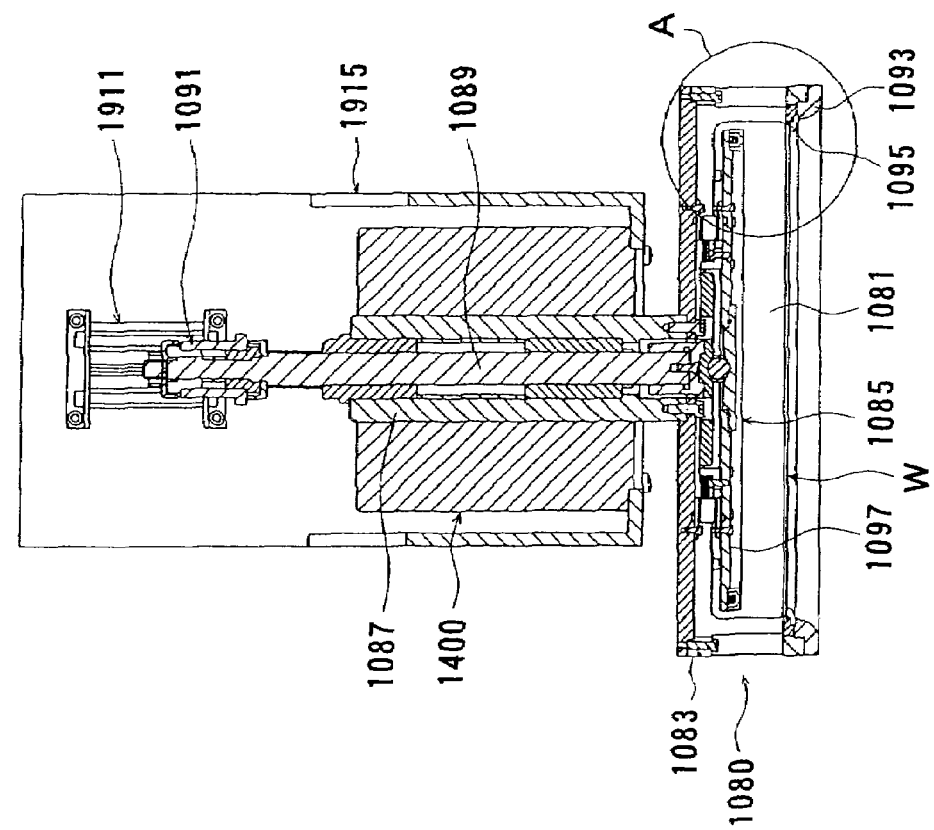

F I G. 4 7
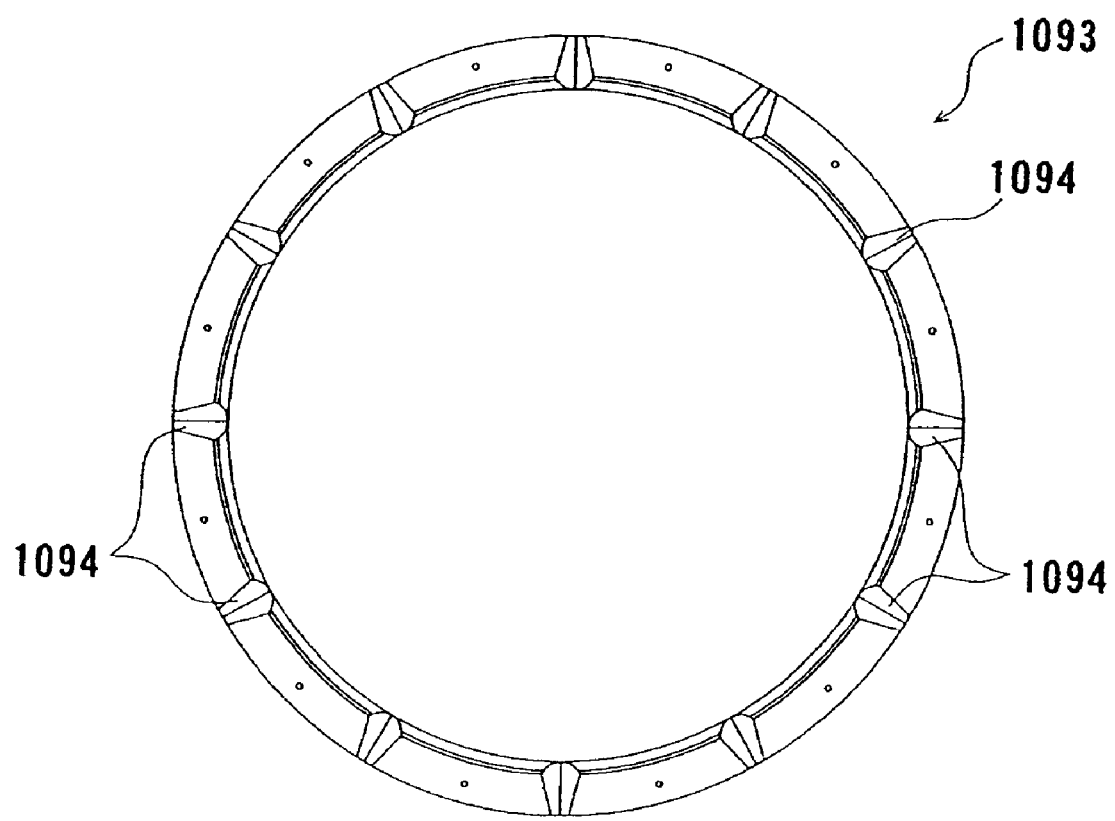

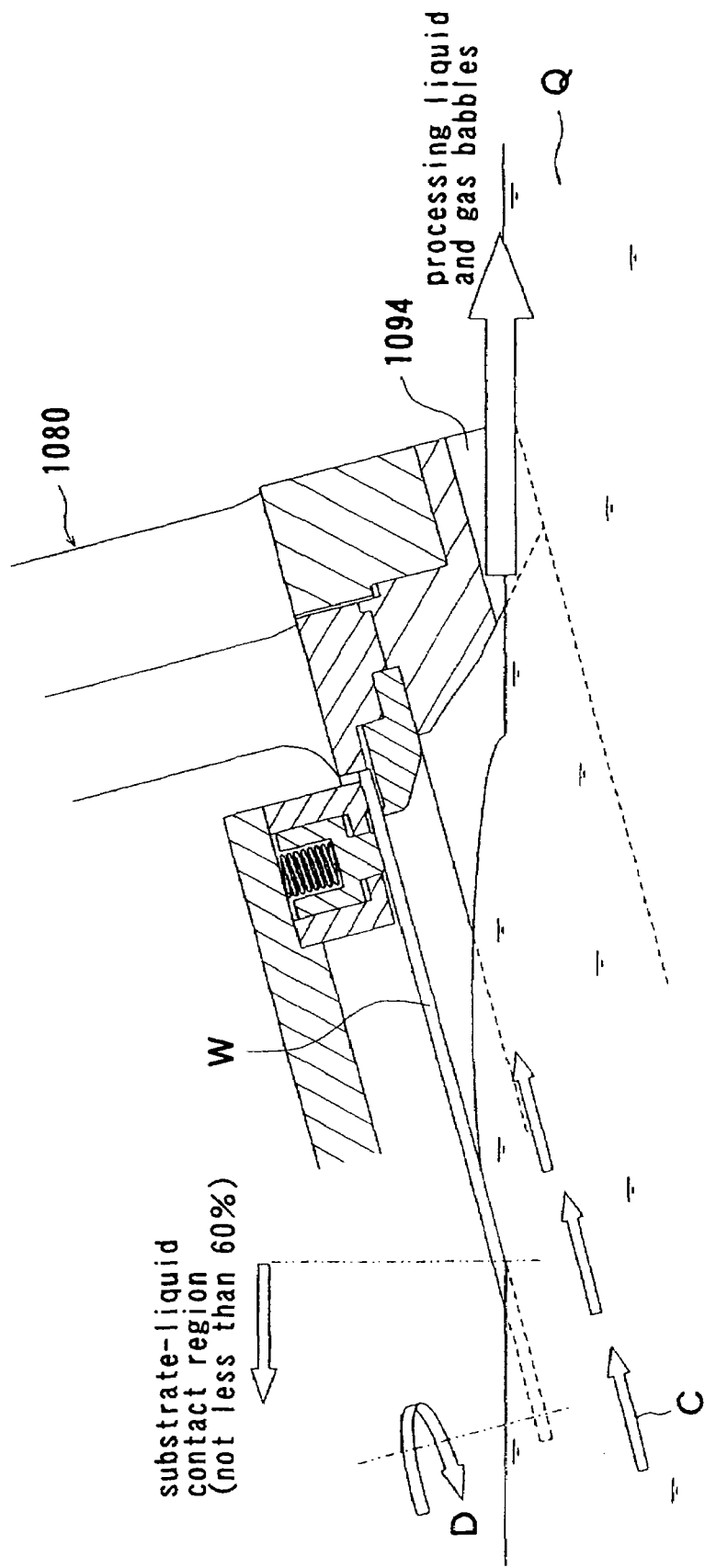

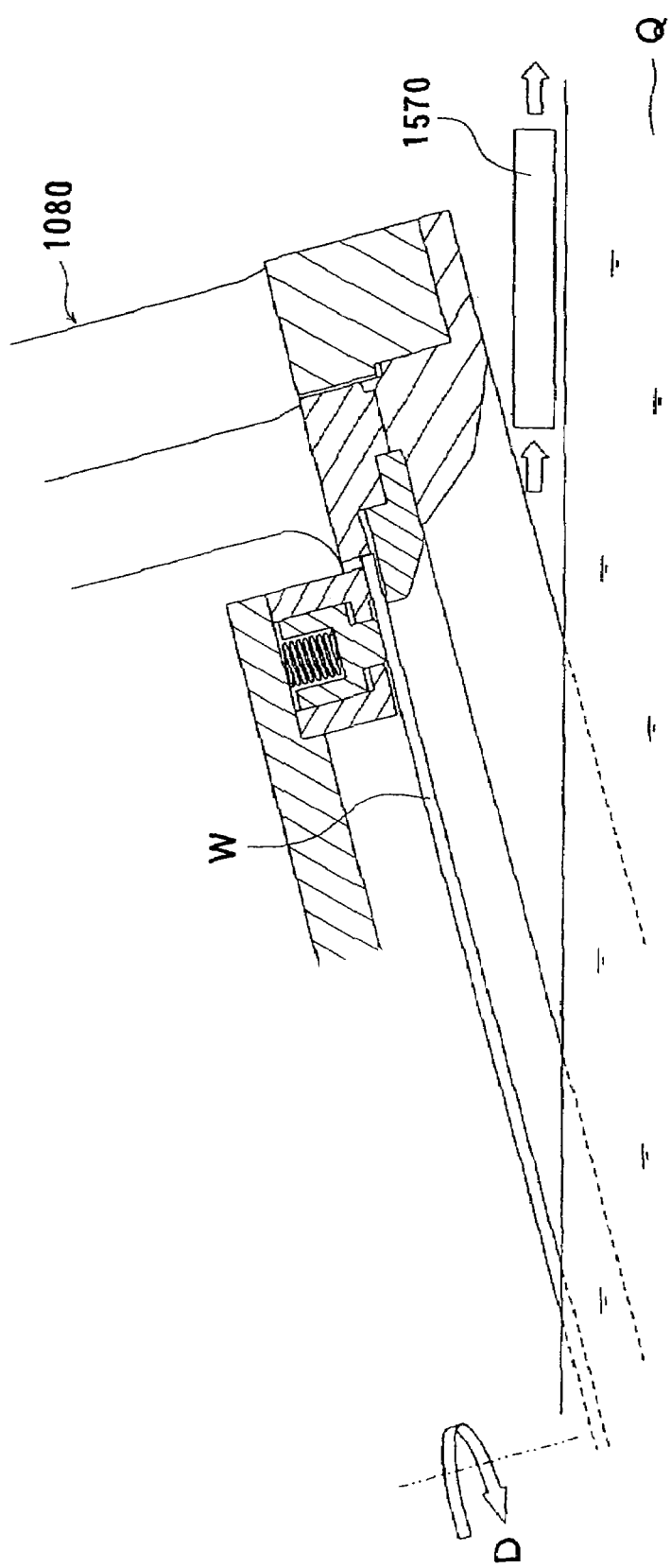

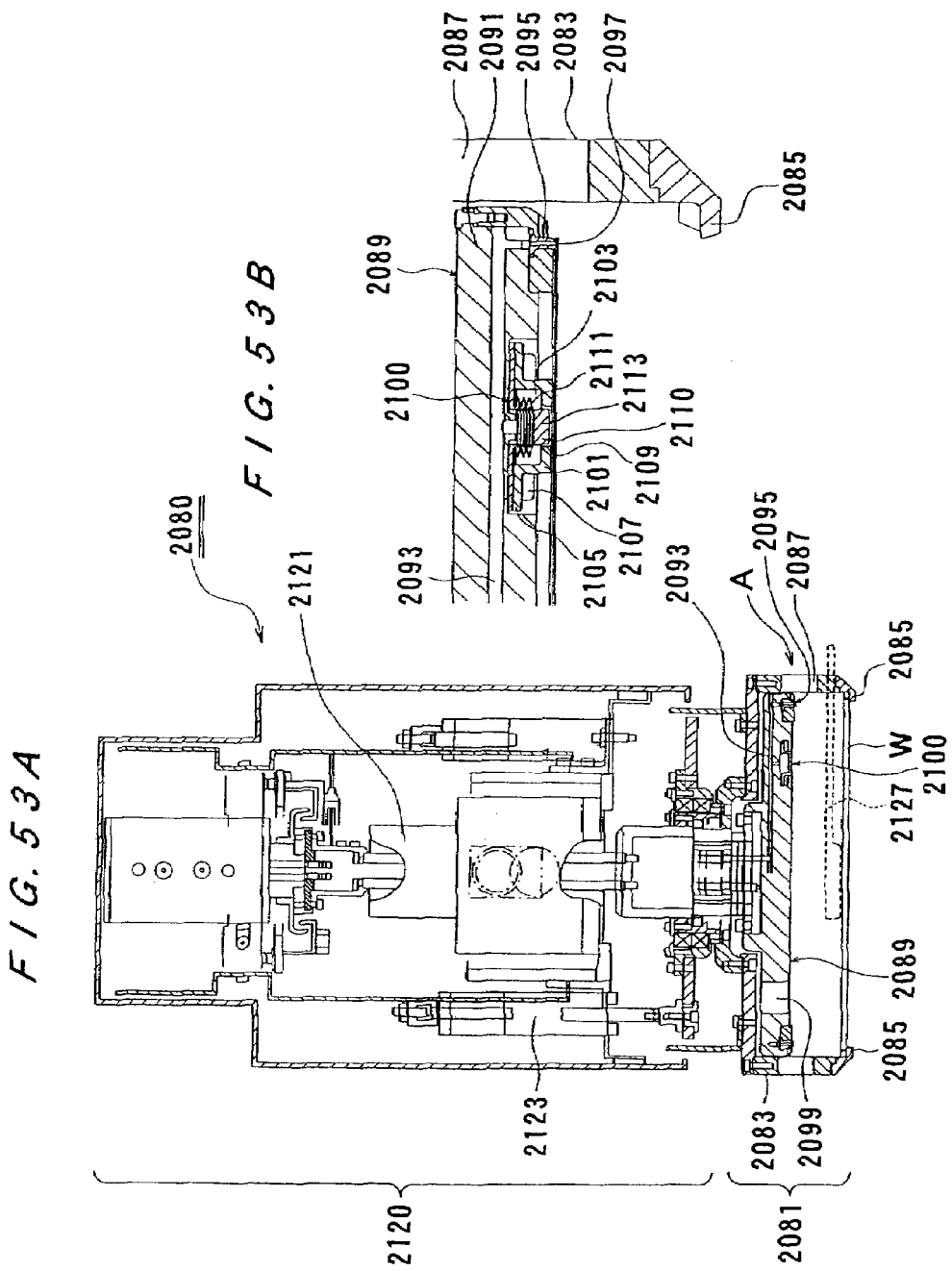

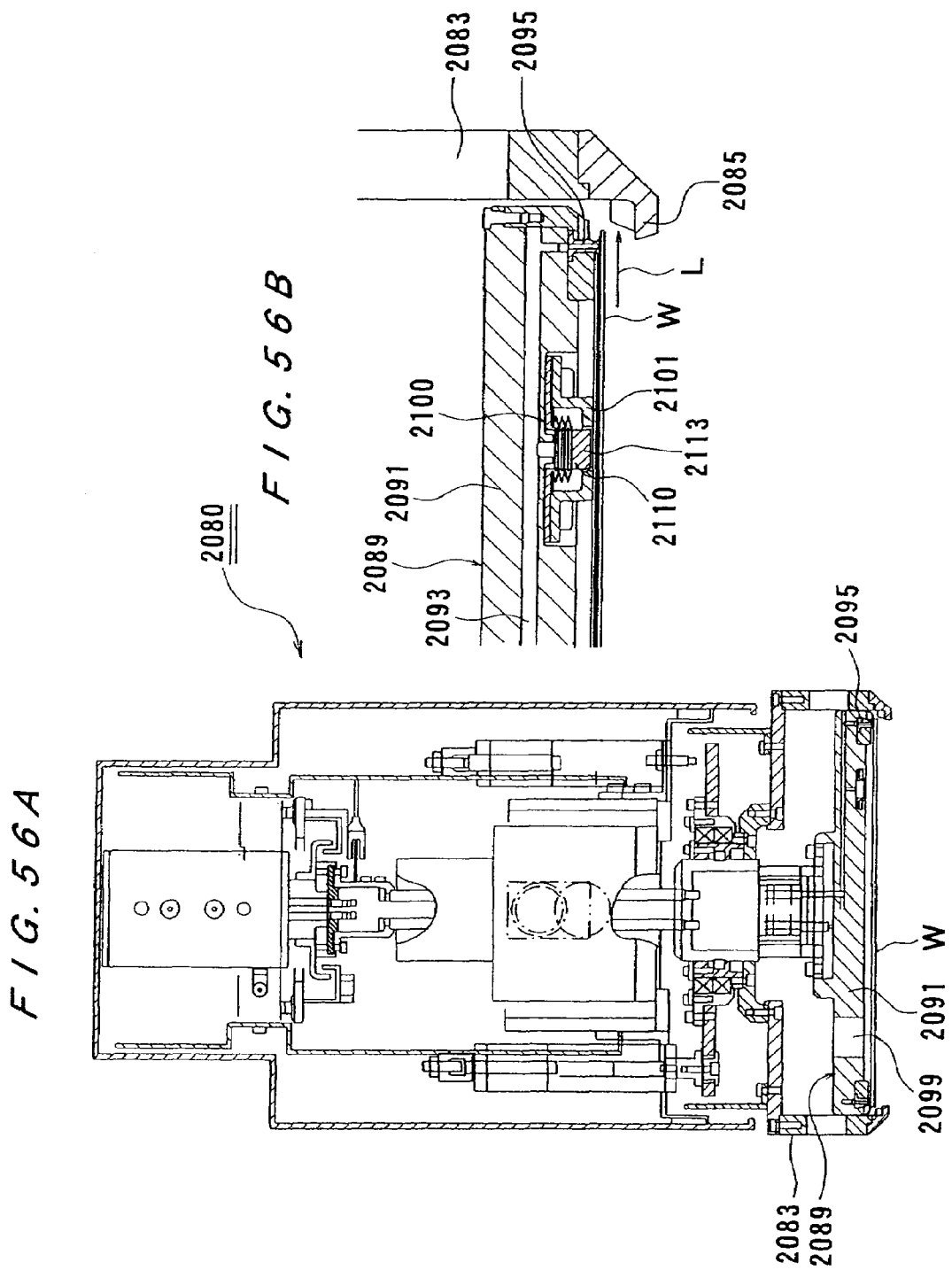

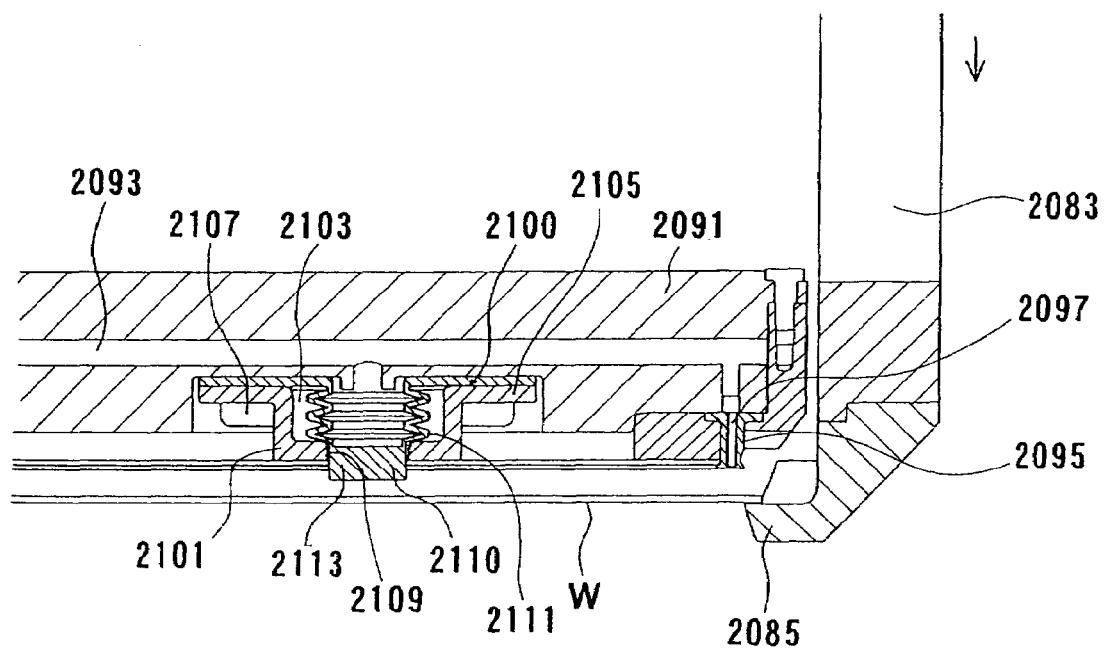
F I G. 57 ered U.S. Pat. No. 7,087,
117.

SUBSTRATE PROCESSING APPARATUS AND SUBSTRATE PROCESSING METHOD

This application is a divisional of U.S. application Ser. No. 10/712,348, filed Nov. 14, 2003, now U.S. Pat. No. 7,087, 117.

BACKGROUND OF THE INVENTION

1. Field of the Invention

The present invention relates to a substrate processing apparatus useful for plating a substrate or processing a substrate by dipping a substrate in a processing liquid.

The present invention also relates to a substrate processing method and apparatus useful for a pre-plating treatment which may be carried out before electroless plating for the formation of an interconnects-protective layer on the exposed surfaces of embedded interconnects of a conductive material, such as copper, silver or gold, embedded in fine interconnect grooves formed in the surface of a substrate, such as a semiconductor wafer.

Further, the present invention relates to a substrate holding device suitable for use in processing the processing surface of a substrate with a plating solution or other processing liquid, a substrate processing apparatus incorporating the substrate holding device, and a method for attaching/detaching a substrate to and from a substrate holding device.

2. Description of the Related Art

As a process for forming interconnects in a semiconductor substrate, a so-called "damascene process", which comprises embedding a metal (electric conductor) into trenches for interconnects and contact holes, is coming into practical use. According to this process, aluminum, or more recently a metal such as silver or copper, is embedded into trenches for interconnects and contact holes previously formed in an inter-level dielectric. Thereafter, an extra metal is removed by performing chemical mechanical polishing (CMP) so as to flatten a surface of the substrate.

In a case of interconnects formed by such a process, for example copper interconnects formed by using copper as an interconnect material, embedded interconnects of copper have exposed surfaces after the flattening processing. In order to prevent thermal diffusion of such interconnects (copper), or to prevent oxidation of such interconnects (copper) e.g. during forming thereon an insulating film (oxide film) under an oxidizing atmosphere to produce a semiconductor substrate having a multi-layer interconnect structure, it is now under study to selectively cover the exposed surfaces of interconnects with an interconnects-protective layer (cap material) composed of a Co alloy, a Ni alloy or the like so as to prevent thermal diffusion and oxidation of the interconnects. Such an interconnects-protective layer of a Co alloy, a Ni alloy or the like can be produced e.g. by performing electroless plating.

As shown in FIG. 1, for example, fine grooves 4 for interconnects are formed in an insulating film 2 of $SiO_2$ or the like which has been deposited on a surface of a substrate W such as a semiconductor wafer. A barrier layer 6 of TaN or the like is formed on the entire surface, and then copper plating, for example, is carried out onto the surface of the substrate W to fill the grooves 4 with copper and deposit copper film on the surface of the substrate W (damascene process). Thereafter, CMP (chemical mechanical polishing) is carried out onto the surface of the substrate W so as to flatten the surface of the substrate, thereby forming interconnects 8 composed of a copper film in the insulating film 2. Thereafter, an interconnects-protective layer (cap material) 9 composed of a Co—W—P alloy film is formed e.g. by electroless plating selectively on the surfaces of interconnects (copper film) 8 to protect interconnects 8 (cap plating process).

A common electroless plating method for the selective formation of the interconnects-protective layer (cap material) 9 of the Co—W—P alloy film on the surfaces of interconnects 8 generally involves the following process steps: First, the substrate W such as a semiconductor wafer, which has undergone the CMP treatment, is immersed in an acid solution (first treatment liquid) e.g. of 0.5M $H_2SO_4$ at the solution temperature of e.g. 25° C. for e.g. one minute to remove CMP residues, such as copper, remaining on a surface of an insulating film 2. After cleaning the surface of the substrate W (pre-cleaning process) with a cleaning liquid (second treatment liquid) such as ultrapure water, the substrate W is immersed in a mixed solution (first treatment liquid), e.g. of 0.005 g/L $PdCl_2$ and 0.2 ml/L HCl, at the solution temperature of e.g. 25° C. for e.g. one minute to adhere Pd as a catalyst to the surfaces of interconnects 8, thereby activating the exposed surfaces of interconnects 8. Next, after cleaning the surface of the substrate W with a cleaning liquid (second treatment liquid) such as ultrapure water (first pretreatment process), the substrate W is immersed in a solution (first treatment liquid) containing e.g. 20 g/L of $Na_3C_6H_5O_7 \cdot 2H_2O$ (sodium citrate) at the solution temperature of e.g. 25° C., thereby carrying out neutralization treatment of the surfaces of interconnects 8. Thereafter, after washing the surface of the substrate W (second pretreatment process) with ultrapure water (second treatment liquid), the substrate W is immersed in a Co—W—P plating solution at the solution temperature of e.g. 80° C. for e.g. 120 seconds, thereby carrying out selective electroless plating (electroless Co—W—P cap plating) onto the activated surfaces of interconnects 8. Thereafter, the surface of the substrate W is cleaned with a cleaning liquid such as ultrapure water (plating process). The interconnects-protective layer 9 composed of a Co—W—P alloy film is thus formed selectively on the surfaces of interconnects 8 to protect interconnects 8.

A substrate processing apparatus (plating apparatus), which includes a number of devices for carrying out the above-described plating step and various incidental pretreatments to the plating step and cleaning steps, is required to carry out the various processing steps securely with a good product quality. In addition, there is a demand for making the whole apparatus compact and reducing the apparatus cost.

As described above, when forming an interconnects-protective layer (cap material) composed of a Co—W—P alloy film by electroless plating, a catalyst-imparting treatment for imparting a catalyst, for example Pd, to the surfaces of interconnects is carried out in advance. Further, removal of CMP residues, e.g. copper, remaining on an insulating film, which treatment is necessary for preventing an interconnects-protective layer from being formed on the insulating film, is carried out usually by using an inorganic acid, such as $H_2SO_4$ or HCl. On the other hand, an electroless plating solution is generally an alkaline solution. Accordingly, it is necessary to carry out a neutralization step immediately before plating to stabilize the plating process.

In order to securely carry out uniform plating in the necessary area of the surface of a substrate after performing the pre-plating process, it is necessary to securely impart a catalyst only to that area (plating area) in the catalyst-imparting treatment, and effect a neutralization treatment, etc. over the whole area to which a catalyst has been imparted.

In conventional plating apparatuses, however, a pre-cleaning treatment (chemical cleaning), which is carried out prior to a catalyst-imparting treatment, a catalyst-imparting treatment and a cleaning treatment (neutralization treatment) after the catalyst-imparting treatment, are generally carried out by using devices having the same construction. Accordingly, the respective areas of a substrate to be subjected to the pre-cleaning (chemical cleaning), to the catalyst-imparting treatment and to the cleaning (neutralization) after the catalyst-imparting treatment are basically the same. With such a conventional apparatus, due to a device error, a variation in positioning of a substrate when it is held, etc., there is a case where that area of the substrate to which a catalyst will be imparted is not entirely pre-cleaned (with a chemical) or a case where the area of the substrate to which the catalyst has been imparted is not entirely cleaned (neutralized) after the catalyst-imparting treatment, whereby plating cannot be effected securely in the necessary area of the substrate surface.

As a method for carrying out a stable and uniform plating (e.g. electroless plating) of a substrate or carrying out a stable and uniform pretreatment of a substrate, a dip processing method in which a substrate is dipped in a processing liquid so as to bring the processing liquid into contact with the processing surface of the substrate, has conventionally been employed. With respect to such dip processing method, removal of gas bubbles remaining on the processing surface of a substrate is the most important technical problem to be solved for carrying out stable and uniform various processings. In this regard, when dipping a substrate in a processing liquid in parallel (horizontal) to the liquid surface, gas bubbles adhere to the processing surface of the substrate, which adversely affect the processing. As a method for removing gas bubbles, a method has been proposed in which a substrate in a tilted position is immersed in a processing liquid and the substrate is then returned to the horizontal position to carry out processing.

In the case of the method of tilting a substrate, however, a tilting mechanism must be provided in a substrate holding apparatus. This makes the apparatus complicated and increases the weight of the apparatus and, in addition, impedes reduction of the apparatus cost.

The state of a substrate after the catalyst-imparting treatment in the above-described first pretreatment step has a great influence on the plating on the later processing step. Accordingly it is necessary to carry out a stable and secure catalyst-imparting treatment. As a method for carrying out stable and secure pretreatments of a substrate, such as a catalyst-imparting treatment, a dip processing method in which the substrate is dipped in a processing liquid so as to bring the processing liquid into contact with the processing surface, has conventionally been employed. In carrying out the processing of a substrate by dipping the substrate in a processing liquid, removal of gas bubbles adhering on the processing surface of the substrate is essential for the stable and uniform processing of the substrate. However, adequate measures for removal of gas bubbles have not been taken.

In a substrate processing apparatus for carrying out the above-described plating and the like, a substrate holding device, which holds a substrate by attracting the back surface of the substrate, is generally employed. Such a substrate holding device includes a plate-like attracting head and holds a substrate by attracting by vacuum the back surface of the substrate to a suction pad mounted to the lower surface of the attracting head. Various processings, such as plating, are carried out by bringing various processing liquids, such as a plating solution, into contact with the processing surface of the substrate thus held in the substrate holding device.

A suction pad is generally designed to attract by suction substantially the entire back surface of a substrate. The vacuum attraction of substantially the entire back surface of the substrate (nearest possible to the edge) is to best prevent adhesion of a processing liquid to the back surface of the substrate.

With such attracting means as a suction pad in which the entire inside space becomes vacuum, however, when holding a substrate by vacuum attraction, the substrate can deform largely from the center to the peripheral region due to the vacuum attraction force, whereby uniform plating cannot be effected and, in the worst case, the substrate can be broken. Further, the pad of a suction pad usually also functions as a sealing member, and therefore a rubber material is commonly employed. A rubber material, due to a change in the quality with time, etc., becomes sticky to a substrate. Accordingly, a substrate attracted to a suction pad is hard to detach from it, obstructing attachment/detachment of the substrate.

SUMMARY OF THE INVENTION

The present invention has been made in view of the above situation in the background art. It is therefore a first object of the present invention to provide a substrate processing apparatus which can carry out various processings of a substrate securely with a good product quality, can make the whole apparatus compact and can reduce the apparatus cost.

It is a second object of the present invention to provide a substrate processing apparatus and a substrate processing method that can securely carry out a pre-plating treatment of a substrate to carry out uniform plating in the necessary area of the surface of the substrate.

It is a third object of the present invention to provide a substrate processing apparatus and a substrate processing method which can easily remove gas bubbles remaining on the processing surface of a substrate even when dipping the substrate in a horizontal position in a processing liquid.

It is a fourth object of the present invention to provide a substrate processing apparatus and a substrate processing method which, in a dipping processing of a substrate in a processing liquid, can easily and securely remove gas bubbles in the processing liquid adhering to the processing surface of the substrate, enabling stable and secure processing of the processing surface.

It is a fifth object of the present invention to provide a substrate holding device which can hold a substrate by vacuum attraction without deformation of the substrate due to the vacuum attraction force and securely detach the substrate from a sealing member regardless of the material of the sealing member, a substrate processing apparatus employing the substrate holding device, and a substrate method for attaching/detaching a substrate to and from a substrate holding device.

In order to achieve the above objects, the present invention provides a substrate processing apparatus comprising: a loading/unloading area for carrying in and out a substrate; a cleaning area for cleaning the substrate; and a plating area for plating the substrate, wherein the loading/unloading area is provided with a substrate transfer robot having a plurality of hands of dry-use design, a loading port for loading a cassette for housing substrates, and a reversing machine of dry-use design for reversing the substrate from face up to face down.

The provision of the reversing machine in the loading/unloading area can avoid the need to reverse a substrate by rotation of the arm of the substrate transfer robot, thereby avoiding the risk of fall of the substrate during transfer of the substrate by the substrate transfer robot.

The present invention also provides another substrate processing apparatus, comprising: a loading/unloading area for carrying in and out a substrate; a cleaning area for cleaning the substrate; and a plating area for plating the substrate, wherein the cleaning area is provided with a substrate transfer robot having a hand of dry-use design, a hand of wet-use design and a hand of back surface attraction design, a pre-cleaning unit for cleaning the substrate before plating in the plating area, and a post-cleaning unit for cleaning the substrate after plating in the plating area.

The provision of an apparatus for the pre-cleaning and an apparatus for the post-cleaning as the units in the cleaning area can make the whole substrate processing apparatus compact.

The post-cleaning unit preferably includes a roll brushing unit and a spin-drying unit. The use of the cleaning units having different constructions in combination in carrying out cleaning of a substrate enhances the cleaning effect.

In a preferred embodiment of the present invention, the cleaning area is provided with a temporary substrate storage stage of dry-use design, having a lifting function, for temporarily storing the substrate during transfer of the substrate between the loading/unloading area and the cleaning area, and a reversing machine of wet-use design for reversing the substrate, which has been transferred to the cleaning area after plating in the plating area, from face down to face up.

With the provision of the temporary substrate storage stage in the cleaning area, transfer of the substrate between the loading/unloading area and the cleaning area can be carried out smoothly. Further, the provision of the reversing machine in the cleaning area can avoid the need to reverse the substrate by rotation of the arm of the substrate transfer robot, thereby avoiding a risk of fall of the substrate during transfer of the substrate.

The present invention provides yet another substrate processing apparatus, comprising: a loading/unloading area for carrying in and out a substrate; a cleaning area for cleaning the substrate; and a plating area for plating the substrate, wherein the plating area is provided with a substrate transfer robot having a plurality of attracting hands for holding the substrate by attracting the back surface of the substrate, a first pretreatment unit for carrying out a catalyst-imparting treatment of the front surface of the substrate, a second pretreatment unit for carrying out a chemical liquid treatment of the front surface of the substrate after the catalyst-imparting treatment, and a plating unit for plating the substrate.

The provision of an apparatus for the catalyst-imparting treatment, an apparatus for the chemical liquid treatment of the substrate surface after the catalyst-imparting treatment and an apparatus for the plating as the respective units in the plating area can make the whole substrate processing apparatus compact.

In a preferred embodiment of the present invention, the plating unit is comprised of a plurality of units, and the plating area is further provided with a plating solution supply unit for supplying a plating solution to the plurality of plating units. This avoids the need to separately provide a plating solution supply device, whereby the whole substrate processing apparatus can be made compact.

The present invention provides yet another substrate processing apparatus, comprising: a loading/unloading area for carrying in and out a substrate; a cleaning area for cleaning the substrate; and a plating area for plating the substrate, wherein the cleaning area is provided with a pre-cleaning unit including a vessel housing a first treatment liquid spraying section for cleaning the substrate before plating in the plating area by bringing a first treatment liquid into contact with the substrate, a lid member for closing the opening of the vessel after the substrate held in a substrate holding device is moved to above the opening, and a second treatment liquid spraying section mounted on the lid member for cleaning the substrate by bringing a second treatment liquid into contact with the substrate while the opening of the vessel is closed with the lid member.

With the cleaning unit thus constructed, treatment of a substrate with a plurality of treatment liquids (processing liquids) can be carried out in one apparatus, while securely avoiding mixing of the treatment liquids. Further, the installation space for the apparatus can be made smaller and the apparatus cost can be reduced, whereby the whole substrate processing apparatus can be made compact and the total apparatus cost can be reduced.

The present invention provides yet another substrate processing apparatus, comprising: a loading/unloading area for carrying in and out a substrate; a cleaning area for cleaning the substrate; and a plating area for plating the substrate, wherein the cleaning area is provided with a pre-cleaning unit for cleaning the substrate before plating, and a hand of a substrate transfer robot disposed in the cleaning area and a hand of a substrate transfer robot disposed in the plating area are accessible to the pre-cleaning unit from the opposite sides for transfer of the substrate.

According to the substrate processing apparatus, take-in and take-out of the substrate into and from the pre-cleaning unit can be carried out smoothly by the substrate transfer robot of the cleaning area and the substrate transfer robot of the plating area.

The present invention provides yet another substrate processing apparatus, comprising: a loading/unloading area for carrying in and out a substrate; a cleaning area for cleaning the substrate; and a plating area for plating the substrate, wherein the plating area is provided with a first pretreatment unit and a second pretreatment unit, each unit including a vessel housing a first treatment liquid spraying section for pretreating the substrate before plating by bringing a first treatment liquid into contact with the substrate, a lid member for closing the opening of the vessel after the substrate held in a substrate holding device is moved to above the opening, and a second treatment liquid spraying section mounted on the lid member for cleaning the substrate by bringing a second treatment liquid into contact with the substrate while the opening of the vessel is closed with the lid member.

With the first pretreatment unit and the second pretreatment unit thus constructed, treatment of a substrate with a plurality of treatment liquids can be carried out in one apparatus, while securely avoiding mixing of the treatment liquid. Further, the installation space for the apparatus can be made smaller and the apparatus cost can be reduced, whereby the whole substrate processing apparatus can be made compact and the total apparatus cost can be reduced.

The present invention provides yet another substrate processing apparatus, comprising: a loading/unloading area for carrying in and out a substrate; a cleaning area for cleaning the substrate; and a plating area for plating the substrate, wherein the plating area is provided with a plating unit including a processing tank for holding a plating solution, a lid member for closing the opening of the processing tank after the substrate held in a substrate holding device is moved to above the opening, and a treatment liquid spraying section mounted on the lid member for cleaning the substrate by bringing a cleaning liquid into contact with the substrate while the opening of the processing tank is closed with the lid member.

With the plating unit thus constructed, plating of a substrate with a plating solution and cleaning of the substrate with a cleaning liquid can be carried out in one apparatus, while securely avoiding mixing of the plating solution and the cleaning liquid. Further, the installation space for the apparatus can be made smaller and the apparatus cost can be reduced, whereby the whole substrate processing apparatus can be made compact and the total apparatus cost can be reduced.

The present invention provides yet another substrate processing apparatus, comprising: a loading/unloading area for carrying in and out a substrate; a cleaning area for cleaning the substrate; and a plating area for plating the substrate, wherein the cleaning area is provided with a post-cleaning unit for cleaning the substrate after plating in the plating area, a pre-cleaning unit for cleaning the substrate before plating in the plating area, and a chemical liquid supply unit for supplying respective chemical liquids for cleaning to the pre-cleaning unit and to the post-cleaning unit.

The provision of an apparatus for the pre-cleaning, an apparatus for the post-cleaning and an apparatus for supplying the chemical liquids as the respective units in the cleaning area can make the whole substrate processing apparatus compact. Further, this avoids the need to separately provide a chemical liquid supply apparatus, also leading to a compact substrate processing apparatus.

The present invention provides yet another substrate processing apparatus, comprising: a loading/unloading area for carrying in and out a substrate; a cleaning area for cleaning the substrate; and a plating area for plating the substrate, wherein the plating area is provided with a first pretreatment unit for pretreating the substrate before plating by bringing a treatment liquid into contact with the substrate, a second pretreatment unit for pretreating the substrate after the pretreatment in the first treatment unit by bringing another treatment liquid into contact with the substrate, and a chemical liquid supply unit for supplying the respective chemical liquids for treatment to the first pretreatment unit and to the second pretreatment unit.

The provision of an apparatus for the first pretreatment, an apparatus for the second pretreatment and an apparatus for supplying the chemical liquid as the respective units in the plating area can make the whole substrate processing apparatus compact. Further, this avoids the need to separately provide a chemical liquid supply apparatus, also leading to a compact substrate processing apparatus.

The present invention provides yet another substrate processing apparatus, comprising: a loading/unloading area for carrying in and out a substrate; a cleaning area for cleaning the substrate; and a plating area for plating the substrate, wherein the loading/unloading area is provided with a fixed-type substrate transfer robot not having a traveling shaft.

The use of the fixed-type substrate transfer robot can avoid the generation of particles at the sliding portion of a traveling shaft and makes it possible to always obtain a clean atmosphere for a substrate to be processed.

The present invention provides yet another substrate processing apparatus, comprising: a loading/unloading area for carrying in and out a substrate; a cleaning area for cleaning the substrate; and a plating area for plating the substrate, wherein the cleaning area is provided with a substrate transfer robot having an arm mounted with a plurality of hands.

The provision of one arm with a plurality of hands enables one substrate transfer robot to have a large number of hands respectively for the intended use.

The present invention provides yet another substrate processing apparatus, comprising: a loading/unloading area for carrying in and out a substrate; a cleaning area for cleaning the substrate; and a plating area for plating the substrate, wherein the cleaning area and/or the plating area is provided with a substrate transfer robot having a back surface attraction-type vacuum hand for holding and transferring the substrate with its front surface downward.

In order to avoid the adverse effects of particles on a substrate, there is always a down flow of air in the substrate processing apparatus. Accordingly, if a substrate with its front surface facing upward (face up) is held and transferred, the processing surface of the substrate can be dried during transfer of the substrate between processing units. By holding and transferring a substrate with its front surface facing downward (face down) by the hand of the substrate transfer robot, the influence of the down flow of air can be reduced and the substrate can be transferred in a wet but best dried state, leading to a good atmosphere in the apparatus.

The present invention provides yet another substrate processing apparatus, comprising: a loading/unloading area for carrying in and out a substrate; a cleaning area for cleaning the substrate; and a plating area for plating the substrate, wherein the plating area is provided with a substrate transfer robot having a vacuum hand, the vacuum hand including a suction pad having a substrate attracting surface which is retractable in the substrate attracting direction, and a fixed member, disposed around the suction pad and having a flat reference surface, for effecting positioning of the substrate by retracting the suction pad to which the substrate is attracted and thereby bringing the substrate into contact with the reference surface.

Thus, when holding a substrate by attracting the back surface of the substrate, the back surface of the substrate is first attracted onto the substrate attracting surface, and then the substrate suction pad is retracted so as to bring the substrate into contact with the reference surface of the fixed member to effect positioning of the substrate.

The present invention provides yet another substrate processing apparatus, comprising: a loading/unloading area for carrying in and out a substrate; a cleaning area for cleaning the substrate; and a plating area for plating the substrate, wherein the plating area is provided with a plurality of plating units each including a processing tank for holding a plating solution, a lid member for closing the opening of the processing tank after the substrate held in a substrate holding device is moved to above the opening, and a treatment liquid spraying section mounted on the lid member for cleaning the substrate by bringing a cleaning liquid into contact with the substrate while the opening of the processing tank is closed with the lid member.

By carrying out a plurality of substrate processing steps in and above the processing tank, the apparatus can be made compact. Further, the provision of a plurality of plating units can enhance the substrate processing efficiency.

The present invention provides yet another substrate processing apparatus, comprising: a loading/unloading area for carrying in and out a substrate; a cleaning area for cleaning the substrate; and a plating area for plating the substrate, wherein the cleaning area is provided with a pre-cleaning unit for cleaning the substrate before plating in the plating area, the plating area is provided with a pretreatment unit for pretreating the substrate before plating by bringing a treatment liquid into contact with the substrate, and the plating area is provided with a plating unit for plating the pretreated substrate, and a plurality of spray nozzles for spraying a liquid for treatment or cleaning of a processing surface of the substrate are mounted in at least one of said units, said spray nozzles being disposed such that the liquid for treatment or cleaning can be sprayed uniformly onto the entire processing surface of the substrate.

According to the substrate processing apparatus, uniform processing or cleaning of the processing surface of a substrate can be effected.

The present invention provides yet another substrate processing apparatus, comprising: a loading/unloading area for carrying in and out a substrate; a cleaning area for cleaning the substrate; and a plating area provided with a processing tank for plating the substrate, wherein the plating area is provided with a plating solution supply device including a plating solution circulation tank for storing a plating solution and circulating the plating solution between it and the processing tank, a heating section for heating the plating solution in the plating solution circulation tank, a thermometer for measuring the temperature of the plating solution stored in the plating solution circulation tank, a thermometer for measuring the temperature of the plating solution in the processing tank, and a plating solution supply pump for controlling the circulation amount of the plating solution circulating between the plating solution circulation tank and the processing tank so that the temperature of the plating solution in the processing tank becomes a suitable temperature for plating.

By properly controlling the circulation amount of the plating solution according to the situation, a change in temperature of the plating solution can be made small and the temperature control response of the plating solution to the heating section can be increased, leading to improved evenness of the temperature of the plating solution over the entire circulation circuit.

The present invention provides yet another substrate processing apparatus, comprising: a loading/unloading area for carrying in and out a substrate; a cleaning area for cleaning the substrate; and a plating area provided with a processing tank for plating the substrate and a plating solution circulation tank for storing a plating solution and circulating the plating solution between it and the processing tank, wherein the plating solution circulation tank is provided with a plating solution concentration diluting device for adjusting the concentration of the plating solution to a proper concentration.

The temperature of a plating solution during plating (e.g. electroless plating) is generally as high as 70° C.-80° C. Because of constant evaporation of the moisture of the plating solution due to high temperature, the concentration can vary during processing of a substrate, resulting in processing variation for every substrate. By replenishing the plating solution with a necessary amount of liquid (such as pure water) by the plating solution concentration diluting device, the plating solution can be kept at the optimum concentration at all times.

The present invention provides yet another substrate processing apparatus, comprising: a loading/unloading area for carrying in and out a substrate; a cleaning area for cleaning the substrate; and a plating area provided with a plurality of plating units for plating the substrate, wherein the plating area is provided with a plating solution supply device including a plurality of plating solution supply pumps each for supplying a plating solution to each of the plurality of plating units.

According to the substrate processing apparatus, should one of the plating solution supply pumps be stopped due to failure, plating can be carried out with a plating unit connected to another operable plating solution supply pump. Alternatively, should one of the plating units be stopped due to failure, a plating solution can be supplied to another operable plating unit, whereby the stop of plating processing itself can be avoided.

The present invention provides yet another substrate processing apparatus, comprising: a loading/unloading area for carrying in and out a substrate; a cleaning area for cleaning the substrate; and a plating area provided with a plating unit for plating the substrate, wherein the plating area is provided with a plating solution supply device for supplying a plating solution to the plating unit by a plating solution supply pump which is a vertical centrifugal pump.

The use of a vertical centrifugal pump, as compared to the use of a magnet pump or a bellows pump, can minimize cavitation. In addition, because of less action of stirring air and liquid, an excessive dissolution of air into the plating solution can be prevented, whereby the amount of dissolved oxygen can be controlled within an appropriate range.

The present invention provides yet another substrate processing apparatus, comprising: a loading/unloading area for carrying in and out a substrate; a cleaning area for cleaning the substrate; and a plating area for plating the substrate, wherein the plating area is provided with a plating unit for plating a processing surface of a substrate by bringing a plating solution into contact with the processing surface while the substrate is held in an attracting head and inserted in a processing tank, the attracting head is comprised of a base and a ring-shaped substrate attracting portion, mounted to the peripheral lower surface of the base, for attracting by vacuum the back surface of the substrate and functioning as a seal for preventing intrusion of the plating solution into the inside of the ring-shaped vacuum-attracted portion of the back surface of the substrate, and the base has openings for opening the space between the substrate attracted to the substrate attracting portion and the base.

With the provision of the openings in the base of the attracting head, the space defined by the base, the substrate attracting portion and the substrate is not hermetically closed, and therefore the expansion of air by heat in the space is prevented, whereby the adverse effects of the air expansion on the substrate (such as deformation) can be avoided and uniform plating can be effected. Further, because of the openings, the attracting head can be lightened.

In a preferred embodiment of the present invention, the plating unit is provided with a drive section for rotating the attracting head with the substrate vacuum-attracted at a high speed.

Rotating the substrate at a high speed can effectively scatter the processing liquid and cleaning liquid remaining on the surface of the substrate after plating, thereby eliminating wasteful discharge of the processing liquid, cleaning liquid, etc. used.

The present invention provides yet another substrate processing apparatus, comprising: a loading/unloading area for carrying in and out a substrate; a cleaning area for cleaning the substrate; and a plating area for plating the substrate, wherein the plating area is provided with a plating unit for plating a processing surface of a substrate by bringing a plating solution into contact with the processing surface while the substrate is held in an attracting head and inserted in a processing tank, the attracting head includes a ring-shaped substrate attracting portion for attracting by vacuum the back surface of the substrate and functioning as a seal for preventing intrusion of the plating solution into the inside of the ring-shaped vacuum-attracted portion of the back surface of the substrate, and the substrate attracting portion attracts a peripheral portion of the back surface of the substrate corresponding to a peripheral portion of the front surface in which no device is formed.

According to the substrate processing apparatus, during plating, the substrate attracting portion is in contact with the portion of the back surface of the substrate corresponding to a non-device portion of the front surface. This makes it possible to minimize the influence of the attraction of the substrate by the substrate attracting portion on a device during plating which is carried out with heating.

The present invention provides yet another substrate processing apparatus, comprising: a loading/unloading area for carrying in and out a substrate; a cleaning area for cleaning the substrate; and a plating area for plating the substrate, wherein the plating area is provided with a plating unit for plating a processing surface of a substrate by bringing a plating solution into contact with the processing surface while the substrate is held in an attracting head and inserted in a processing tank, the attracting head is provided with a substrate attracting portion having a substrate attracting groove connected to a vacuum supply line for attracting by vacuum the back surface of the substrate. The vacuum supply line, besides vacuuming, is capable of supplying an inert gas and/or a cleaning liquid, and a cleaning spray nozzle is disposed in the vicinity of the substrate attracting portion so that the outside of the substrate attracting portion is cleaned by the cleaning spray nozzle while the interior of the vacuum supply line and the substrate attracting groove is cleaned by supplying the inert gas or the cleaning liquid from the vacuum supply line to the substrate attracting groove.

In general, at such portions that are in contact with a plating solution, the plating component crystallizes and precipitates after an elapse of time, adversely affecting processing of a substrate. According to the present invention, the outer circumferential surface of the substrate attracting portion can be cleaned by the cleaning spray nozzle and, in addition, the whole interior of the vacuum supply line and the substrate attracting groove can be cleaned.

The present invention provides yet another substrate processing apparatus, comprising: a loading/unloading area for carrying in and out a substrate; a cleaning area for cleaning the substrate; and a plating area for plating the substrate, wherein the plating area is provided with a plating unit for plating a processing surface of a substrate by bringing a plating solution into contact with the processing surface while the substrate is inserted in a processing tank, and a spray nozzle for spraying a cleaning liquid onto the surface of the substrate after plating is provided in the processing tank of the plating unit.

Even when the substrate is separated from the plating solution after plating, a small amount of the plating solution remains on the processing surface of the substrate. With the plating solution remaining on the surface, plating of the surface of the substrate will still proceed, resulting in a failure of obtaining a uniform plated film. According to the present invention, the spray nozzle is provided in the processing tank, and a cleaning liquid is sprayed onto the surface of the substrate immediately after plating, thereby removing the plating solution remaining on the substrate surface. Further, the spraying of cleaning liquid rapidly cools the substrate to stop the progress of plating, whereby a uniform plated film can be obtained.

The present invention provides yet another substrate processing apparatus, comprising: a loading/unloading area for carrying in and out a substrate; a cleaning area for cleaning the substrate; and a plating area for plating the substrate, wherein the cleaning area is provided with a pre-cleaning unit for housing in a vessel the substrate before plating in the plating area and cleaning the substrate, the plating area is provided with a pretreatment unit for housing in a vessel the substrate cleaned in the pre-cleaning unit and pretreating the substrate, and a spray nozzle for internal cleaning of vessel is provided within the vessel of the pre-cleaning unit and/or within the vessel of the pretreatment unit.

The provision of the spray nozzle can clean the inside of the vessel of the pre-cleaning unit and/or the vessel of the pretreatment unit. The cleaning can prevent drying of the inner wall of the vessel, thereby preventing generation of particles. Deterioration of members due to immersion in a treatment liquid can also be prevented.

The present invention provides yet another substrate processing apparatus, comprising: a loading/unloading area for carrying in and out a substrate; a cleaning area for cleaning the substrate; and a plating area provided with a processing tank for plating the substrate, wherein the plating area is provided with a plating solution circulation tank for supplying a plating solution to the processing tank and circulating the plating solution, and the plating solution circulation tank is provided with an indirect heating section for circulating a heated fluid as a heat medium within a tube to thereby heat the plating solution in an indirect manner.

In view of the very delicate nature of a plating solution, the plating solution is not heated directly by a heat source, but heated indirectly by circulation of a heat medium, thereby making the temperature difference between the plating solution and the heating means small and thus avoiding the adverse influence of the heating means on the life of the plating solution.

The present invention provides yet another substrate processing apparatus, comprising: a loading/unloading area for carrying in and out a substrate; a cleaning area for cleaning the substrate; and a plating area provided with a processing tank for plating the substrate, wherein the plating area is provided with a plating solution circulation tank for supplying a plating solution to the processing tank and circulating the plating solution, and the plating solution circulation tank has a double or multiple structure.

The use of such a plating solution circulation tank ensures separation from the air so as to keep the temperature of plating solution as constant as possible. Further, because of the double or multiple structure, the safety of the plating solution circulation tank against breakage, etc. is enhanced.

The present invention provides yet another substrate processing apparatus, comprising: a loading/unloading area for carrying in and out a substrate; a cleaning area for cleaning the substrate; and a plating area provided with a processing tank for plating the substrate, wherein the processing tank is equipped with a thermometer for measuring the temperature of a plating solution in the processing tank.

With the provision of the thermometer, the temperature of the plating solution in the processing tank can be controlled at a predetermined temperature. Thus, the temperature of the plating solution at the point of use can be maintained stably.

The present invention provides yet another substrate processing apparatus, comprising: a loading/unloading area for carrying in and out a substrate; a cleaning area for cleaning the substrate; and a plating area for plating the substrate, wherein the plating area is provided with a pretreatment unit for pretreating the substrate before plating by bringing a treatment liquid into contact with the substrate, said pretreatment unit including a processing tank for holding a plating solution, a lid member for closing the opening of the processing tank after the substrate held in a substrate holding head is moved to above the opening, and a treatment liquid spraying section mounted on the lid member for spraying a cleaning liquid onto the substrate to clean the substrate while the opening of the processing tank is closed with the lid member, said substrate fixing head being provided with a tilting mechanism.

With the provision of the tilting mechanism, a substrate in a tilted position can be dipped in a treatment liquid, whereby gas bubbles on the processing surface of the substrate can be removed with ease.

The present invention provides yet another substrate processing apparatus, comprising: a loading/unloading area for carrying in and out a substrate; a cleaning area for cleaning the substrate; and a plating area provided with a processing tank for plating the substrate, wherein the plating area is provided with a plating solution circulation tank for supplying a plating solution to the processing tank and circulating the plating solution, and a gas bubble dissolution preventing section which, when the plating solution flows into the plating solution circulation tank, prevents gas bubbles from dissolving into the plating solution is provided in a pipe for circulating the plating solution from the processing tank to the plating solution circulation tank.

The provision of the gas bubble dissolution preventing section enables control of the dissolved oxygen in the plating solution within a suitable range.

The present invention provides yet another substrate processing apparatus, comprising: a loading/unloading area for carrying in and out a substrate; a cleaning area for cleaning the substrate; and a plating area for plating the substrate, wherein a sample port for taking a predetermined amount of liquid sample is provided in at least one of a supply line for a cleaning liquid for use in a pre-cleaning unit, disposed in the cleaning area, for cleaning the substrate before plating in the plating area by bringing the cleaning liquid into contact with the substrate, a supply line for a treatment liquid for use in a pretreatment unit, disposed in the plating area, for pretreating the substrate before plating by bringing the treatment liquid into contact with the substrate and a supply line for a plating solution for use in a plating unit, disposed in the plating area, for plating the pretreated substrate by bringing the plating solution into contact with the substrate, and wherein a liquid replenishment section for supplying an amount of liquid corresponding to the amount taken as a sample to at least one of the pre-cleaning unit, the pretreatment unit and the plating unit is provided.

According to the substrate processing apparatus, a liquid flowing in a supply line can be taken as a sample to analyze the components of the liquid.

The present invention provides yet another substrate processing apparatus, comprising: a loading/unloading area for carrying in and out a substrate; a cleaning area for cleaning the substrate; and a plating area for plating the substrate, wherein a plurality of filters are provided in series in at least one of a supply line for a cleaning liquid for use in a pre-cleaning unit, disposed in the cleaning area, for cleaning the substrate before plating in the plating area by bringing the cleaning liquid into contact with the substrate, a supply line for a treatment liquid for use in a pretreatment unit, disposed in the plating area, for pretreating the substrate before plating by bringing the treatment liquid into contact with the substrate and a supply line for a plating solution for use in a plating unit, disposed in the plating area, for plating the pretreated substrate by bringing the plating solution into contact with the substrate.

By connecting a plurality of filters in series to a liquid supply line, filtering of the liquid can be effected securely.

The present invention also provides a substrate processing method, comprising: carrying out a cleaning treatment and a catalyst-imparting treatment as pre-plating treatments before electroless plating of the surface of a substrate, wherein the cleaning treatment is carried out in a wider area of the substrate surface than that area to which a catalyst is imparted by the catalyst-imparting treatment.

The above method makes it possible, for example, to fully pre-clean (with a chemical) the whole area of the surface of a substrate to which a catalyst is to be imparted and fully clean (neutralize) the whole area to which the catalyst has been imparted, whereby plating can then be carried out securely in the necessary area of the substrate surface.

It is preferred that the area of the substrate surface to which a catalyst is imparted by the catalyst-imparting treatment be the same as that area for which uniform plating is necessary. This prevents a catalyst from being imparted also to an area of the substrate surface for which plating is unnecessary, thereby preventing the unnecessary area from being plated later.

In a preferred embodiment of the present invention, the cleaning treatment as a pre-plating treatment comprises pre-cleaning prior to the catalyst-imparting treatment and cleaning after the catalyst-imparting treatment. The pre-plating treatments are carried out in the order of the pre-cleaning (chemical cleaning), the catalyst-imparting treatment and the cleaning (neutralization treatment). Thereafter, electroless plating is carried out by allowing the substrate surface to be in contact with an electroless plating solution.

The present invention also provides yet another substrate processing apparatus, comprising: a cleaning treatment unit for carrying out a cleaning treatment of a substrate; and a catalyst-imparting treatment unit for carrying out a catalyst-imparting treatment of the substrate, said respective treatment being carried out as a pre-plating treatment by allowing the surface of the substrate to be in contact with a respective pre-plating treatment liquid while sealing a peripheral portion of the substrate surface with a seal ring, wherein the cleaning treatment unit is designed to carry out the cleaning treatment in a wider area of the substrate surface than that area to which a catalyst is imparted in the catalyst-imparting treatment unit.

In a preferred embodiment of the present invention, the area of the substrate surface to which a catalyst is imparted in the catalyst-imparting treatment unit is the same as that area for which uniform plating is necessary.

In a preferred embodiment of the present invention, the cleaning treatment unit and the catalyst-imparting treatment unit have the same construction except that the seal rings have different opening areas. This makes it possible to standardize the respective units.

The present invention also provides yet another substrate processing method, comprising: dipping a substrate in a horizontal position into a processing liquid to thereby bring the processing liquid into contact with a processing surface of the lower surface of the substrate; and creating a flow of the processing liquid flowing along the processing surface from the center toward the periphery so that gas bubbles remaining on the processing surface are removed by the flow of the processing liquid.

By creating a flow of a processing liquid flowing along the processing surface of a substrate from the center toward the periphery, gas bubbles remaining on the processing surface, when the substrate in a horizontal position is dipped in the processing liquid, can be removed.

In a preferred embodiment of the present invention, a circular slit is formed in the vicinity of the periphery of the processing surface of the substrate, and the processing liquid, which has flowed from below the processing surface of the substrate to the processing surface and flows along the processing surface, is allowed to pass through the slit, thereby increasing the flow speed of the flow of the processing liquid along the processing surface and removing gas bubbles on the processing surface.

The flow speed of processing liquid can be increased by allowing the processing liquid to pass through the slit formed in the vicinity of the periphery of the processing surface of a substrate. Thus, the flow of the processing liquid can be made an effective flow for removing gas bubbles.

The present invention also provides yet another substrate processing apparatus, comprising: a processing tank for holding a processing liquid; and a substrate holding device for holding a substrate on the lower surface and dipping the substrate held in a horizontal position into the processing liquid, wherein the processing tank is provided with a gas bubble removing section which, when a processing surface of the lower surface of the substrate held in the substrate holding device is in contact with the processing liquid, allows the processing liquid over the processing surface to flow from the center of the substrate toward the periphery.

Since the flow of processing liquid flowing along the processing surface of a substrate from the center toward the periphery is created by the gas bubble removing section, gas bubbles remaining on the processing surface of the substrate, when the substrate in a horizontal position is dipped in the processing liquid, can be removed.

Preferably, the gas bubble removing section is comprised of a circular top end portion which is provided in the processing tank so that a circular slit is formed in the vicinity of the periphery of the processing surface of the substrate dipped in the processing liquid. The flow speed of processing liquid can be increased by allowing the processing liquid to pass through the slit formed in the vicinity of the periphery of the processing surface of the substrate. Thus, the flow of the processing liquid can be made an effective flow for removing gas bubbles.

Preferably, the top end portion is the top end portion of a second tank disposed inside the peripheral portion of the processing tank such that the second tank, together with the peripheral portion of the processing tank, constitutes a double structure, or the top end portion of the peripheral portion of the processing tank. Since the top end portion is provided by the peripheral portion of the processing tank or by the second tank disposed inside the processing tank, the slit can be formed with ease in the vicinity of the periphery of the processing surface of the substrate.

It is preferred that a recovery groove for recovering the processing liquid overflowing the top end of the processing tank be provided around the peripheral portion of the processing tank. This facilitates recycling of a plating solution.

Preferably, an escape groove for passing therethrough the processing liquid flowing along the substrate from the center toward the periphery is provided at the bottom of the substrate holding device and around the substrate held. This enables the processing liquid, which has passed through the slit, to flow out smoothly.

The present invention also provides yet another substrate processing apparatus, comprising: a processing tank for holding a processing liquid; a substrate holding device for holding a substrate; and a substrate holding device drive section for tilting a processing surface of the substrate held in the substrate holding device and bringing the processing surface into contact with the processing liquid to carry out processing while the processing surface is kept tilted.

If the processing surface of a substrate in a horizontal position is dipped in a processing liquid, gas bubbles such as air bubbles stay between the substrate and the processing liquid whereby stable and appropriate dip processing cannot be effected. According to the present invention, on the other hand, the processing surface of a substrate is tilted when it is dipped in the processing liquid, whereby gas bubbles on the processing surface of the substrate in contact with the processing liquid are discharged spontaneously from the deeper side toward the shallower side, making it possible to carry out stable and appropriate dip processing.

The processing of the processing surface of the substrate with the treatment liquid is, for example, a pre-plating treatment. According to the substrate processing apparatus, stable and appropriate pre-plating treatment, such as catalyst-imparting treatment, can be carried out.

In a preferred embodiment of the present invention, the substrate holding device drive section is provided with a substrate-liquid contact region adjusting section for adjusting the region of the processing surface of the substrate to be in contact with the processing liquid within the range of 0-100% of the whole processing surface.

When carrying out processing of a substrate by dipping only part of the processing surface of the substrate in a tilted position in a processing liquid by the substrate-liquid contact region adjusting section while rotating the substrate, a point in the processing surface comes into contact with the liquid and then releases the liquid repeatedly. Accordingly, even if gas bubbles remain adhering to the processing surface of the tilted substrate in the processing liquid (i.e. in the case of gas bubbles not removable merely by the tilt), such bubbles make contact with the air when the processing surface is released from the liquid whereby the gas bubbles can be removed.

In a preferred embodiment of the present invention, the substrate processing apparatus further comprises a suction section which, when the substrate in a tilted position is in contact with the processing liquid, sucks air which has collected between the processing surface of the substrate and the processing liquid so as to forcibly discharge the air. The provision of the suction section makes it possible to forcibly discharge out air which has collected between the processing surface of the substrate and the processing liquid, enabling smooth contact of the liquid to the processing surface of the substrate.

In a preferred embodiment of the present invention, the substrate processing apparatus further comprises a processing liquid supply section for creating a flow of the processing liquid along the tilted processing surface of the substrate in contact with the processing liquid, flowing from the deeper side to the shallower side. According to this embodiment, a flow of the processing liquid, flowing toward the side of the substrate not in contact with the liquid, is formed, and gas bubbles on the processing surface of the substrate in the processing liquid are forced to flow to the space around the liquid-free region of the substrate, whereby the gas bubbles can be discharged to the air more effectively.

Preferably, an escape groove which, when the substrate is in contact with the processing liquid, escapes air which has collected under the lower surface of the substrate is provided at the bottom of the substrate holding device and around the substrate held. With the provision of the escape groove, when a tilted substrate is dipped in a processing liquid, air that has collected under the lower surface of the substrate can be escaped smoothly to the outside. The escape groove also provides an escape route for gas bubbles discharged from the processing surface of the substrate in the processing liquid.

The present invention provides yet another substrate processing method comprising processing a substrate by allowing a processing surface of the substrate to be in contact with a processing liquid while the processing surface is kept tilted.

According to the method, due to the tilt of the processing surface, gas bubbles on the processing surface of the substrate in contact with the processing liquid are discharged spontaneously from the deeper side to the shallower side, enabling stable and appropriate processing.

In a preferred embodiment of the present invention, the processing is carried out by allowing part of the processing surface of the substrate to be in contact with the processing liquid while rotating the substrate in a tilted position.

By rotating the tilted substrate while part of the processing surface of the substrate is in contact with the processing liquid, contact of the processing surface with the liquid and the release of the processing surface from the liquid can be repeated. Accordingly, even if gas bubbles remain adhering to the processing surface of the tilted substrate in the processing liquid (i.e. in the case of gas bubbles not removable merely by the tilt), such bubbles make contact with the air when the processing surface is released from the liquid whereby the gas bubbles can be removed.

The processing of the processing surface of the substrate with the treatment liquid is, for example, a pre-plating treatment. According to the substrate processing method, stable and appropriate pre-plating treatment, such as catalyst-imparting treatment, can be carried out.

Preferably, the substrate processing method further comprises forcibly discharging by suction air that has collected between the processing surface of the substrate and the processing liquid. By thus forcibly discharging out air which has collected between the processing surface of the substrate and the processing liquid, smooth contact of the liquid with the processing surface can be made.

Preferably, the substrate processing method further comprises creating a flow of the processing liquid along the tilted processing surface of the substrate in contact with the processing liquid, flowing from the deeper side to the shallower side. According to this method, a flow of the processing liquid, flowing toward the side of the substrate not in contact with the liquid, is formed, and gas bubbles on the processing surface of the substrate in the processing liquid are forced to flow to the space around the liquid-free region of the substrate, whereby the gas bubbles can be discharged to the air more effectively.

The present invention also provides yet another substrate processing apparatus, comprising: a processing tank for holding a processing liquid; a substrate holding device for holding a substrate; a substrate holding device drive section for tilting a processing surface of the substrate held in the substrate holding device and bringing the processing surface into contact with the processing liquid while the processing surface is kept tilted, and then bringing the processing surface to a horizontal position to carry out processing; and a suction section which, while the substrate in a tilted position in contact with the processing liquid is brought to the horizontal position, sucks air which has collected between the processing surface of the substrate and the processing liquid so as to forcibly discharge the air.

Also with the substrate processing apparatus which brings the processing surface of a substrate held in a tilted position in the substrate holding device into contact with a processing liquid and then brings the processing surface to a horizontal position to carry out processing, air which has collected between the processing surface of the substrate and the processing liquid can be forcibly discharged to the outside smoothly when bringing the tilted substrate to the horizontal position after contact with the liquid. This prevents air bubbles from remaining on the processing surface of the substrate after bringing the substrate to the horizontal position, enabling smooth contact of the liquid with the processing surface of the substrate.

The present invention also provides yet another substrate processing, apparatus, comprising: a processing tank for holding a processing liquid; a substrate holding device for holding a substrate; a substrate holding device drive section for tilting a processing surface of the substrate held in the substrate holding device and bringing the processing surface into contact with the processing liquid while the processing surface is kept tilted, and then bringing the processing surface to a horizontal position to carry out processing; and a processing liquid supply section which, while the substrate in a tilted position in contact with the processing liquid is brought to the horizontal position, creates a flow of the processing liquid along the tilted processing surface of the substrate, flowing from the deeper side to the shallower side.

According to this apparatus, a flow of the processing liquid, flowing toward the side of the substrate not in contact with the liquid, is formed, and gas bubbles on the processing surface of the substrate in the processing liquid are forced to flow to the space around the liquid-free region of the substrate. This prevents air bubbles from remaining on the processing surface of the substrate after bringing the substrate to the horizontal position, enabling smooth contact of the liquid with the processing surface of the substrate.

The present invention also provides yet another substrate processing, apparatus, comprising: a processing tank for holding a processing liquid; a substrate holding device for holding a substrate; and a substrate holding device drive section for tilting a processing surface of the substrate held in the substrate holding device and bringing the processing surface into contact with the processing liquid while the processing surface is kept tilted, and then bringing the processing surface to a horizontal position to carry out processing, wherein an escape groove which, while the substrate in a tilted position in contact with the processing liquid is brought to the horizontal position, allows air which has collected between the processing surface of the substrate and the processing liquid to escape is provided at the bottom of the substrate holding device and around the substrate held.

With the provision of the escape groove, when a tilted substrate dipped in a processing liquid is brought to a horizontal position, air which has collected under the lower surface of the substrate can escape smoothly to the outside. This prevents air bubbles from remaining on the processing surface of the substrate after bringing the substrate to the horizontal position, enabling smooth contact of the liquid with the processing surface of the substrate.

The present invention provides yet another substrate processing method, comprising: bringing a processing surface of a substrate in a tilted position into contact with a processing liquid and then bringing the processing surface to a horizontal position to carry out processing of the surface; and forcibly discharging by suction air which has collected between the processing surface of the substrate and the processing liquid when bringing the tilted substrate in contact with the processing liquid to the horizontal position.

According to this method, when the tilted substrate in contact with the processing liquid is brought to a horizontal position, air that has collected between the processing surface of the substrate and the processing liquid can be forcibly discharged to the outside smoothly. This prevents air bubbles from remaining on the processing surface of the substrate after bringing the substrate to the horizontal position, enabling smooth contact of the liquid with the processing surface of the substrate.

The present invention provides yet another substrate processing, method comprising: bringing a processing surface of a substrate in a tilted position into contact with a processing liquid and then bringing the processing surface to a horizontal position to carry out processing of the surface; and creating a flow of the processing liquid along the tilted processing surface of the substrate, flowing from the deeper side to the shallower side, when bringing the tilted substrate in contact with the processing liquid to the horizontal position, thereby removing gas bubbles on the processing surface of the substrate.

According to this method, a flow of the processing liquid, flowing toward the side of the substrate not in contact with the liquid, is formed, and gas bubbles on the processing surface of the substrate in the processing liquid are forced to flow to the space around the liquid-free region of the substrate, whereby the gas bubbles can be discharged to the air more effectively. This prevents air bubbles from remaining on the processing surface of the substrate after bringing the substrate to the horizontal position, enabling smooth contact of the liquid with the processing surface of the substrate.

The present invention also provides a substrate holding device for holding a substrate by attracting the back surface of the substrate to the lower surface of an attracting head, comprising: a ring-shaped substrate attracting portion for attracting by vacuum the back surface of the substrate and functioning as a seal for preventing intrusion of a processing liquid into the inside of the ring-shaped vacuum-attracted portion of the back surface of the substrate; and a pusher for pressing on the substrate attracted to the substrate attracting portion in a direction away from the attracting head, said substrate attracting portion and said pusher being mounted in a peripheral region of the lower surface of the attracting head.

According to the substrate holding device, the back surface of a substrate is sealed and attracted by the ring-shaped substrate attracting portion, whereby intrusion of a processing liquid into the back surface of the substrate can be prevented and, in addition, the attraction width can be minimized, avoiding possible adverse effects (such as deformation of substrate) on the substrate.

Further, the substrate attracted to the substrate attracting portion is detached from the attracting head by the pusher. Accordingly, the substrate can be detached securely even if the substrate attracting portion, which is made of e.g. a rubber, due to a change in the quality with time, etc., is sticky to the substrate and therefore the substrate attracted to the substrate attracting portion is hard to detach from it. The attachment/detachment of the substrate can thus be carried out smoothly. Either a single pusher or a plurality of pushers may be provided.

In a preferred embodiment of the present invention, the pusher is connected to a vacuum supply line so that the pusher retracts into the attracting head by vacuuming through the vacuum supply line, while the pusher protrudes from the attracting head by a supply of a gas to the vacuum supply line to press on the back surface of the substrate held in the attracting head. The pusher can be operated securely by vacuuming and the supply of gas.

Preferably, the pusher retracted in the attracting head does not make contact with the back surface of the substrate attracted and held on the lower surface of the attracting head. Accordingly, there is no fear of a lowering of the temperature of processing liquid due to heat transfer through contact between the back surface of the substrate and the pusher.

Preferably, the vacuum supply line, besides connection to the pusher, is also connected to the substrate attracting portion. By thus sharing the vacuum supply line, the structure of the substrate holding device can be simplified.

The present invention also provides yet another substrate processing, apparatus comprising: a substrate holding device for holding a substrate by attracting the back surface of the substrate to the lower surface of an attracting head, said device including a ring-shaped substrate attracting portion for attracting by vacuum the back surface of the substrate and functioning as a seal for preventing intrusion of a processing liquid into the inside of the ring-shaped vacuum-attracted portion of the back surface of the substrate, and a pusher for pressing on the substrate attracted to the substrate attracting portion in a direction away from the attracting head, said substrate attracting portion and said pusher being mounted in a peripheral region of the lower surface of the attracting head; and a substrate processing section for carrying out processing of a processing surface of the substrate held in the substrate holding device with the processing liquid.

The present invention also provides a method for attaching/detaching a substrate to and from a substrate holding device, comprising attracting and releasing the back surface of the substrate to and from the lower surface of an attracting head of the substrate holding device, wherein the attraction of the substrate to the lower surface of the attracting head is carried out by attracting by vacuum and sealing the back surface of the substrate with a ring-shaped attracting and sealing portion, while the release of the substrate from the lower surface of the attracting head is carried out by emitting a gas from the ring-shaped vacuum-attracting portion and pressing on a portion of the back surface of the substrate positioned inside the ring-shaped vacuum-attracting portion by a pusher.

BRIEF DESCRIPTION OF THE DRAWINGS

FIG. 3A is a plan view showing the main portion of a first substrate transfer robot holding a substrate;

FIG. 3B is a side view showing the main portion of the first substrate transfer robot not holding a substrate;

FIG. 3C is a schematic side view of the first substrate transfer robot as viewed in the direction of arrow A shown in FIG. 3A;

FIG. 4A is a plan view of a second substrate transfer robot, showing the state when an upper-positioned lower hand holds a substrate (depiction of an upper-positioned upper hand is omitted);

FIG. 4B is a side view of the second substrate transfer robot not holding a substrate;

FIG. 4C is a plan view showing the main portion of an upper-positioned upper hand of the second substrate transfer robot holding a substrate;

FIG. 4D is a plan view showing the main portion of a lower-positioned hand of the second substrate transfer robot holding a substrate;

FIG. 5A is a side view showing the main portion of a third substrate transfer robot holding a substrate;

FIG. 5B is a plan view showing the main portion of a vacuum hand of the third substrate transfer robot holding a substrate;

FIG. 5C is an enlarged sectional view of the end portion of the vacuum hand of the third substrate transfer robot;

FIG. 7A is a sectional side view of a second reversing machine;

FIG. 7B is a schematic plan view of the substrate attachment/detachment arms of the second reversing machine;

FIG. 8A is a schematic front view of a temporary substrate storage stage;

FIG. 8B is a schematic side view of the temporary substrate storage stage;

FIG. 8C is a schematic plan view of the temporary substrate storage stage;

FIG. 10A is a schematic sectional side view of a vessel and a lid member, showing the state when the vessel is closed with the lid member;

FIG. 10B is a schematic plan view of FIG. 10A;

FIG. 10C is a schematic sectional side view of the vessel when the vessel is opened with the lid member;

FIG. 10D is a schematic plan view of FIG. 10C (depiction of the lid member is omitted);

FIG. 12A is a side view of a head (mounting base) lifting mechanism;

FIG. 12B is a perspective view of the head (mounting base) lifting mechanism as viewed from the backside;

FIG. 13 is a diagram illustrating the operation of the substrate fixing head;

FIG. 14A is a diagram illustrating a sealing position of a sealing member in a pretreatment;

FIG. 14B is a diagram illustrating a sealing position of another sealing member in a pretreatment;

FIG. 15A is a side view of a plating unit;

FIG. 15B is a cross-sectional view of FIG. 15A;

FIG. 18A is a schematic sectional side view of a substrate holding device;

FIG. 18B is an enlarged view of the portion G of FIG. 18A;

FIG. 19A is a diagram illustrating the operation of the substrate holding device;

FIG. 19B is an enlarged view of the portion G of FIG. 19A;

FIG. 20A is a diagram illustrating the operation of the substrate holding device;

FIG. 20B is an enlarged view of the portion G of FIG. 20A;

FIG. 22A is a schematic side view showing a tilting mechanism (the substrate holding device is also shown);

FIG. 22B is a right side view of FIG. 22A (the substrate holding device is not shown);

FIGS. 29A through 29C are diagrams each illustrating different construction of an end portion of a pipe connected to a plating solution supply tank;

FIG. 30A is a front view showing a sample port;

FIG. 30B is a perspective view showing the sample port;

FIG. 32 is a diagram illustrating a manner of carrying out another pretreatment in a first pretreatment unit;

FIG. 38A is a schematic sectional diagram illustrating the state of the flow of plating solution in the processing tank immediately before a substrate is dipped into the plating solution;

FIG. 38B is an enlarged schematic sectional diagram showing the top end portion shown in FIG. 38A;

FIG. 39A is a schematic sectional diagram illustrating the state of the flow of plating solution in the processing tank when the substrate is dipped in the plating solution and is close to the top end portion;

FIG. 39B is an enlarged schematic sectional diagram showing the top end portion shown in FIG. 39A;

FIG. 40A is a schematic sectional diagram illustrating the state of the flow of plating solution in the processing tank when the substrate dipped in the plating solution is in a substrate processing position;

FIG. 40B is an enlarged schematic sectional diagram showing the top end portion shown in FIG. 40A;

FIG. 41A is a side view illustrating the operation of the substrate processing apparatus;

FIG. 41B is a schematic sectional side view of FIG. 41A;

FIG. 42A is a schematic sectional diagram illustrating the flow of plating solution in the processing tank according to another embodiment of the present invention, showing the flow state immediately before a substrate is dipped into the plating solution;

FIG. 42B is an enlarged schematic sectional diagram showing the top end portion shown in FIG. 42A;

FIG. 43A is a schematic sectional diagram illustrating the state of the flow of plating solution in the processing tank when the substrate is dipped in the plating solution and is close to the top end portion;

FIG. 43B is an enlarged schematic sectional diagram showing the top end portion shown in FIG. 43A;

FIG. 45 is an enlarged sectional view of a processing tank;

FIG. 46A is a schematic sectional side view showing a substrate holding device and a device rotating motor;

FIG. 46B is an enlarged view of the portion A of FIG. 46A;

FIG. 47 is a view of the lower surface of a substrate holder;

FIG. 50 is a diagram illustrating another method of dip-processing a substrate;

FIG. 51 is a diagram illustrating yet another method of dip-processing a substrate;

FIG. 53A is a cross-sectional view of a substrate holding device according to an embodiment of the present invention;

FIG. 53B is an enlarged view of the portion A of FIG. 53A;

FIG. 56A is a diagram illustrating the operation of the substrate holding device;

FIG. 56B is an enlarged view of the main portion of FIG. 56A; and

FIG. 57 is a diagram illustrating the operation of the substrate holding device.

DETAILED DESCRIPTION OF THE PREFERRED EMBODIMENTS

Preferred embodiments of the present invention will now be described in detail with reference to the drawings.

Figure 1:
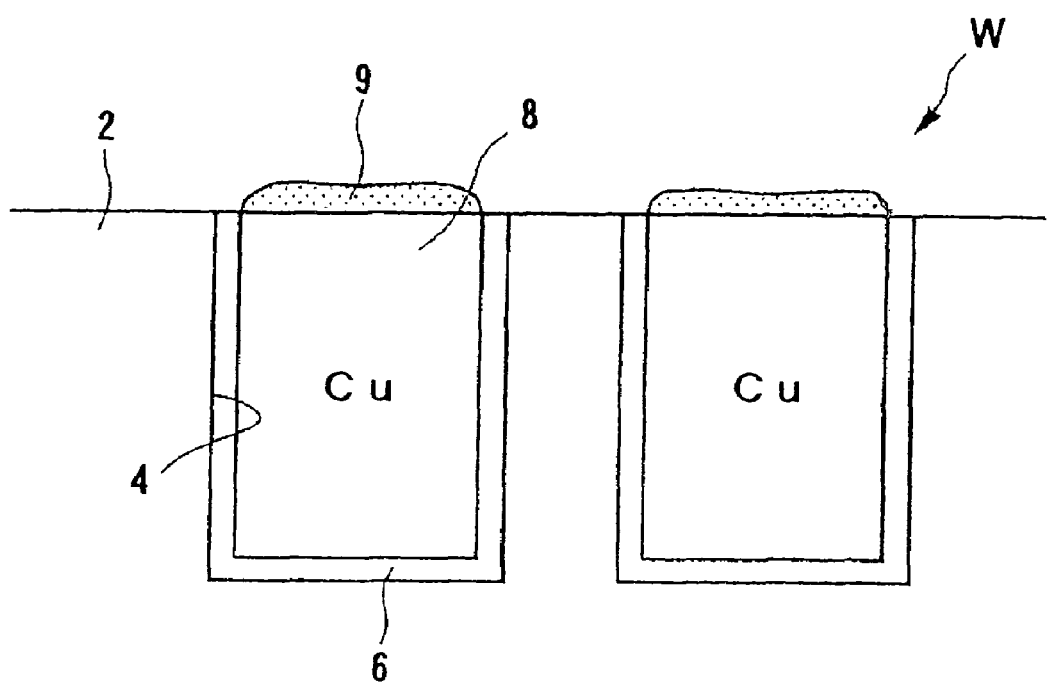
FIG. 1 is an enlarged sectional view of the main portion of a semiconductor substrate.
Figure 2:
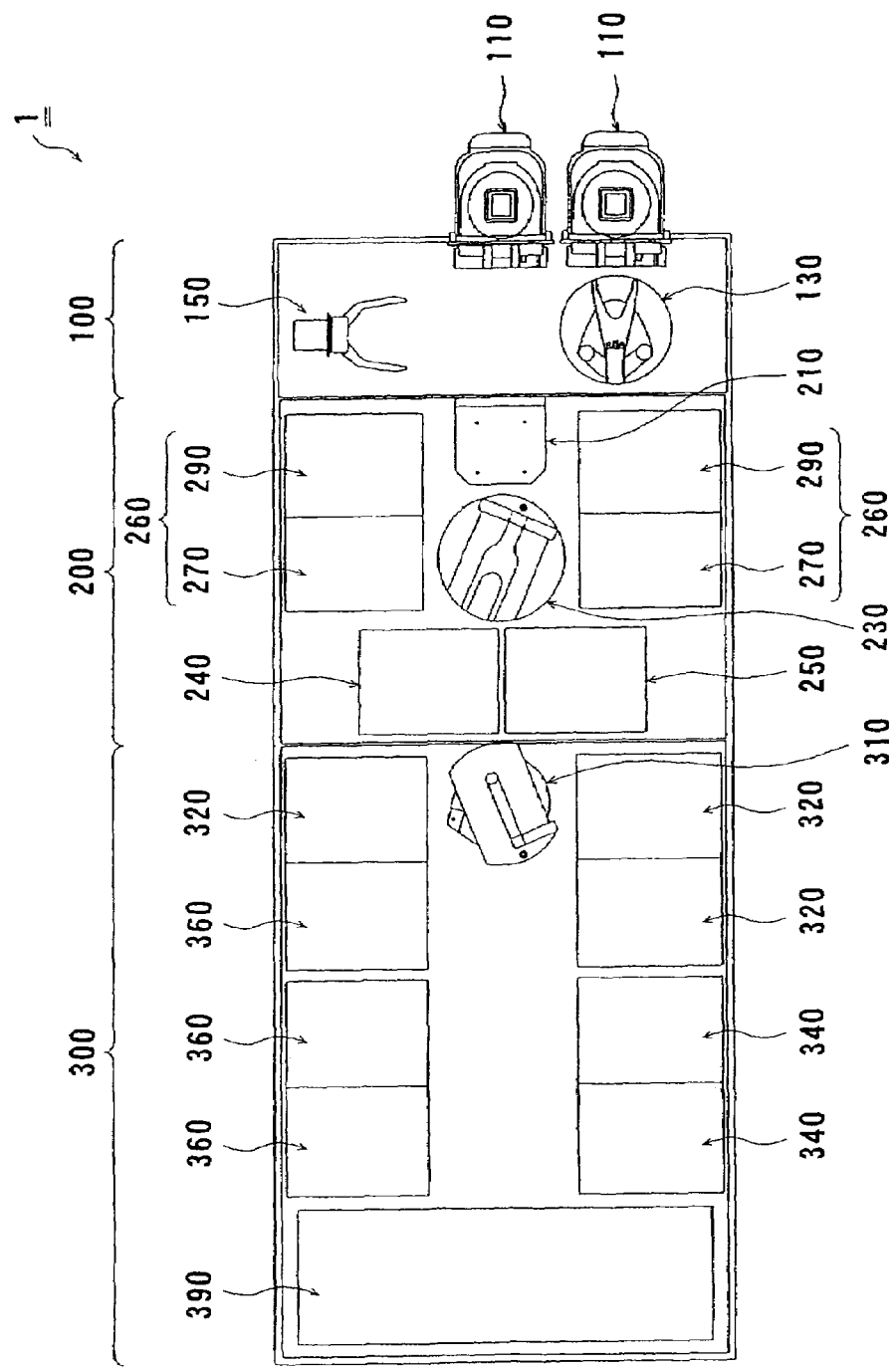
FIG. 2 is an overall plan view of a substrate processing apparatus according to an embodiment of the present invention.

FIG. 2 is a schematic overall plan view of a substrate processing apparatus 1 according to an embodiment of the present invention. As shown in FIG. 2, the substrate processing apparatus 1 comprises three processing areas: a loading/unloading area 100, a cleaning area 200, and a plating area 300. In the loading/unloading area 100, two loading ports 110, a first substrate transfer robot 130 and a first reversing machine 150 are installed. In the cleaning area 200, a temporary substrate storage stage 210, a second substrate transfer robot 230, a pre-cleaning unit 240, a second reversing machine 250 and two post-cleaning units 260, 260 are installed. In the plating area 300, a third substrate transfer robot 310, three first pretreatment units 320, two second pretreatment units 340, three plating units 360 and a plating solution supply unit 390 are installed. A description will be given below of the respective components.

[Substrate Transfer Robot]

In the areas 100, 200, 300 of the substrate processing apparatus 1 are respectively provided the substrate transfer robots 130, 230, 310 which hold and transfer a substrate W either face up, i.e., with its front surface (processing surface) facing upward, or face down, i.e., with its front surface facing downward. Whether "face up" or "face down" and whether "dry-use design" or "wet-use design" should be properly selected according to process requirements. Thus, the substrate transfer robots 130, 230, 310 each have a hand adapted to meet the corresponding process requirements. According to the substrate processing apparatus 1, reversing of the substrate W by rotation of the arm of the substrate transfer robot 130, 230 or 310 is not carried out, which prevents a risk of fall of the substrate W during its transfer by the hand of the substrate transfer robot 130, 230 or 310. The following is a description of the respective substrate transfer robots 130, 230, 310.

(1) First Substrate Transfer Robot 130

FIG. 3A is a plan view showing the main portion of the first substrate transfer robot 130 (carrying a substrate W) installed in the loading/unloading area 100, FIG. 3B is a side view showing the main portion of the first substrate transfer robot 130 (not carrying a substrate W), and FIG. 3C is a schematic side view of the first substrate transfer robot 130 as viewed in the direction of arrow A indicated in FIG. 3A. The first substrate transfer robot 130 is a robot for transferring a substrate W in a fully dry state and, as shown in FIGS. 3A and 3B, has hands 137, 139 of dry-use design which are mounted, one above the other, to the ends of arms 133, 135 having joints and set up on a robot body 131. The both hands 137, 139 are of a thin drop-in type. As shown in FIG. 3C, the robot body 131 is mounted to the end of two arms 132a, 132b mounted to a base 132 and is rotatable at the end of the arm 132b, whereby the robot 131 can move to various places, as shown by the solid lines and the broken lines in FIG. 3C. Thus, the first substrate transfer robot 130, without movement of the whole body, can transfer a substrate W in a dry state between cassettes for housing substrates set in the loading ports 110, 110, the first reversing machine 150 and the temporary substrate storage stage 210.

The first substrate transfer robot 130 does not have a traveling shaft because of the following reasons. It is a conventional practice to move the first substrate transfer robot 130 by a traveling shaft to transfer a substrate W. A drive means such as a ball screw, a linear motor, etc., has been employed for the traveling shaft. In any case, a sliding portion (e.g. LM guide) is necessary, and such portion has been a source of particles. In view of this, the present invention utilizes as the first substrate transfer robot 130 a fixed-type robot for which a traveling shaft is not needed, thereby preventing the generation of particles and making it possible to always obtain a clean atmosphere for a substrate W to be processed in the loading/unloading area 100.

(2) Second Substrate Transfer Robot 230

In the cleaning area 200, a substrate W which can be both dry and wet is transferred face up at times and face down at other times. In view of this, a two-arm three-hand robot is employed as the second substrate transfer robot 230 used in the cleaning area 200. FIG. 4A is a plan view of the second transfer robot 230 showing the state when an upper-positioned lower hand 239 holds a substrate W (depiction of an upper-positioned upper hand 237 omitted), FIG. 4B is a side view of the second substrate transfer robot 230 (not holding a substrate W), FIG. 4C is a plan view showing the main portion of an upper-positioned upper hand 237 of the second substrate transfer robot 230 (holding a substrate W), and FIG. 4D is a plan view showing the main portion of a lower-positioned hand 241 of the second substrate transfer robot 230 (holding a substrate W). As shown in FIGS. 4A through 4C, the second substrate transfer robot 230 comprises a robot body 231, arms 233, 235 having joints and set up on the robot body 231, an upper-positioned upper hand 237 and an upper-positioned lower hand 239 mounted, one above the other, to the end of one arm 233, and a lower-positioned hand 241 mounted to the end of the other arm 235.

The upper-positioned upper hand 237 is a hand for transferring a dry substrate W after treatment in the post-cleaning unit 260 to the temporary substrate storage stage 210, and is a face-up, thin drop-in type hand of dry-use design. The upper-positioned lower hand 239 is a hand of dry-use design for transferring a substrate W, which has been transferred from the loading/unloading area 100 to the temporary substrate storage stage 210, to the pre-cleaning unit 240, and is a face-down, thin vacuuming type hand for attracting the back surface of a substrate W and holding the substrate W (back surface attraction-type vacuum hand). The lower-positioned hand 241 is a hand for transferring a substrate W, which has been transferred from the plating area 300 to the second reversing machine 250, to a first cleaning section 270 and a second cleaning/drying section 290 of the post-cleaning unit 260 respectively, and is a face-up, thick drop-in type hand of wet-use design.

Thus, in the cleaning area 200, a substrate W in a dry state is transferred face down from the temporary substrate storage stage 210 to the pre-cleaning unit 240; a substrate W in a wet state after plating is transferred face up from the second reversing machine 250 to the first cleaning section 270 as well as from the first cleaning section 270 to the second cleaning/drying section 290, and a substrate W in a dry state is transferred face up from the second cleaning/drying section 290 to the temporary substrate storage stage 210. Such a mode of substrate transfer is the best mode of transferring a substrate W between the respective treatment units, best meeting the corresponding process requirements. In order to enable the best mode of transferring a substrate W, the two arms 233, 235 are provided with the three types of hands 237, 239, 241, as described above. The provision of two types of hands 237, 239 in one arm 233 enables one second substrate transfer robot 230 to have the plurality of hands respectively for the above-described uses.

(3) Third Substrate Transfer Robot 310

FIG. 5A is a side view showing the main portion of the third substrate transfer robot 310 (holding a substrate W) installed in the plating area 300, FIG. 5B is a plan view showing the main portion of vacuum hands 337, 339 of the third substrate transfer robot 310 (holding a substrate W), and FIG. 5C is an enlarged sectional view of the end portion of the vacuum hand 337 (or 339) of the third substrate transfer robot 310. A substrate W is transferred always face down in the plating area 300. Accordingly, the third substrate transfer robot 310 has back surface attraction-type vacuum hands 337, 339 which are respectively mounted, one above the other, to the ends of the arms 333, 335 (arm 335 is not shown) each having joints and set up on a robot body 331. The both vacuum hands 337, 339 are thick hands of high rigidity and have a strong vacuum attraction force so that they can deal with the following situation that may be encountered when attaching/detaching a substrate: When taking a substrate W out of the pre-cleaning unit 240, the first treatment unit 320 or the second pretreatment unit 340 after the below-described pre-cleaning or pretreatment which is carried out while the substrate is held face down, there is a case where the substrate W is adhering to the below-described sealing member 575 of substrate fixing head 560 (see FIGS. 11A and 11B). By using vacuum hands 337, 339 having a strong vacuum attraction force and possessing a high rigidity, the take-out and transfer of the substrate W from the substrate fixing head 560 can be carried out securely even when the substrate W is adhering to the sealing material 575.

As shown in FIG. 5C, the end portion of the vacuum hand 337 (or 339) includes a substrate suction pad 337*a* having a substrate attracting surface 337*b* which is designed to be retractable in the substrate attracting direction by provision of a bellows portion 337*c* around the substrate attracting surface 337*b*, and a fixed member 337*f* disposed around the substrate suction pad 337*a* for hermetically fixing the substrate suction pad 337*a* and having a flat reference surface 337*g* for positioning of a substrate W in the vertical direction. The substrate suction pad 337*a* communicates with a vacuum line 337*h*, 337*j* extending within the vacuum hand 337 (or 339). Further, recessed suction openings 337*d* are formed in the substrate attracting surface 337*b*. When attracting and holding the back surface of a substrate W, the back surface of the substrate W is first attracted onto the substrate attracting surface 337*b*. If the substrate W is tilted relative to the vacuum hand 337 (or 339) upon the attraction, the bellows portion 337*c* is distorted accordingly, whereby the substrate attracting surface 337*b* also tilts and therefore the back surface of the substrate W can be easily attracted onto the substrate attracting surface 337*b*. Further, because of the retraction of the substrate suction pad 337*a*, the back surface of the substrate W is brought into contact with the reference surface 337*g* of the fixed member 337*f*, whereby the substrate W is held horizontally. Positioning of the substrate W in the vertical direction can thus be effected.

As described above, this embodiment uses as the vacuum hand 337 (or 339) mounted to the third substrate transfer robot 310 a back surface attraction-type vacuum hand that holds and transfers a substrate face down. This is for the following reasons: In order to avoid the adverse effects of particles on a substrate W, there is always a down flow of air in the substrate processing apparatus 1. Accordingly, if a substrate W is held and transferred face up, the processing surface of the substrate can be dried during transfer of the substrate between the respective processing units. To prevent this, it is a general approach to make a substrate W a fully wet state in advance. In this case, however, the liquid could be scattered in the apparatus, adversely affecting the atmosphere in the apparatus. In view of the above, according to this embodiment, the vacuum hand 337 (339) attracts and holds the central portion of the back surface of a substrate W and transfers the substrate W face down without contact with the processing surface of the substrate W, thereby reducing the influence of the down flow of air and enabling the substrate W to be transferred in a wet but best dried state, leading to a good atmosphere in the apparatus. This holds true for the upper-position lower hand 239 of the second substrate transfer robot 230 in the cleaning area 200.

[Reversing Machine]

In the substrate processing apparatus 1, the reversing machines 150, 250, each comprised of a unit that can reverse a substrate W 180 degrees, are provided respectively in the loading/unloading area 100 and in the cleaning area 200, which makes it possible to transfer the substrate either face up or face down.

(1) First Reversing Machine 150

Figure 6A:
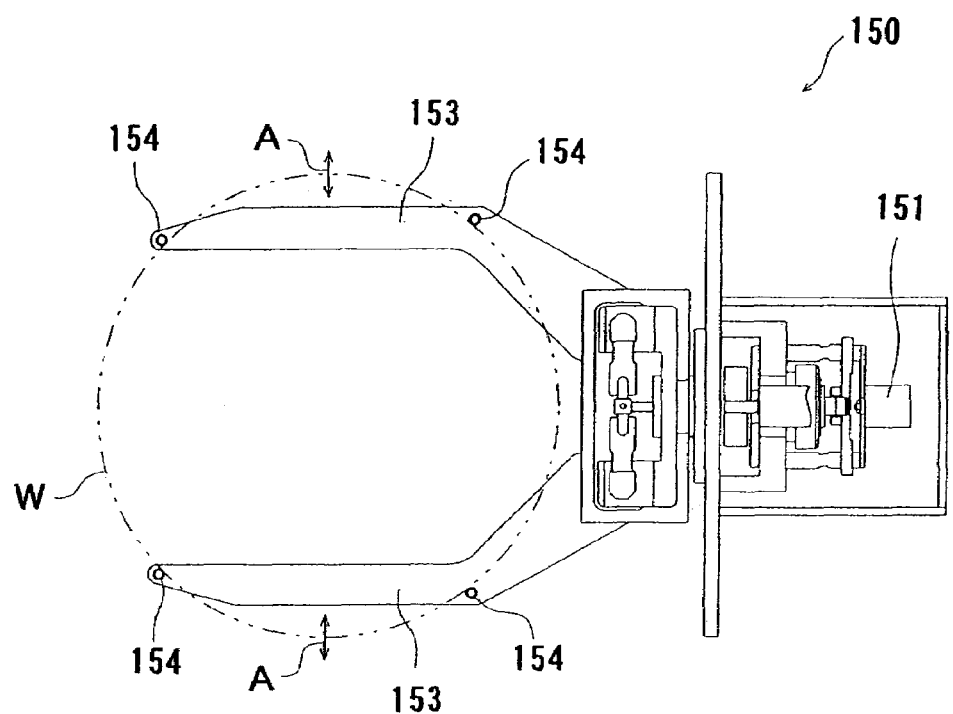
FIG. 6A is a schematic sectional plan view of a first reversing machine.
Figure 6B:
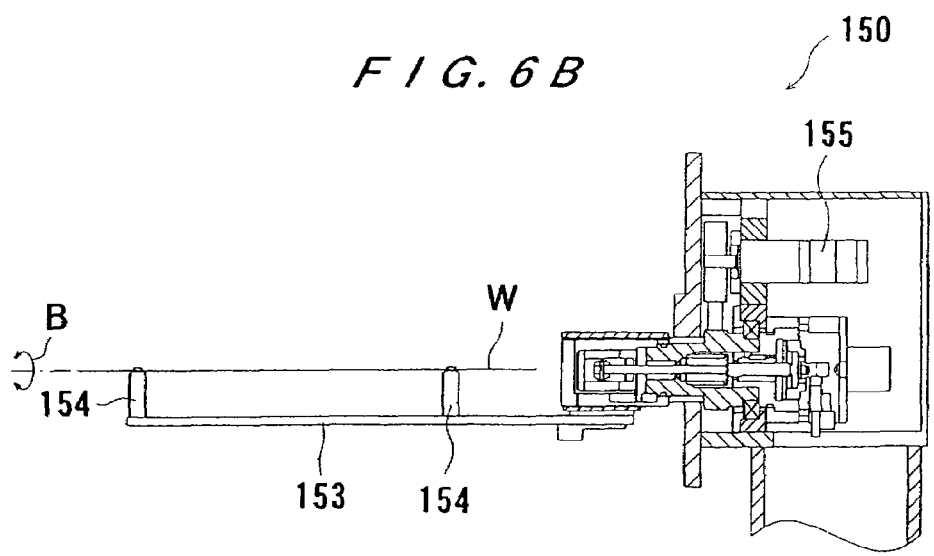
FIG. 6B is a sectional view of the first reversing machine.

FIG. 6A is a schematic sectional plan view of the first reversing machine 150 installed in the loading/unloading area 100, and FIG. 6B is a schematic sectional side view of the first reversing machine 150. As shown in FIG. 6A, the first reversing machine 150 opens/closes substrate attachment/detachment arms 153, 153 in the direction of arrow A by driving a substrate attachment/detachment cylinder 151 and, as shown in FIG. 6B, rotates the substrate attachment/detachment arms 153, 153 180 degrees in the direction of arrow B by driving a reversing motor 155. A stepping motor, for example, may be used as the reversing motor 155. A substrate W is disposed between the substrate attachment/detachment arms 153, 153 when they are open; the substrate attachment/detachment arms 153, 153 are then closed, and a peripheral portion of the substrate W is held by crank pins 154 provided in the substrate attachment/detachment arms 153, 153; the reversing motor 155 is driven to rotate the substrate W 180 degrees; and the substrate attachment/detachment arms 153, 153 are then opened to release the substrate W.

(2) Second Reversing Machine 250

FIG. 7A is a schematic sectional side view of the second reversing machine 250 installed in the cleaning area 200, and FIG. 7B is a schematic plan view of the substrate attachment/detachment arms 253, 253 of the second reversing machine 250. As with the first reversing machine 150, the substrate attachment/detachment arms 253, 253 are opened/closed and reversed by a not-shown substrate attachment/detachment cylinder and a not-shown reversing motor. Since the second reversing machine 250 handles a substrate W in the course of process, it is necessary to prevent drying of the substrate W. Accordingly, positioned above and below the substrate W, there are provided shower nozzles 251, 253 for jetting a liquid, such as pure water, to both surfaces of the substrate w.

[Temporary Substrate Storage Stage]

FIG. 8A is a schematic front view of a temporary substrate storage stage 210, FIG. 8B is a schematic side view of the temporary substrate storage stage 210, and FIG. 8C is a schematic plan view of the temporary substrate storage stage 210. As shown in FIGS. 8A through 8C, the temporary substrate storage stage 210 includes a lifting plate 211 which is vertically movable via linear guides 213, 213, and can be moved vertically by a lifting mechanism 216 comprised of a lifting motor 214 and a ball screw 215. Further, an upper temporary storage stage 217 and a lower temporary storage stage 219 are provided above and below in the upper portion of the lifting plate 211. A cleaning substrate W before processing is placed on the lower temporary storage stage 219, while a clean substrate W after processing is placed on the upper temporary storage stage 217. Four supporting rods 221, protruding upwardly, are disposed on the respective upper surfaces of the temporary storage stages 217, 219, and a substrate W is supported on the supporting rods 221. When temporarily storing a substrate W, as shown in FIG. 8C, a hand carrying the substrate W is moved to above the temporary storage stage 217 or 219; the lifting mechanism 216 is driven to slightly raise the temporary storage stages 217, 219 so as to place the substrate W on the supporting rods 221; and the hand is then withdrawn. The reverse operation described above is carried out when transferring the substrate W from the temporary storage stage 217 or 219 to the hand.

[Pretreatment Units]

Figure 9:
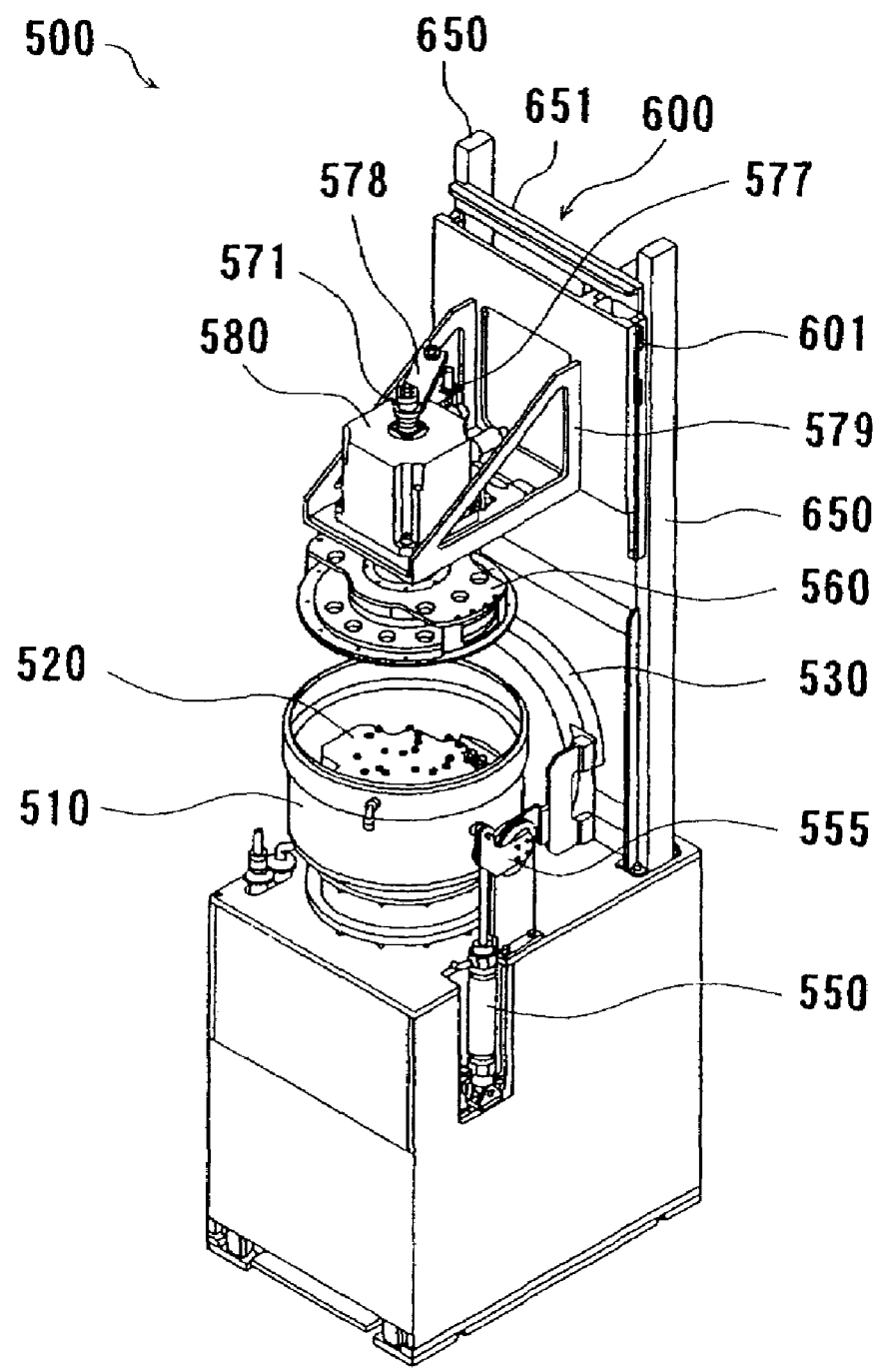
FIG. 9 is a perspective view showing a pretreatment unit.

The pretreatment units consist of the pre-cleaning unit 240, the first pretreatment unit (catalyst-imparting treatment unit) 320 and the second pretreatment unit [chemical cleaning (neutralization) unit] 340. These pretreatment units are basically of the same construction. FIG. 9 is a perspective view showing a pretreatment unit 500 for use as the respective pretreatment unit. As shown in FIG. 9, the pretreatment unit 500 comprises a cylindrical vessel 510 opening upwardly and having a spray nozzle (treatment liquid spraying section) 520 disposed inside, a lid member 530 for closing the top opening of the vessel 510, a spray nozzle (treatment liquid spraying section) 540 (see FIGS. 10A and 10B) mounted to the upper surface of the lid member 530, a lid member drive mechanism 550 for pivoting the lid member 530, a substrate fixing head 560 for holding a substrate W above the vessel 510, a head rotating motor 580 for rotating the substrate fixing head 560, and a head lifting mechanism 600, to which the head rotating motor 580, etc. is mounted, for vertically moving the substrate fixing head 560. The substrate fixing head 560 and members mounted to a mounting base 579, such as the head rotating motor 580, constitute a substrate holding device.

FIG. 10A is a schematic sectional side view showing the vessel 510 and the lid member 530 when the vessel 510 is closed with the lid member 530, FIG. 10B is a schematic plan view of FIG. OA, FIG. 10C is a schematic sectional side view of the vessel 510 shown opened, and FIG. 10D is a schematic plan view of FIG. 10C (depiction of the lid member 530 is omitted).

The lid member 530 is driven to move between a position at which it closes the opening of the vessel 510, as shown in FIG. 10A, and a position at which it is apart from the vessel 510 and opens the vessel 510, as shown in FIG. 10C, by the lid member drive mechanism 550 including the cylinder shown in FIG. 9 and a link mechanism 555 linking the lid member drive mechanism 550 and the lid member 530.

As shown in FIGS. 10C and 10D, a spray nozzle 520 disposed within the vessel 510 is comprised of a plate-like nozzle fixing member 521 and a plurality of nozzles (19 nozzles) 523 oriented upwardly and distributed over the nozzle fixing member 521. The plurality of nozzles (19 nozzles) 523 are disposed such that when a substrate W held in the substrate fixing head 560 is lowered to a position within the vessel 510, for example the position shown in FIG. 10C, and a treatment liquid (first treatment liquid) is sprayed from the nozzles 523 simultaneously, the treatment liquid can be sprayed uniformly onto the entire processing surface (lower surface) of the substrate W and the spraying pressure applied to the processing surface can be best equalized. This enables uniform processing of the substrate W. Because of the spray angle of treatment liquid, the distance between the nozzles 523 and the substrate W must be made a predetermined distance precisely in order to spray the treatment liquid uniformly over the entire processing surface of the substrate W. The substrate holding head 560 should therefore be constructed so that a precise positioning thereof in the vertical direction is possible. Further, since the spray angle of the nozzles 523 changes with the spraying pressure, an electrical feedback (servo control, etc.) is employed for the vertical positioning of the substrate holding head 560 so that the treatment liquid can be applied onto the entire processing surface of the substrate W with an appropriate spray angle at the spraying pressure upon processing.

Further, in an upper position within the vessel 510, there are disposed a plurality of spray nozzles 515 (4 nozzles) for cleaning the inside of the vessel which spray a cleaning liquid in the circumferential direction of the vessel. The entire inner circumferential surface of the vessel 510 can be cleaned with the cleaning liquid sprayed from the spray nozzles 515. In particular, each spray nozzle 515 is capable of adjusting the spray angle. Pure water or other cleaning liquid sprayed from the spray nozzles 515 flows downward while flowing tangentially along the inner wall of the vessel 510, cleaning the entire inner wall. The cleaning can prevent drying of the inner wall of the vessel 510, thereby preventing generation of particles. Deterioration of members due to immersion in a treatment liquid can also be prevented. The cleaning of the inner wall of the vessel by the spray nozzles 515 may be carried out every treatment of substrate W (per one substrate or per a predetermined number of substrates) and at the time of maintenance.

On the other hand, the spray nozzle 540 mounted to the upper surface of the lid member 530 is also comprised of a plurality of nozzles (19 nozzles) 543 oriented upwardly and distributed over the upper surface of the lid member 530. The plurality of nozzles (19 nozzles) 543 are also disposed such that when the substrate W held in the substrate fixing head 560 is positioned above the lid member 530 closing the vessel 510 (see FIG. 10A), and a second treatment liquid is sprayed from the nozzles 543 simultaneously, the treatment liquid can be sprayed uniformly onto the entire processing surface (lower surface) of the substrate W and the spraying pressure applied to the processing surface can be best equalized. This enables uniform processing of the substrate W. As shown by the broken line in FIG. 10B, the nozzles 543 are disposed along a vertical line so that the distances of the respective nozzles 543 from the center of the lid member 530 differ, whereby the treatment liquid can be sprayed uniformly over the entire processing surface of the substrate W. Because of the spray angle of the treatment liquid, the distance between the nozzles 543 and the substrate W must be made a predetermined distance precisely in order to spray the treatment liquid uniformly over the entire processing surface of the substrate W. The substrate holding head 60 is therefore constructed so that a precise positioning in the vertical direction is possible, and an electrical feedback (servo control, etc.) is employed for the vertical positioning.

Figure 11A:
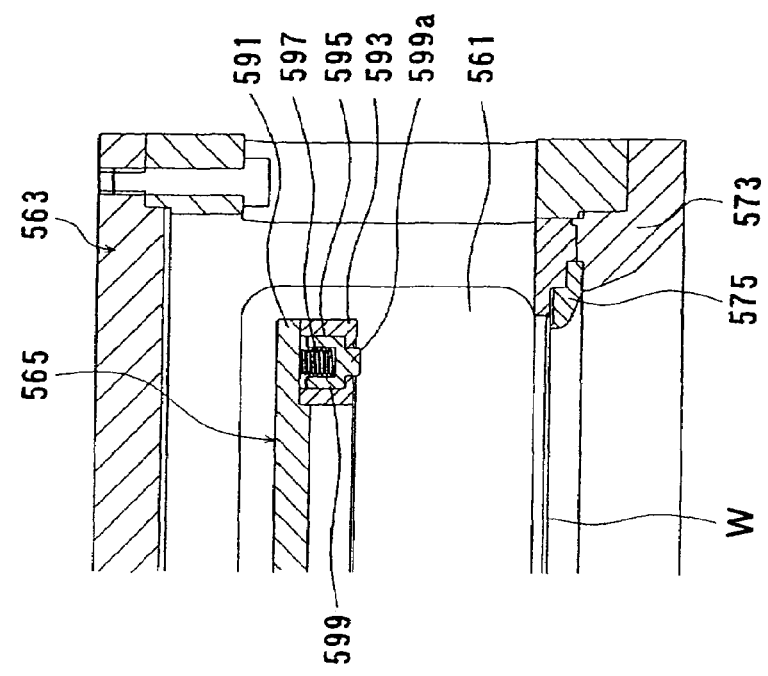
FIG. 11A is a schematic sectional side view of a substrate fixing head and a head rotating motor.
Figure 11B:
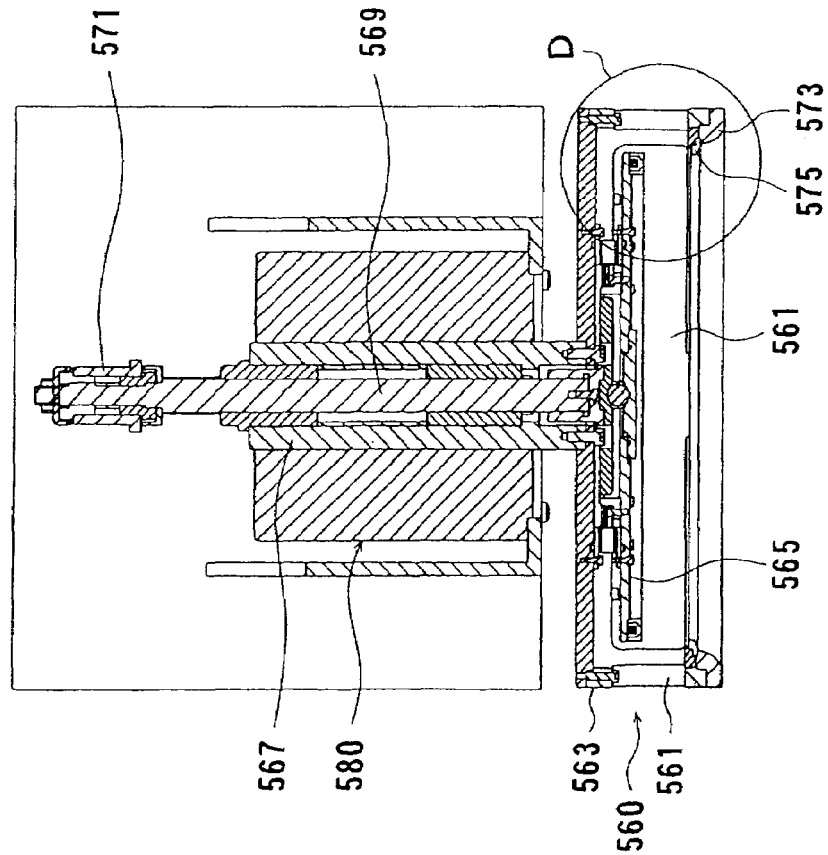
FIG. 11B is an enlarged view of the portion D of FIG. 11A.

FIG. 11A is a schematic sectional side view showing the substrate fixing head 560 and the head rotating motor 580, and FIG. 11B is an enlarged view of the portion D of FIG. 11A. As shown in FIG. 11A, the substrate fixing head 560 includes a downwardly-open housing 563 having openings 561 in the sidewall, and a pressing member 565 disposed within the housing 563. The housing 563 is coupled to the hollow output shaft 567 of the head rotating motor 580. The pressing member 565 is coupled at its center to a shaft 569. The shaft 569 passes through the hollow portion of the output shaft 567 and protrudes upwardly, and the end of protrusion is rotatably supported with a bearing portion 571. The hollow portion of the output shaft 567 and the shaft 569 are in spline engagement so that they can rotate simultaneously, while the shaft 569 can move vertically independent of the output shaft 567. An inwardly-projecting ring-shaped substrate holder 573 is provided at the lower end of the housing 563. A ring-shaped sealing member 575 for placing thereon and sealing a substrate W is mounted to the inner upper portion of the substrate holder 573. The housing 563 is designed so that its outer diameter is slightly smaller than the inner diameter of the above-described vessel 510, so that the housing 563 can almost close the opening of the vessel 510. Referring to FIG. 11B, on the other hand, the pressing member 565 includes a disc-shaped holder 591, and a substrate fixing ring 593 mounted to the peripheral lower surface of the holder 591 and having in its interior a housing portion 595. The housing portion 595 houses a spring 597 and a ring-shaped pusher 599 with a pressing portion 599a disposed under the spring 597. The pressing portion 599a of the pusher 599 protrudes from a hole provided in the lower surface of the substrate fixing ring 593.

The bearing portion 571 is fixed to a rod 578 of a cylinder mechanism 577 (see FIGS. 9 and 12A) that moves the bearing portion 571 vertically, and the cylinder mechanism 577 itself is fixed to the mounting base 579 mounting the head rotating motor 580, etc. FIG. 12A is a side view of the head (mounting base) lifting mechanism 600, and FIG. 12B is a perspective view showing the back side of the head lifting mechanism 600. As shown in FIGS. 12A, 12B and 9, the head lifting mechanism 600 has the mounting base 579 which is vertically movably mounted to support poles (fixed members) 650, 650 via a head lifting sliding portion 601 and which moves vertically by a lifting mechanism 660. In particular, the lifting mechanism 660 includes a head lifting motor 661 which is fixed to the mounting base 651 bridging the support poles 650, 650, and a head lifting ball screw 665 comprised of a ball screw nut 665a and a screw shaft 665b. A belt 670 is wound around a pulley 663 mounted to the driving shaft of the head lifting motor 661 and a pulley 667 mounted to the end of the screw shaft 665b. The whole of the mounting base 579 mounting the substrate fixing head 560, the head rotating motor 580, etc. (i.e. substrate holding device) moves vertically by the actuation of the head lifting motor 661 of the head lifting mechanism 600. The vertical movement is controlled by the head lifting motor 661, making it possible to arbitrarily set the positional relationship (distance) between the processing surface of the substrate W and the spray nozzles 520, 540. The pressing member 565, on the other hand, can move vertically independent of the housing 563, etc. by the actuation of the cylinder mechanism 577, while the housing 563 can be rotated by the head rotating motor 580.

The operation of the pretreatment unit 500 will now be described. First, the substrate fixing head 560 is set at a position above the vessel 510, as shown in FIG. 9, and the pressing member 565 is set a raised portion within the substrate fixing head 560, as shown in FIGS. 11A and 11B. A substrate W, which is held face down by the upper-positioned lower hand 239 shown in FIG. 4B or by the vacuum hand 337 or 339 shown in FIGS. 5A through 5C, is inserted from the opening 561 of the sidewall of the housing 563 into the housing 563 and the vacuum attraction is released, thereby placing the substrate W on the ring-shaped sealing member 575 having a diameter smaller by several mm than the diameter of the substrate W, as shown in FIGS. 11A and 11B. The cylinder mechanism 577 is then driven to lower the pressing member 565 so that, as shown in FIG. 13, the lower surface of the substrate fixing ring 593 and the pressing portion 599a of the pusher 599 are pressed against a peripheral region of the upper surface of the substrate W, whereby a peripheral region of the lower surface (processing surface) of the substrate W is pressed against the sealing member 575, thereby fixing the substrate W. The sealing member 575 also functions as a seal for preventing a treatment liquid from intruding into the back surface of the substrate W.

Next, the head lifting motor 661 is driven to lower the substrate fixing head 560, in which the substrate W is fixed, into the opening of the vessel 510. A first treatment liquid is sprayed from the spray nozzle 520 disposed in the vessel 510 onto the processing surface (lower surface) of the substrate W to treat the substrate W. Thereafter, the head lifting motor 661 is driven to raise the substrate fixing head 560 to above the vessel 510, and then the lid member drive mechanism 550 shown in FIG. 9 is driven to pivot the lid member 530 so that it closes the opening of the vessel 510 (see FIG. 10A). A second treatment liquid is sprayed from the spray nozzle 540 disposed on the upper surface of the lid member 530 onto the processing surface of the substrate W to treat the substrate W, thereby completing treatment of the substrate W.

Since the opening of the vessel 510 is almost closed with the substrate fixing head 560 during the treatment of the substrate W by the spray nozzle 520, the first treatment liquid after contact with the substrate W is collected in the vessel 510 and is discharged from the discharge outlet 511 shown in FIGS. 10A, 10C and 10D. Since the vessel 510 is closed with the lid member 530 during the treatment of the substrate W by the spray nozzle 340, the second treatment liquid after contact with the substrate W does not intrude into the vessel 510, but falls outside the vessel 510 and is discharged from a different discharge outlet (not shown). Mixing of the first treatment liquid and the second treatment liquid can thus be avoided.

The cylinder mechanism 577 is driven to raise the pressing member 565 to thereby release the fixing of the substrate W. The upper-positioned lower hand 239 shown in FIG. 4B, or the vacuum hand 337 or 339 shown in FIGS. 5A through 5C is inserted from the opening 561 in the sidewall of the housing 563 into the housing 563. The hand attracts by vacuum the upper surface of the substrate W, takes the substrate out of the housing 563 and transfer the substrate W to the next process step.

According to this embodiment, sealing members 575 of various sizes are used depending on the various treatments so that the processing area in the processing surface (lower surface) of a substrate W differs between the treatments. In particular, as shown in FIG. 14A, the pre-cleaning unit 240 and the second pretreatment unit [chemical cleaning (neutralization) unit] 340 use a sealing member 575a having such an opening area that a cleaning treatment can be effected in a cleaning area $S_2$ which is wider than a catalyst impartation area $S_1$ to which a catalyst is imparted by the first pretreatment unit (catalyst-imparting treatment unit) 320. As will be understood, the cleaning area $S_2$ corresponds to the region surrounded by the sealing member 575a and, as will be described below, the catalyst impartation area $S_2$ corresponds to the region surrounded by the below-described sealing member 575b (see FIG. 14B) used in the second pretreatment unit 320. The cleaning area $S_2$ is concentrically wider than the catalyst impartation area $S_1$.

Accordingly, it is possible with the pre-cleaning unit 240 to fully pre-clean (with a chemical) that area of the substrate surface to which a catalyst is to be imparted by the first pretreatment unit 320. With the second pretreatment unit 340, it is possible to fully clean (neutralize) the area to which a catalyst has been imparted by the first pretreatment unit 320.

On the other hand, the first pretreatment unit 320 uses a sealing member 575b having such an opening area that the catalyst impartation area $S_1$ is narrower than the cleaning area $S_2$ that is cleaned by the pre-cleaning unit 242 and the second pretreatment unit 340, and is the same as that area of the substrate surface in which uniform plating is to be carried out.

As will be understood, the catalyst impartation area $S_1$ corresponds to the region surrounded by the sealing member 575b and, as described above, the cleaning area $S_2$ corresponds to the region surrounded by the sealing member 575a used in the pre-cleaning unit 242 and the second pretreatment unit 340. The catalyst impartation area $S_1$ is concentrically narrower than the cleaning area $S_2$ and identical to the plating area in which uniform plating is to be carried out.

This prevents a catalyst from being imparted also to a portion of the substrate for which plating is unnecessary, thereby preventing the unnecessary portion from being plated later. Further, as described above, the pre-cleaning unit 240 can fully pre-clean (with a chemical) that area of the substrate surface to which a catalyst is to be imparted by the first pretreatment unit 320, and the second pretreatment unit 340 can fully clean (neutralize) the area to which the catalyst has been imparted by the first pretreatment unit 320. Accordingly, plating can be carried out securely in the necessary area of the substrate surface.

[Plating Unit]

FIG. 15A is a side view of a plating unit 360, and FIG. 15B is a schematic sectional side view of FIG. 15A. As shown in FIGS. 15A and 15B, the plating unit 360 comprises a processing tank (plating tank) 710 for holding a plating solution (processing liquid) Q and carrying out a dip processing of the substrate W, a lid member 740 for closing the opening 711 of the processing tank 710, a spray nozzle (treatment liquid spraying section) 760 mounted to the upper surface of the lid member 740, a drive mechanism 770 for driving (pivoting) the lid member 740, a substrate holding device 780 for holding a substrate W, and a substrate holding device drive mechanism 810 for driving the whole substrate holding device 780.

The processing tank 710 includes a vessel-shaped processing tank body 713 for holding the plating solution (processing liquid) Q, a circumferential groove 715 provided around the upper outer circumferential surface of the processing tank body 713 for recovering the plating solution Q overflowing the processing tank body 713, and a cover portion 717 surrounding the outside of the circumferential groove 715 and projecting upwardly and cylindrically. A plating solution supply inlet 721 is provided at the center of the bottom of the processing tank body 713.

Figure 16A:
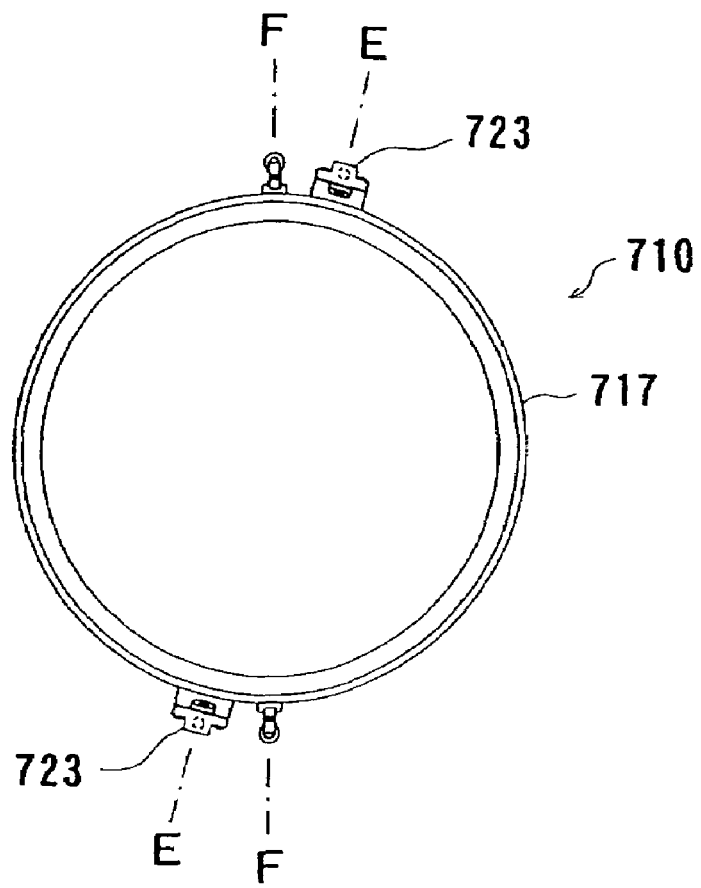
FIG. 16A is a plan view of a processing tank.
Figure 16B:
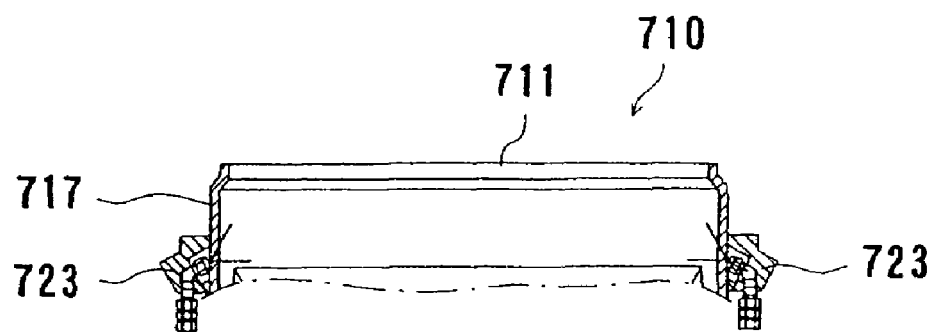
FIG. 16B is a cross-sectional view (taken along the line E-E of FIG. 15A) of the top portion of the processing tank.

FIG. 16A is a plan view of the processing tank 710, and FIG. 16B is a cross-sectional view of the top portion of the processing tank 710 (taken along the line E-E of FIG. 16A). As shown in FIGS. 16A and 16B, to the cover portion 717 of the processing tank 710 is mounted a pair of rinsing spray nozzles 723 for spraying a cleaning liquid (pure water) in a one-shot manner from the inner wall of the cover portion 717 toward the opening 711. Even when the substrate holding device 780 is raised after plating and the substrate W is separated from the plating solution Q, a small amount of plating solution remains on the processing surface of the substrate. With the plating solution remaining on the surface, plating of the surface of the substrate W will still proceed, resulting in a failure of obtaining a uniform plated film. According to the present invention, the spray nozzles 723 are provided in the processing tank 710, and a cleaning liquid is sprayed onto the surface of the substrate W immediately after plating, thereby removing the plating solution remaining on the surface of the substrate W. Further, the spraying of cleaning liquid rapidly cools the substrate W to stop progress of plating, whereby a uniform plated film can be obtained. The temperature of the plating solution is generally about 70° C. to 80° C. There is, therefore, a case where due to evaporation of the moisture in the plating solution, a proper concentration of the plating solution cannot be maintained. The loss of moisture by evaporation can be replenished with the cleaning liquid (pure water) sprayed immediately after plating. The spraying of cleaning liquid is advantageous also in this respect. The amount of cleaning liquid necessary for the replenishment may be calculated in advance to determine the amount of cleaning liquid to be sprayed.

Figure 17:
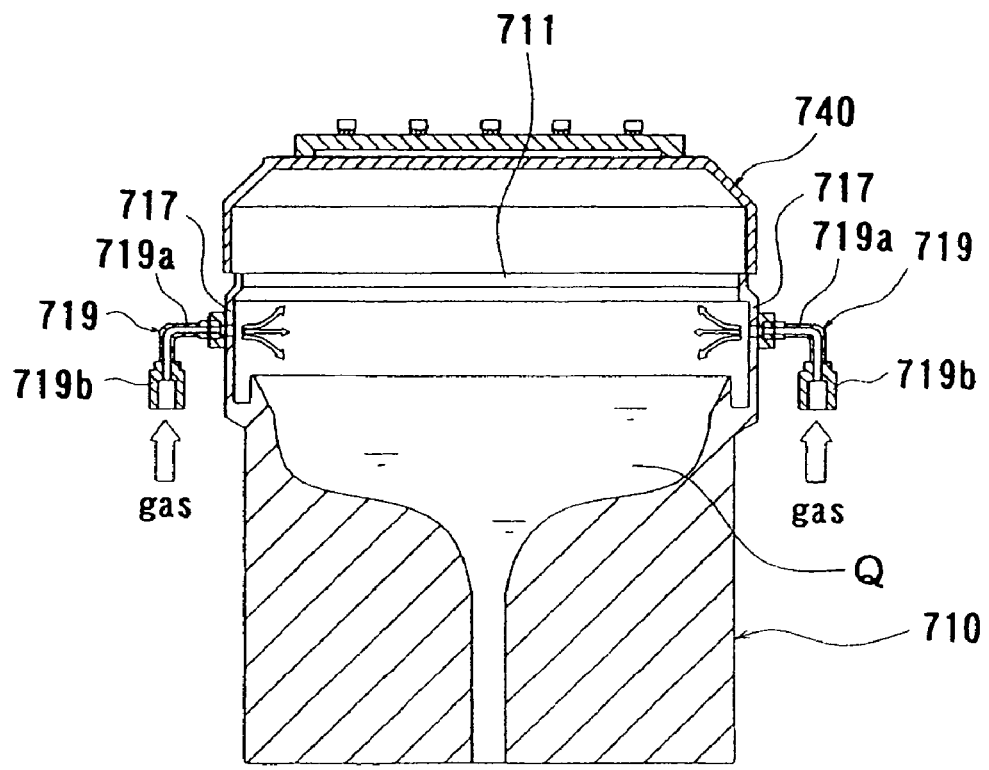
FIG. 17 is a cross-sectional view (taken along the line F-F of FIG. 16A) showing the state of the processing tank when the opening of the tank is closed with a lid member.

FIG. 17 is a cross-sectional view (taken along the line F-F of FIG. 16A) showing the state of the processing tank 710 when the opening 711 is closed with the lid member 740. The opening 711 of the processing tank 710 may be closed with the lid member 740 in a non-processing time, such as idling time, whereby unnecessary evaporation of the plating solution can be prevented. According to this embodiment, a gas injection portion 719, which is comprised of a passage 719a and a joint 719b, for injecting and supplying a gas (inert gas such as nitrogen) into the processing tank 710 is mounted to the cover portion 717 of the processing tank 710. A gas (inert gas such as nitrogen) is injected and supplied from the gas injection portion 717 into the processing tank 710 which is closed with the lid member 740 and the gas is sealed up within the processing tank 710, thereby changing the internal atmosphere from air to the gas. This avoids contact of the plating solution Q with oxygen and prevents a functional loss of the plating solution Q, making it possible to allow a substrate W to be in contact with the plating solution Q that is always in the normal condition.

Referring again to FIGS. 15A and 15B, the plating solution supply unit 390 returns the plating solution, which has overflowed into the circumferential overflow groove 715 of the processing tank 710, through a pipe to a plating solution supply tank (plating solution circulation tank) 391, and supplies the plating solution which has been collected in the plating solution supply tank 391 to the plating solution supply inlet 721 of the processing tank body 713 by a plating solution supply pump P, thereby circulating the plating solution constantly. The plating solution Q in the processing tank body 713 is thus circulating constantly, which reduces a decrease in the concentration of plating component and increases the number of processable substrates as compared to the case of simply storing the plating solution Q without circulation. Further, in order to stabilize the flow of the plating solution Q, a current plate 714 is provided within the processing tank body 713. The current plate 714 is comprised of a circular flat plate having a large number of small through-holes that permit passage therethrough of the plating solution.

The lid member 740 is comprised of a plate material of such a size as to close the opening 711 of the processing tank 710. Plate-like arms 745 are mounted to the opposite side surfaces of the lid member 740, and are rotatably supported at portions near the respective ends by bearing portions 747 provided at almost the centers of the opposite sides of the processing tank 710. The ends of the arms 745 are fixed to the ends of coupling arms 775 of the drive mechanism 770.

The spray nozzle (treatment liquid spraying section) 760 has the same construction as the spray nozzle 540 shown in FIG. 10B in the number of nozzles 763 and their arrangement. Thus, the nozzles 763 are oriented upwardly and disposed in such positions that when a substrate W held in the substrate holding device 780 is positioned above the lid member 740 closing the processing tank 710, and a cleaning liquid (treatment liquid) is sprayed from the nozzles 763 simultaneously, the cleaning liquid can be sprayed uniformly onto the entire processing surface (lower surface) of the substrate W and the spraying pressure applied to the processing surface of the substrate W can be best equalized. This enables uniform cleaning of the substrate W in the cleaning process of the substrate W.

The drive mechanism 770 comprises a lid member pivoting cylinder 771, a rod 773 coupled to the piston of the lid member pivoting cylinder 771, and the coupling rod 775 swingably coupled to the end of the rod 773. The lower end of the lid member pivoting cylinder 771 is rotatably supported by the fixed member.

FIG. 18A is a schematic sectional side view of the substrate holding device 780, and FIG. 18B is an enlarged view of the portion G of FIG. 18A. As shown in FIG. 18A, the substrate holding device 780 includes a substrate holder 781 and a substrate holder drive section 800. The substrate holder 781 comprises a downwardly-open, generally cylindrical substrate receiver 783, and a generally circular attracting head 789 housed in the substrate receiver 783. The substrate receiver 783 has at its lower end an inwardly projecting temporary retaining portion 785 for temporarily retaining a substrate W, and has substrate insertion openings 787 in the circumferential portion. The attracting head 789 is comprised of a generally circular base 791 having in its interior a vacuum supply line 793, and a ring-shaped substrate attracting portion 795 mounted to the peripheral lower surface of the base 791.

The base 791 has a plurality of air vent openings 790 (only one is shown diagrammatically) for opening the space between the substrate W attached to the substrate attracting portion 795 and the base 791. The substrate attracting portion 795 is formed of a sealing material (e.g. rubber). With the end portion protruding downwardly from the lower surface of the base 791, the substrate attracting portion 795 attracts the back surface of the substrate W in contact with the lower surface of the base 791, and also functions as a seal for preventing intrusion of the plating solution into the inside of the vacuum-attracted portion of the back surface of the substrate W.

The substrate attracting portion 795 is not limited to the shape shown in FIG. 18B, but may be of any shape insofar as it can attract a substrate with a certain attraction width. The substrate attracting portion 795 has, in the portion to be in contact with the substrate W, a substrate attracting groove (slit for attraction and release of substrate) 797. The substrate attracting groove 797 is connected to the above-described vacuum supply line 793 so that the substrate W is attracted to and released from the substrate attracting groove 797. The vacuum supply line 793 is constructed so that in addition to pulling a vacuum, it can also supply an inert gas or a cleaning liquid.

The substrate holder drive section 800, on the other hand, includes a substrate rotating motor (drive section) 801 for rotating the attracting head 789, and a substrate receiver drive cylinder 803 for vertically moving the substrate receiver 783 between predetermined positions (at least three positions). The attracting head 789 is rotated by the substrate rotating motor 801, and the substrate receiver 783 is moved vertically by the substrate receiver drive cylinder 803. Thus, the substrate head 789 only rotates and does not move vertically, while the substrate receiver 783 only moves vertically and does not rotate.

The operation of the substrate holding device 780 will now be described. First, as shown in FIG. 18A, while the attracting head 789 is not rotated, the substrate receiver 783 is moved to the lowermost position (substrate transfer position), and a substrate W, which is attracted and held by the vacuum hand 337 or 339 of the third substrate transfer robot 310 shown in FIGS. 5A through 5C, is inserted into the substrate receiver 783, and then the attraction of the vacuum hand 337 or 339 is released to thereby place the substrate W on the temporary retaining portion 785. The substrate W is held face down, i.e., the processing surface is facing downward. Thereafter, the vacuum hand 337 or 339 is withdrawn through the substrate insert opening 787.

Next, as shown in FIGS. 19A and 19B, the substrate receiver 783 is raised so as to bring the end of the substrate attracting portion 795 into pressure contact with the peripheral back surface (upper surface) of the substrate W while the substrate W is attracted by vacuuming via the substrate attracting groove 797, thereby attracting the substrate W to the substrate attracting portion 795 and holding the substrate W. The vacuum force is generated within the substrate attracting groove 797 inside the portion of the substrate attracting portion 795 in contact with the substrate W. The position of the substrate receiver 783 upon the holding of the substrate W is herein called substrate fixing position. The backside portion of the substrate W (the opposite surface to the processing surface) is shut off from the processing surface side by the sealing of the substrate holding portion 795.

Generally, in the case of holding a substrate W by utilizing vacuum attraction, a suction pad has conventionally been employed. A suction pad, the whole inside space of which becomes a vacuum upon operation, has the following problems: When attracting and holding a portion, nearest possible to the edge, of a substrate W with such a suction pad while preventing intrusion of a processing liquid, the substrate W can deform largely from the center to a peripheral portion, whereby uniform plating cannot be effected and, what is worse, the substrate W would be broken.

According to the present invention, a peripheral region of a substrate W is sealed and attracted by the ring-shaped substrate attracting portion 795 of small width (in the radial direction), thereby minimizing the attraction width and eliminating the adverse influence (such as deformation) on the substrate W. Further, since only a peripheral region of the back surface of the substrate W is in contact with the substrate attracting portion 795, there is little fear of a lowering of the chemical liquid temperature due to heat transmission through the surface of the substrate attracting portion 795 in contact with the substrate W during processing.

According to the present invention, the portion of the substrate W to be attracted to the substrate attracting portion 795 of the attracting head 789 is a peripheral portion of the back surface of the substrate W corresponding to a portion of the front surface (lower surface) in which no device is formed, specifically a peripheral region, whose width in the radial direction is within 5 mm, in the back surface (upper surface) of the substrate W. Thus, during plating, the substrate attracting portion 795 is in contact with the portion of the back surface of the substrate W corresponding to a non-device portion of the front surface. This makes it possible to minimize the influence of the attracting of the substrate W during plating which is carried out with heating.

Next, as shown in FIGS. 20A and 20B, the substrate receiver 783 is lowered slightly (e.g. several mm) to detach the substrate W from the temporary retaining portion 785. The position of the substrate receiver 783 at this moment is herein called substrate processing position. When the whole substrate holding device 780 is lowered to dip the substrate W into the plating solution Q in the processing tank 710 shown in FIGS. 15A and 15B, since only the back surface of the substrate W is attracted and held, the entire processing surface as well as the edge portion of the substrate W can be dipped in the plating solution and can be processed.

Further, since the substrate receiver 783 has been lowered and is separated from the substrate W, and only the back surface of the substrate W is attracted and held, the flow L of plating liquid Q (see FIG. 20B) is not impeded and a uniform flow of plating solution Q is created over the entire processing surface of the substrate W when the substrate is dipped in the plating solution Q. With the flow of plating solution Q, gas bubbles caught on the processing surface of the substrate W and gas bubbles generated during plating can be discharged from the processing surface of the substrate W to another portion in the processing tank 710.

Thus, a non-uniform flow of plating solution that may adversely affect plating can be prevented and the influence of gas bubbles can be eliminated, thereby enabling uniform plating to be carried out over the entire processing surface, including the edge, of the substrate W. Further, since the inside of the ring-shaped vacuum-attracted portion of the back surface of the substrate W is shut off from the processing surface side by the sealing of the substrate attracting portion 795, the processing liquid can be prevented from intruding into the inside of the substrate attracting portion 795 on the back surface of the substrate W.

According to the present invention, with the provision of the openings 790 in the base 791 of the attracting head 789, the space defined by the base 791, the substrate attracting portion 795 and the substrate W is not hermetically closed, and therefore the expansion of air by heat in the space is prevented, whereby the adverse effects of the air expansion on the substrate W (such as deformation) can be avoided and uniform plating can be effected. Further, because of the openings 790, the attracting head 789 can be lightened. Moreover, it becomes possible to rotate the substrate W at a high speed (e.g. 1000 rpm) by the substrate rotating motor (drive section) 801 only with attraction of the substrate by the substrate attracting portion 795. Rotating the substrate W at a high speed can effectively scatter the processing liquid and cleaning liquid remaining on the surface of the substrate W after plating, eliminating wasteful discharge of the processing liquid, cleaning liquid, etc. to be used.

After completion of the processing of the substrate W, the substrate receiver 783 is raised to the substrate fixing position shown in FIGS. 19A and 19B to place the substrate W on the temporary retaining portion 785, and a gas (inert gas, e.g. nitrogen gas) is emitted from the substrate attracting groove 797 to separate the substrate W from the substrate attracting portion 795. At the same time, the substrate receiver 783 is lowered to the substrate transfer position shown in FIGS. 18A and 18B, and the vacuum hand 337 or 339 (see FIGS. 5A through 5C) of the third substrate transfer robot is inserted from the substrate insert opening 787, and the substrate W is taken out.

According to the present invention, as described above, an inert gas or a cleaning liquid, besides vacuum, is supplied to the vacuum supply line 793. In addition, a cleaning spray nozzle 805 is disposed in the vicinity of the outer side of the substrate attracting portion 795 (in the vicinity of the outer circumferential surface of the attracting head 789). According to necessity, the outer side of the end of the substrate attracting portion 795 and the outer circumferential surface of the attracting head 789 are cleaned by the cleaning spray nozzle 805 while an inert gas or a cleaning liquid is supplied from the vacuum supply line 793 to the substrate attracting groove 797, thereby cleaning the interior of the vacuum supply line 793 and the substrate attracting groove 797.

This is for the following reasons. At such portions that are in contact with the plating solution, the plating component crystallizes and precipitates after an elapse of time. When the plating component precipitates on the substrate attracting portion 795, especially on the portion to be in contact with a substrate W, sufficient attraction of the substrate W becomes difficult and the precipitate adheres to the substrate W, thus adversely affecting processing of the substrate.

In view of this, according to the present invention, besides cleaning of the lower surface of the substrate attracting portion 795 by the spray nozzle 760 mounted to the upper surface of the lid member 740 closing the opening 711 of the processing tank 710, the outer circumferential surface of the substrate attracting portion 795 can also be cleaned by the cleaning spray nozzle 805. Further, besides vacuum for substrate attraction, an inert gas, a cleaning liquid (e.g. pure water), etc. can also be supplied into the vacuum supply line 793 and the substrate attracting groove 797 which together attract a substrate W, enabling cleaning of the whole interior thereof.

Figure 21:
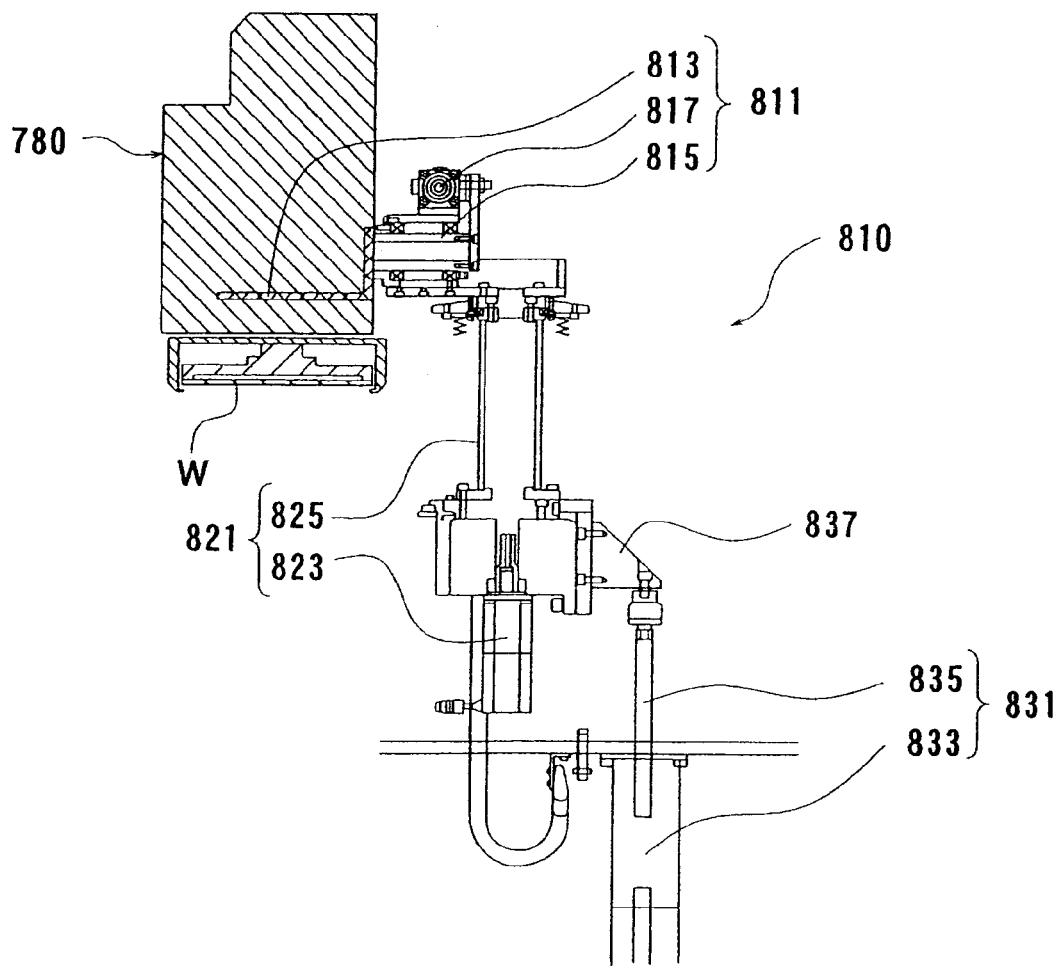
FIG. 21 is a schematic side view of the internal structure of a substrate holding device drive mechanism.

FIG. 21 is a schematic side view of the internal structure of the substrate holding device drive mechanism 810. As shown in FIG. 21, the substrate holding device drive mechanism 810 includes a tilting mechanism 811 for swinging and tilting the whole substrate holding device 780, a pivoting mechanism 821 for pivoting the whole of the substrate holding device 780 and the tilting mechanism 821, and a lifting mechanism 831 for raising and lowering the whole of the substrate holding device 780, the tilting mechanism 811 and the pivoting mechanism 821. FIG. 22A is a schematic side view showing the tilting mechanism 811 (the substrate holding device 780 is also shown), and FIG. 22B is a right side view of FIG. 22A (the substrate holding device 780 is not shown).

As shown in FIGS. 22A and 22B, the tilting mechanism 811 includes a bracket 813 fixed to the substrate holding device 780, a tilting shaft 815 fixed to the bracket 813 and rotatably supported by a tilting shaft bearing 814, a head tilting cylinder 817, and a link plate 819 pivotably mounted at one end to a side portion of the drive shaft 818 of the head tilting cylinder 817 and fixed at the other end to the tilting shaft 815. When the head tilting cylinder 817 is driven to move the drive shaft 818 in the direction of arrow H shown in FIG. 22B, the tilting shaft 815 rotates through a predetermined angle via the link plate 819 whereby the substrate holding device 780 swings. Thus, a substrate W held in the substrate holding device 780 can be shifted between the horizontal position and a tilted position tilted at a predetermined angle relative to the horizontal position.

The tilt angle of the substrate holding device 780 can be adjusted arbitrarily by a mechanical stopper. On the other hand, as shown in FIG. 21, the pivoting mechanism 821 includes a head pivoting servomotor 823 and a pivot shaft 825 which is rotated by the head pivoting servomotor 823. The tilting mechanism 811 is fixed to the upper end of the pivot shaft 825. The lifting mechanism 831 includes a head lifting cylinder 833, and a rod 835 which is raised and lowered by the lifting cylinder 833. The pivoting mechanism 821 is fixed to a stay 837 mounted to the end of the rod 835.

The overall operation of the plating unit 360 will now be described. FIGS. 15A and 15B show the state of the plating unit 360 when the lid member 740 has been pivoted to open the opening 711 of the processing tank 710, and the substrate holding device 780 is in a raised position. Thus, the lid member 740 has been moved to the retreat position beside the processing tank 710. At this moment, the plating solution supply unit 390 has been driven, and the plating solution Q is circulating between the processing tank 710 and the plating solution supply tank (plating solution circulation tank) 391 while it is kept at a predetermined temperature.

Figures 23A, 23B:
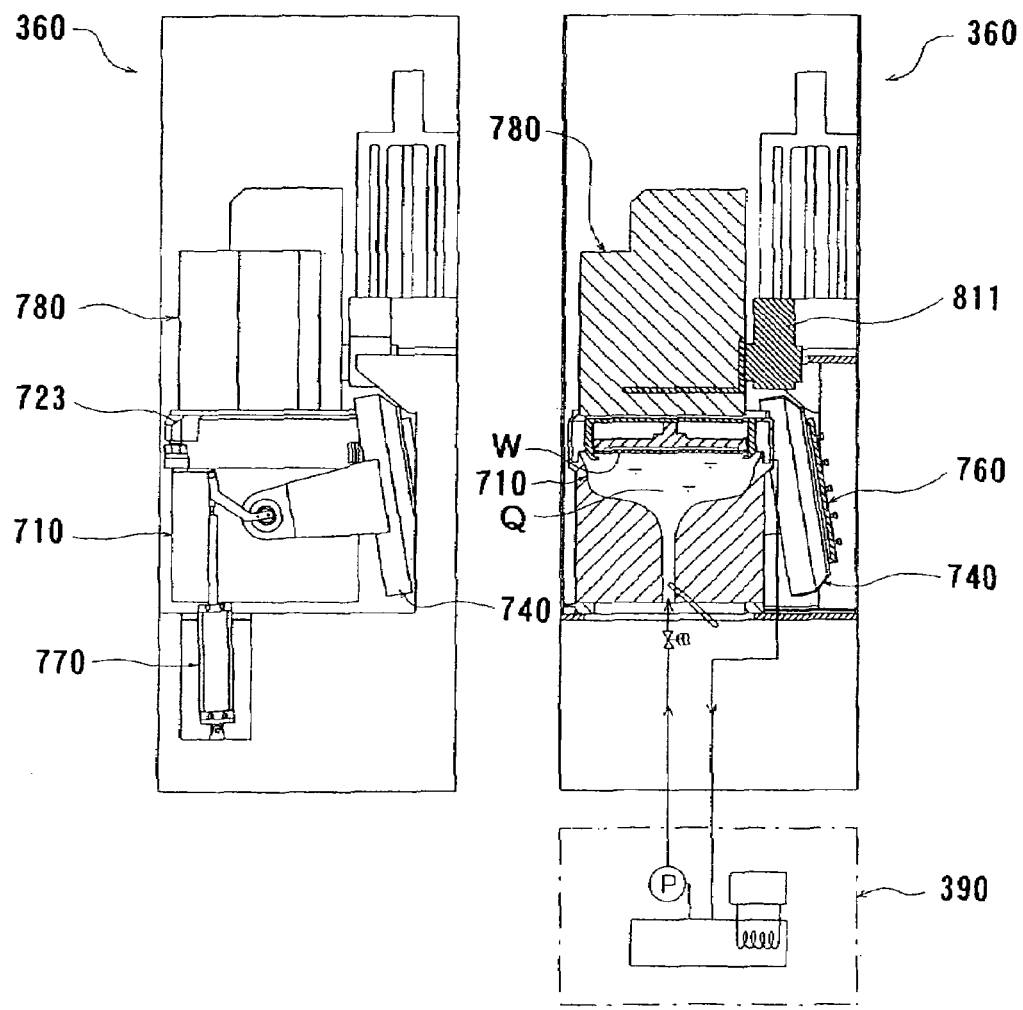
FIG. 23A is a diagram illustrating the operation of the plating unit.
FIG. 23B is a cross-sectional view of FIG. 23A.

First, an unprocessed substrate W is attracted and held by the attracting head 789 in the manner shown in FIGS. 18A through 20B. Next, the whole substrate holding device 780 is swung by the tilting mechanism 811 to tilt the substrate W at a predetermined angle from the horizontal position, and the lifting mechanism (see FIG. 21) is then driven to lower the substrate holding device 780 to the position shown in FIGS. 23A and 23B, thereby dipping the substrate W into the plating solution Q. After dipping the substrate W into the plating solution Q, the whole substrate holding device 780 is swung to return the substrate W to the horizontal position by the tilting mechanism 811, and electroless plating of the substrate W is carried out. During the plating, the substrate W is kept rotating by the actuation of the substrate rotating motor 801 shown in FIG. 20.

According to the plating unit 360, the substrate W is tilted at a predetermined angle relative to the horizontal position when it is dipped in the plating solution Q, which prevents gas bubbles such as air bubbles from being caught and staying on the processing surface of the substrate W. If the substrate W in the horizontal position is dipped in the plating solution Q, gas bubbles such as air bubbles stay between the substrate W and the plating solution Q, whereby uniform plating cannot be effected. According to the plating unit 360, therefore, the substrate W is tilted when dipping it in the plating solution Q, thereby preventing gas bubbles from being caught and staying on the processing surface to enable uniform plating.

Figure 24A:
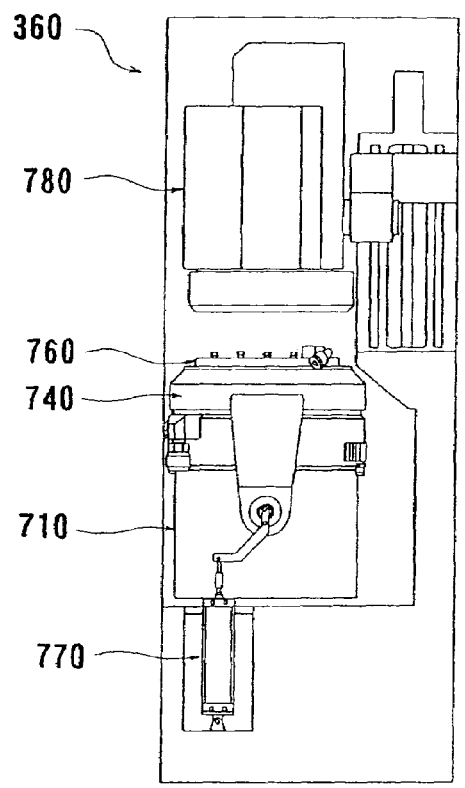
FIG. 24A is a diagram illustrating the operation of the plating unit.
Figure 24B:
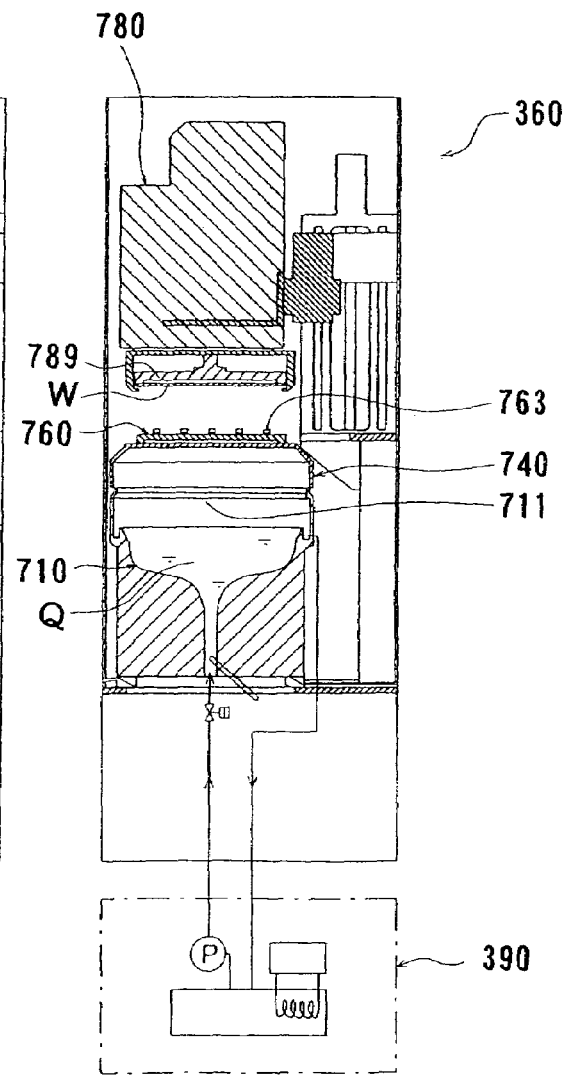
FIG. 24B is a cross-sectional view of FIG. 24A.

After carrying out electroless plating of the processing surface (lower surface) of the substrate W for a predetermined time, described above, the lifting mechanism 831 (see FIG. 21) is driven to raise the substrate holding device 780 to the position shown in FIGS. 15A and 15B. During the rise of the substrate W, a cleaning liquid (pure water) is sprayed in a one-shot manner from the rinsing nozzle 723 provided in the processing tank 710 toward the processing surface of the rising substrate W to cool the substrate W, thereby stopping the progress of electroless plating. Next, the drive mechanism 770 is driven to pivot the lid member 740 so as to close the opening 711 with the lid member 740, as shown in FIG. 24.

Next, a cleaning liquid (pure water) is sprayed right upwardly from the nozzles 763 of the spray nozzle 760 on the lid member 740 onto the processing surface of the substrate W to clean the processing surface. At this time, since the opening 711 of the processing tank 710 is closed with the lid member 740, the cleaning liquid does not enter the processing tank 710, that is, the plating solution Q in the processing tank 710 is not diluted, enabling use of the plating solution Q during circulating. The cleaning liquid after the cleaning of the substrate W is discharged from a not-shown discharge outlet. The substrate W after the cleaning is taken out of the substrate holding device 780 by the vacuum hand 337 or 339 (see FIGS. 5A through 5C) of the third substrate transfer robot 310 in the above-described manner, while another unprocessed substrate W is set in the substrate holding device 780, which is subjected to the above-described plating and cleaning steps.

Though in the above-described plating unit 360 electroless plating is carried out with the plating solution Q held in the processing tank 710, it is also possible to carry out electroplating of a processing surface of a substrate W by providing an anode within the processing tank 710 and connecting a cathode electrode to the substrate W.

[Cleaning Unit]

Figure 25:
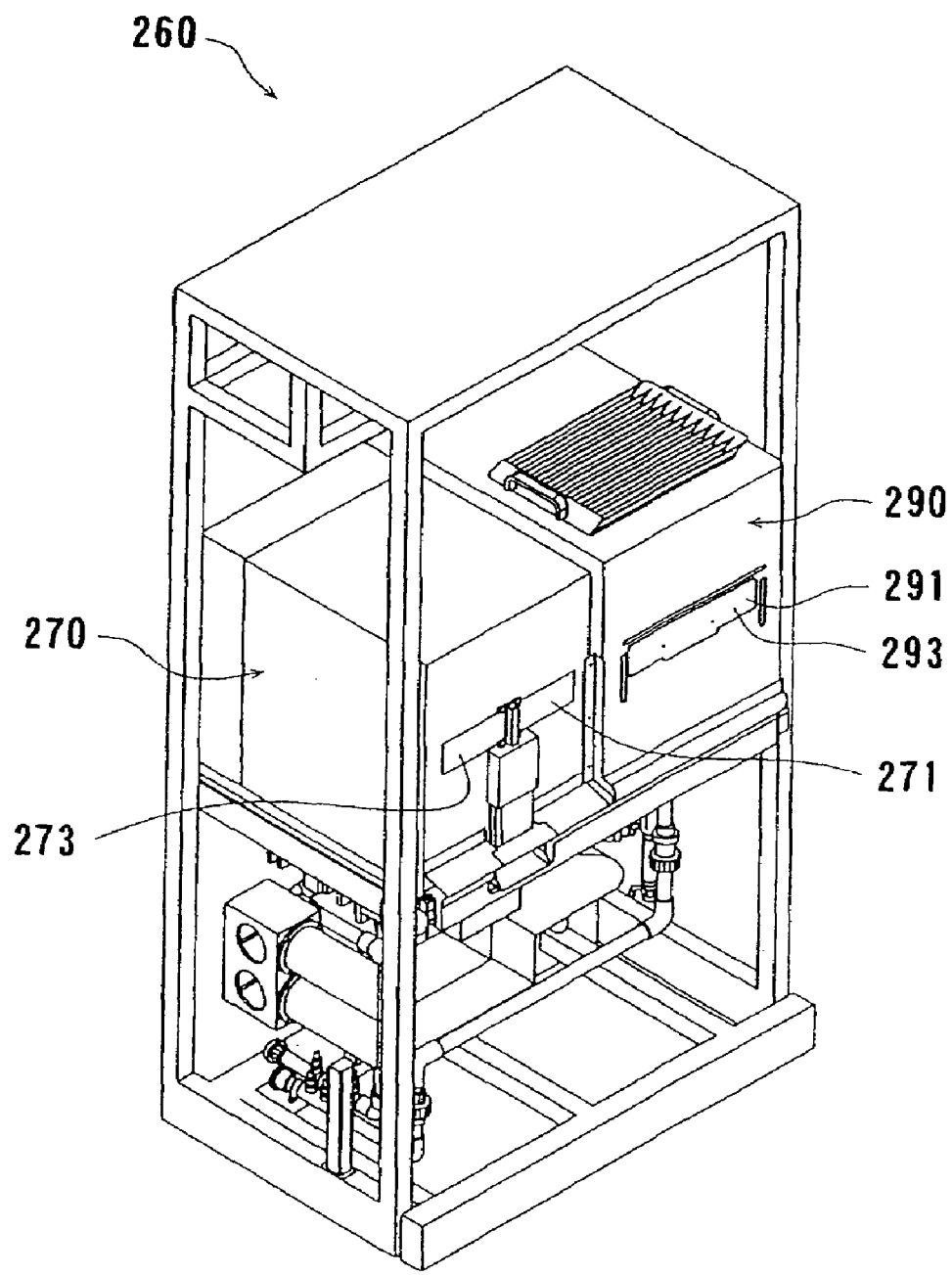
FIG. 25 is an external view of a post-cleaning unit.

FIG. 25 is an external view of the post-cleaning unit 260. The post-cleaning unit 260 comprises the first cleaning section 270 and the second cleaning/drying section 290 which together constitute one unit. The first cleaning section 270 and the second cleaning section 290 are respectively provided with substrate insertion windows 271, 291 which are openable and closable by shutters 271, 293.

Figure 26:
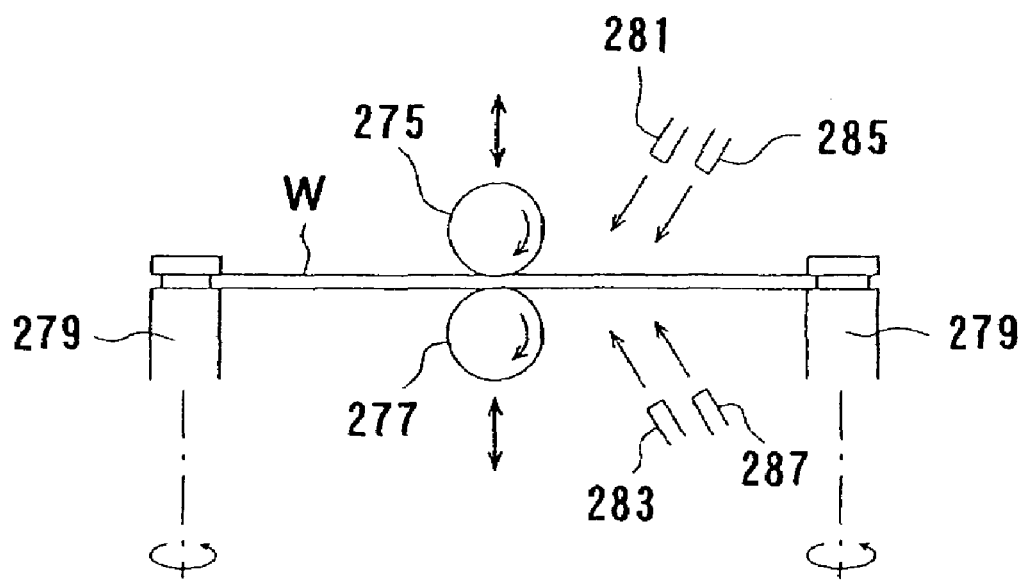
FIG. 26 is a schematic diagram illustrating a cleaning device of a first cleaning section.

The first cleaning section 270 is a cleaning device comprised of a roll brush unit. FIG. 26 is a schematic diagram illustrating the basic structure of the cleaning device using a roll brush. The first cleaning section 270 grips a peripheral portion of s substrate W by a plurality of rollers 279, and rotates the substrate W by rotationally driving the rollers 279. On the other hand, roll-shaped brushes (e.g. roll sponges) 275, 277 are disposed above and below the substrate W, and the roll-shaped brushes 275, 277 can move vertically away from and close to each other by a not-shown drive mechanism. While rotating the substrate W griped by the rollers 279, treatment liquids are supplied, according to necessity, from chemical liquid nozzles 281, 283 and pure water nozzles 285, 287 disposed above and below the substrate W. During the supply of treatment liquids, the roll-shaped brushes 275, 277 are moved close to each other by the drive mechanism so that they nip the substrate W, thereby cleaning the substrate W while nipping it between the roll-shaped brushes 275, 277 at an appropriate pressure. The cleaning effect can be enhanced by rotating the roll-shaped brushes 275, 277 independently.

Figure 27:
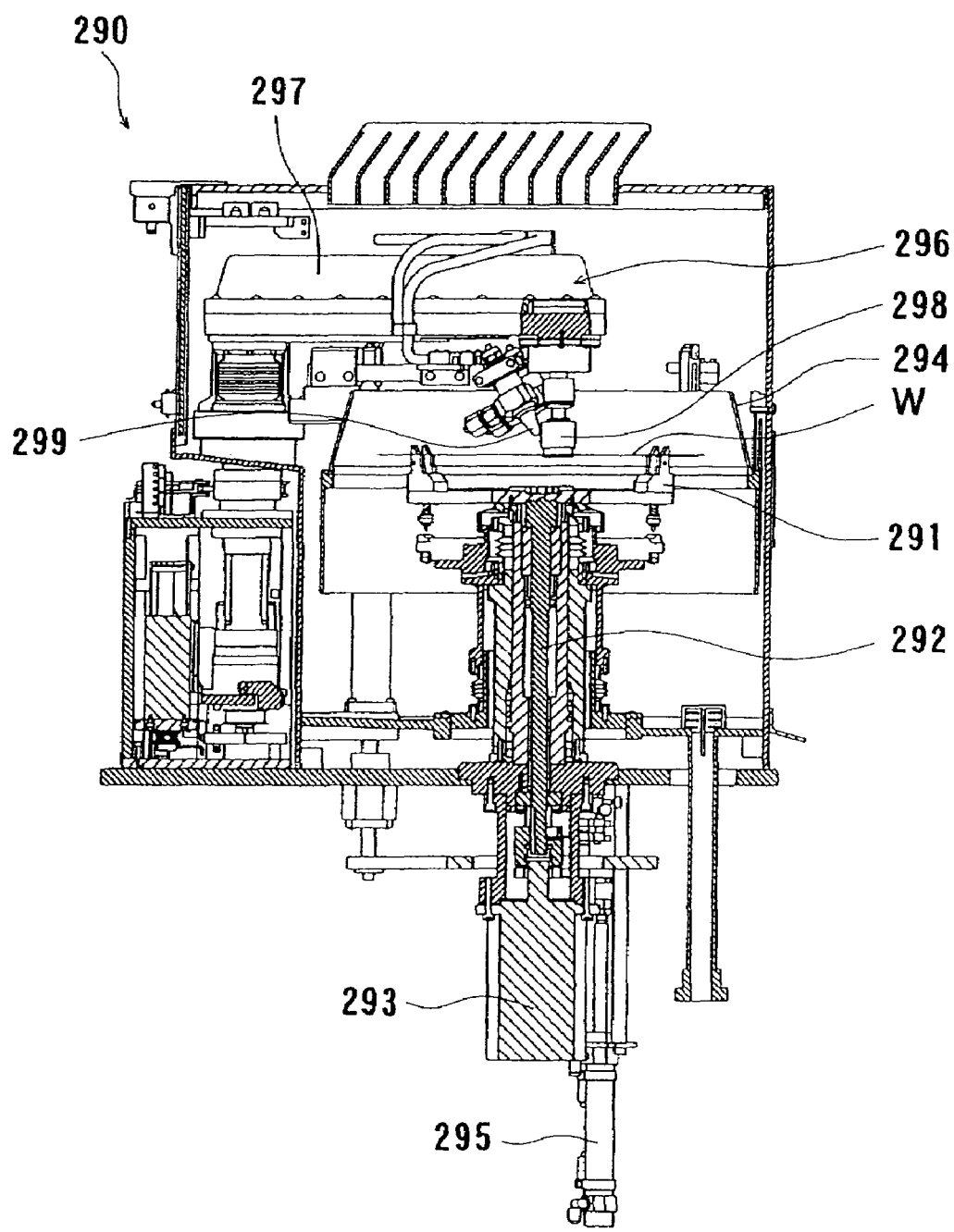
FIG. 27 is a sectional side view of a second cleaning/drying section.

FIG. 27 is a sectional side view of the second cleaning/drying section 290. As shown in FIG. 27, the second cleaning/drying section 290 is a cleaning device comprised of a spin-drying unit, and includes a clamp mechanism 291 for clamping a peripheral portion of a substrate W, a spindle 292 fixed to the clamp mechanism 291, a spindle driving motor 293 for rotationally driving the spindle 292, a cleaning cup 294 for encircling the clamp mechanism 291 and preventing a treatment liquid from scattering, a cleaning cup lifting cylinder 295 for moving the cleaning cup 294 between a position at which it encircles the clamp mechanism 291 and a lower position, and a pencil cleaning unit 296 disposed above the substrate W. The pencil cleaning unit 296 is comprised of an arm 297 and a cleaning sponge (cleaning point) 298 projecting downwardly from the end of the arm 297. The cleaning sponge 298 can be rotationally driven, and the arm 97 and the cleaning sponge 298 are vertically movable and pivotable horizontally in the plane of the substrate W.

While rotating the substrate W, held by the clamp mechanism 291, by the spindle driving motor 293 and supplying a chemical liquid or pure water to the front and back surfaces of the substrate W, the rotating cleaning sponge 298 is allowed to be in contact with the substrate W to carry out cleaning. After completion of chemical cleaning with a chemical liquid and pure water cleaning with pure water, the clamp mechanism 291 is rotated at a high speed to fully dry the substrate W. The second cleaning/drying section 290 is provided, in the vicinity of the end of the arm 297, with a Megajet nozzle 299 in which ultrasonic waves from an ultrasonic oscillator are transmitted to pure water passing through a special nozzle to enhance the cleaning effect. Pure water jetted from the Megajet nozzle 299 is supplied to the cleaning sponge 298. It is also possible to provide the second cleaning/drying section 290 with a cavijet function utilizing cavitation.

[Plating Solution Supply Unit]

Figure 28:
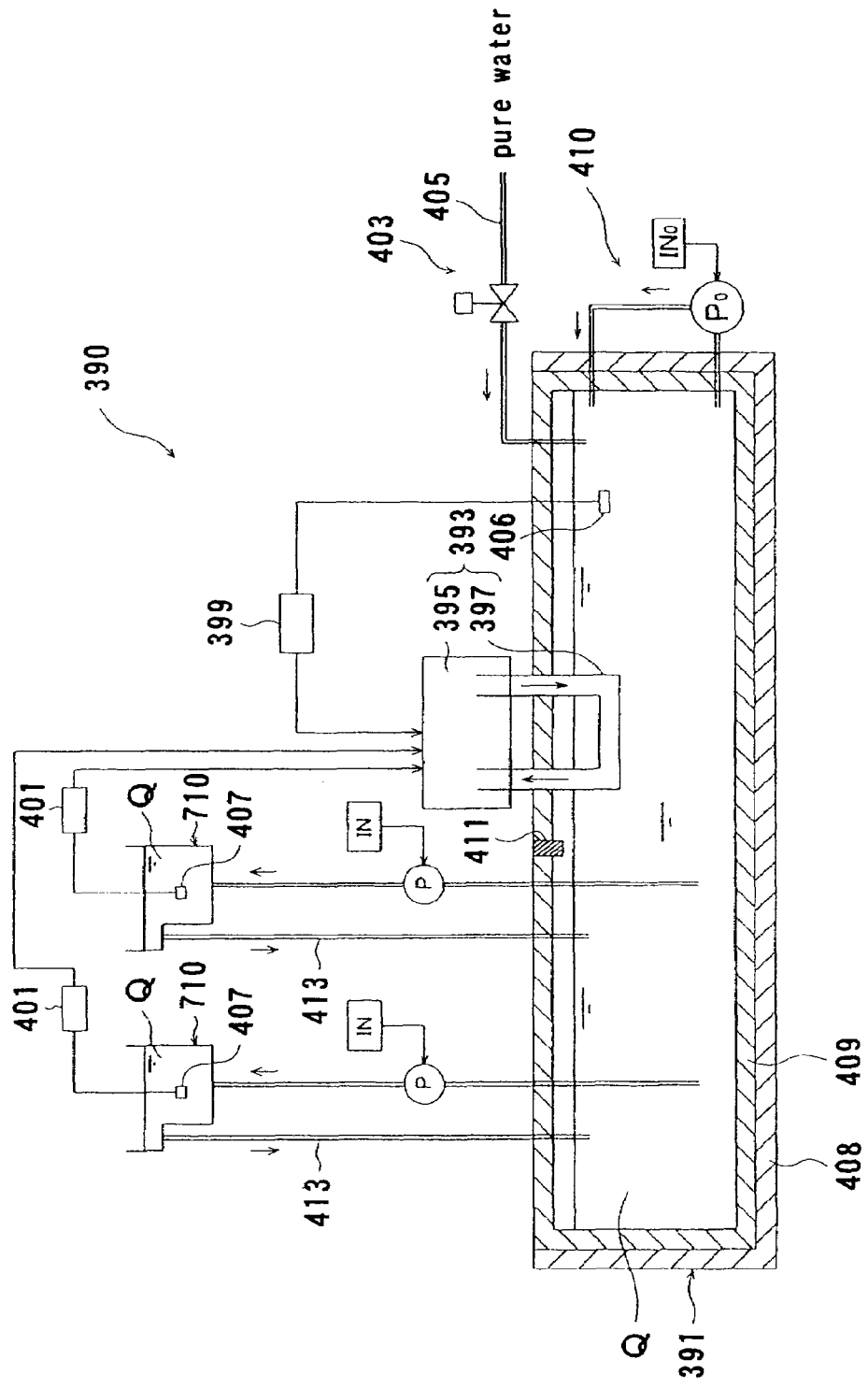
FIG. 28 is a diagram illustrating the system construction of a plating solution supply unit.

FIG. 28 is a diagram illustrating the system construction of the plating solution supply unit (plating solution supply device) 390. As shown in FIG. 28, the plating solution supply unit 390 includes a plating solution supply tank (plating solution circulation tank) 391 for storing a plating solution Q, supplying the plating solution Q to the processing tank 710 of each plating unit 360 and circulating the plating solution Q, a heating section 393, a plating solution supply pump P for supplying the plating solution Q to each processing tank 710 and circulating the plating solution Q, a plating solution concentration diluting device 403 for adjusting the concentration of the plating solution Q in the plating solution supply tank 391, and a plating solution stirring device 410.

The heating section 393 includes a heater 395 and a heat exchanger 393 comprising a bundle of a plurality of tubes. The heating section 393 uses water as a heat medium and operates as follows: Water is heated by the heater 399, and the heated water is circulated through the heat exchanger 397 inserted in the plating solution supply tank 391. The plating solution Q in the plating solution supply tank 391 is heated in an indirect manner through heat exchange between the heated water and the plating solution Q, thereby controlling the temperature of the plating solution Q. The heating section 393 is thus an indirect heating section which employs an indirect heating method using the heat exchanger 393 disposed in the plating solution Q.

In view of the very delicate nature of the plating solution Q, the heat transfer area of the heat exchanger 397 is made as large as possible and the temperature difference between the plating solution Q and the heat exchanger 397 is made small, thereby minimizing the adverse influence of the heat exchanger 397 on the life of the plating solution Q. By effecting temperature control of the plating solution Q by the heat source whose temperature is lower than the boiling point of the plating solution Q, the heat source can be prevented from adversely affecting the components of the plating solution Q. Further, in order to prevent shortening of the life of plating solution Q, a proper clearance is provided between the tubes of the heat exchanger 397. If the tubes are in contact with one another, heat spots will be produced in the contact portions. The plating solution Q can be heated excessively around the heating spots than the other area, whereby the life of plating solution Q could be shortened. Further, compared to an in-line heating method, the above indirect heating method has the advantage that impurities can be prevented from being mixed into the very delicate plating solution Q.

For the rationalization of substrate processing and the mass production, the substrate processing apparatus 1 of this embodiment are provided with the plurality of plating units 360, as shown in FIG. 2, thereby increasing the throughput. On the other hand, only one plating solution supply tank 391 is provided, and the plating solution Q is supplied in a circulative manner from the plating solution supply tank 391 to the respective processing tanks 710 of the plurality of plating units 360 by using separate plating solution supply pumps P. Accordingly, should one of the plating solution supply pumps P be stopped due to failure, plating can be carried out with a plating unit 360 connected to another operable plating solution supply pump P. Alternatively, should one of the plating units 360 be stopped due to failure, the plating solution can be supplied to another operable plating unit 360, whereby the stop of plating processing itself can be avoided.

The plating solution supply pump P may be, for example, a vertical centrifugal pump. The use of a vertical centrifugal pump, as compared to the use of a magnet pump or a bellows pump, can minimize cavitation. In addition, because of less action of stirring air and liquid, an excessive dissolution of air into the plating solution can be prevented, whereby the amount of dissolved oxygen can be controlled within an appropriate range.

Temperature control of the plating solution Q is also an important factor in a plating process. According to the plating solution supply unit 390, the plating solution supply tank (plating solution circulation tank) 391 and the processing tank 710 are respectively provided with thermometers 406, 407 for measuring the temperatures of the respective plating solutions Q in the tanks. The outputs of the thermometers 406, 407 are input into temperature controllers 399, 401, and the outputs of the temperature controllers 399, 401 are input into the heating section 393 to control the heating section 393, thereby controlling the temperature of the plating solution Q in the plating solution supply tank 391 and the temperature of the plating solution Q in the processing tank 710 respectively at a predetermined temperature. Further, an inverter IN of the plating solution supply pump P is controlled to adjust the amount of the plating solution Q flowing into the processing tank 710, thereby adjusting the temperature of the plating solution Q in the processing tank 710 to a predetermined temperature.

Thus, the plating solution supply pump P can control the circulation amount of plating solution Q with the inverter IN or the like. During plating in the plating unit 360, the plating solution Q is circulated at a low flow rate, for example, lower than 2 l/min. Upon cleaning of a substrate W after plating, pure water, etc. is sprayed while the opening 711 of the processing tank 710 is closed with the lid member 740, whereby the temperature of the plating solution Q in the processing tank 710 is likely to lower. In order to maintain the temperature of the plating solution Q so that plating of a next substrate can be carried out at the same plating temperature after cleaning, the circulation amount of plating solution is controlled, for example, in the range of 2-30 l/min, thereby effecting temperature control of the plating solution Q in the processing tank 710. By properly controlling the flow rate of plating solution Q according to the situation, a change in temperature of the plating solution can be made small and the temperature control response of the plating solution Q to the heating section 393 can be increased, leading to improved evenness of the temperature of plating solution Q over the entire circulation circuit.

As shown in FIG. 15B, the thermometer 407 is provided at the plating solution supply inlet 721 of the processing tank body 713. With the provision in the processing tank 710 of the thermometer 407 for measurement of the temperature of the plating solution Q in the processing tank 710, by controlling the temperature of the plating solution Q in the plating solution supply tank 391 and controlling the circulation amount of plating solution Q by the plating solution supply pump P, the temperature of the plating solution Q at the point of use can be maintained stably.

As shown in FIG. 28, the plating solution supply tank 391 according to the present invention has a double structure of an outer tank 408 and an inner tank 409. The outer tank 408 is formed of a heat insulating material, preferably a high-strength insulating material having excellent heat insulating properties, for example, a laminated plate of a glass cloth having excellent insulating properties and a special resin. The inner tank 409 is formed of a material that can hold the plating solution Q stably, for example, a fluororesin. Thus, the plating solution supply tank 391 has a double or multiple structure to ensure separation from the air so as to best keep the temperature of the plating solution Q constant. Because of the double or multiple structure, the safety of the plating solution supply tank 391 against breakage, etc. is also enhanced.

The plating solution concentration diluting device 403 measures the volume of the plating solution Q in the plating solution supply tank 391 by a liquid level sensor 411 to thereby determine the amount of a diluting liquid (pure water) necessary for dilution, and supply the diluting liquid through a diluting liquid supply line 405 into the plating solution supply tank 391, thereby adjusting the concentration of the plating solution Q to a proper concentration. The temperature of the plating solution upon plating (e.g. electroless plating) is as high as 70° C.-80° C., for example. Because of constant evaporation of the moisture of the plating solution due to high temperature, the concentration can vary during processing of a substrate W, resulting in processing variation for every substrate W. Accordingly, it is necessary to replenish the plating solution with a shortage of water. The shortage of water is as follows: The amount of pure water sprayed from the spray nozzle 723 onto the processing surface of the substrate after plating is subtracted from the amount of water evaporated, and the resulting amount is the shortage of water. The shortage of water is supplied to the plating solution supply tank 391 by the plating solution concentration diluting device 403. The plating solution stirring device 41 stirs the plating solution Q in the plating solution supply tank 391 by a pump Po which is rotationally driven by an inverter INo, thereby uniformizing the temperature and the concentration of the plating solution Q.

In plating processing of a substrate, removal of gas bubbles on the surface of the substrate during plating is essential for stably obtaining the intended plated film. On the other hand, control of the dissolved oxygen in the plating solution within a proper range is also important in plating processing. According to this embodiment, a gas bubble dissolution preventing section is provided in the circulation route: from the plating solution supply tank 391 to the processing tank 710, and from the processing tank 710 to the plating solution supply tank 391. Thus, the end portion on the plating solution supply tank 391 side of the pipe 413, for example, which pipe 413 introduces the plating solution which has overflowed into the circumferential groove 715 of the processing tank 710 into the plating solution supply tank 391, has a gentle slope as shown in FIG. 29C. In addition, the current speed in the pipe is made not higher than 0.3 m/sec. Accordingly, dissolution of gas bubbles in the plating solution Q in the plating solution supply tank 391, due to the shock upon flowing of the plating solution in the pipe into the plating solution Q, can be prevented.

It is also possible to provide an air vent opening 415 at a certain location in the pipe 413, as shown in FIG. 29B, to release gas bubbles, flowing with the plating solution in the pipe 413, from the opening 415. Further, as shown in FIG. 29A, a plurality of vertical air vent slits 417 may be provided at the end of the pipe 413, thereby releasing gas bubbles, flowing with the plating solution in the pipe 413, from the slits 417.

FIG. 30A is a front view showing a sample port 420 provided in a liquid supply line 421 for a liquid that is supplied to and used in at least one of the pre-cleaning unit 240, the first pretreatment unit 320, the second pretreatment unit 340 and the plating unit 360, and FIG. 30B is a perspective view of the sample port 420. As shown in FIGS. 30A and 30B, the sample port 420 is provided with a value 423 which is mounted to the liquid supply line 421 (specifically at least one of supply line for the cleaning liquid of the pre-cleaning unit 240, supply line for the cleaning liquid of the first pretreatment unit 320, supply line of the treatment liquid of the second pretreatment unit 340 and supply line of the plating solution of the plating unit 360). By operating the valve 423, a certain amount of the liquid flowing in the liquid supply line 421 is taken in a sampling bottle 425 to analyze the components of the liquid, etc. By calculating the amount of the sample (for example, amount of liquid in the respective units 240, 320, 340, 360– amount of sample=amount of replenishment), the liquid in an amount corresponding to the amount of the sample is replenished by liquid replenishing means provided in the respective units 240, 320, 340, 360.

Figure 31B:
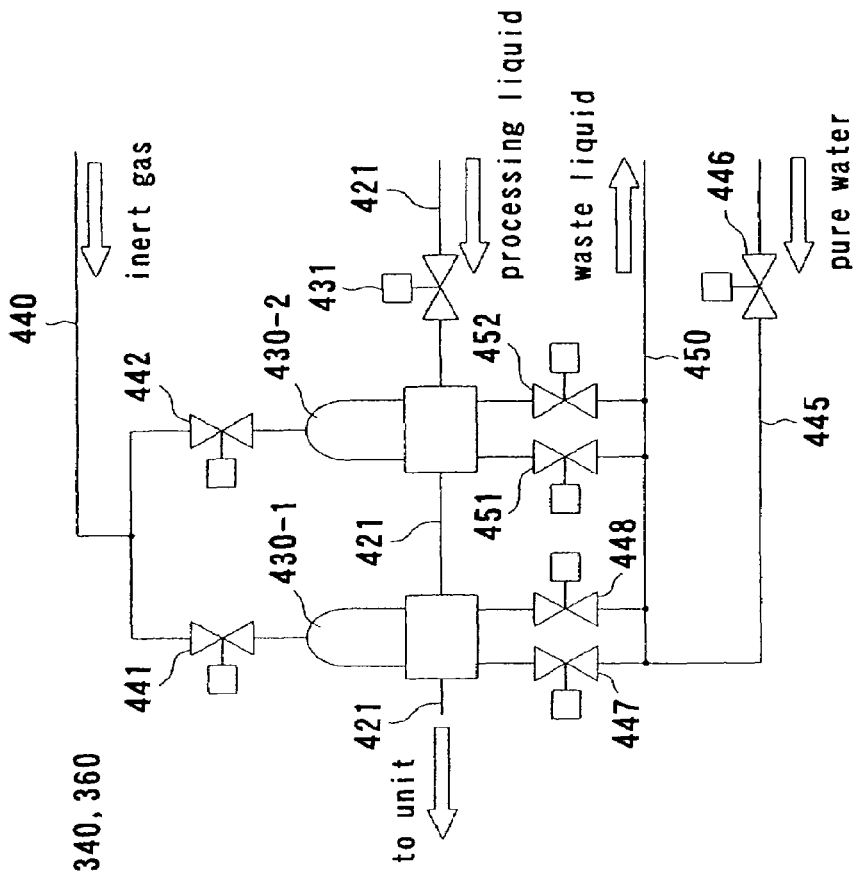
FIG. 31B is a piping diagram showing the filters.
Figure 31A:
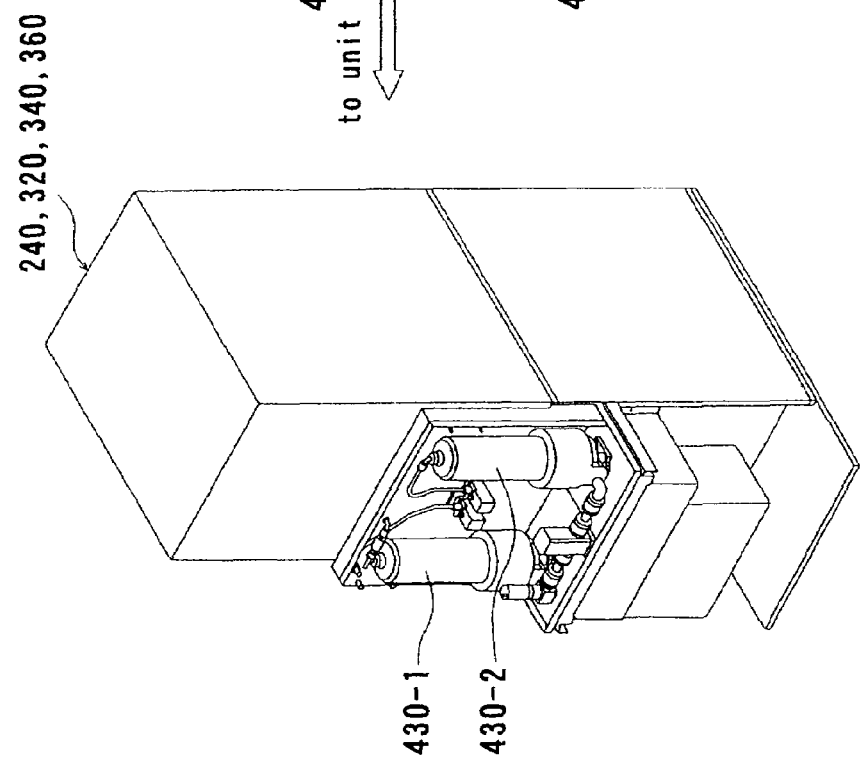
FIG. 31A is a perspective view showing filters.

FIG. 31A is a perspective view showing filters 430-1, 430-2 provided in a liquid supply line 421 for a liquid that is supplied to and used in at least one of the pre-cleaning unit 240, the first pretreatment unit 320, the second pretreatment unit 340 and the plating unit 360, and FIG. 31B is a piping diagram. As shown in FIGS. 31A and 31B, the two filters 430-1, 430-2 are disposed in parallel outside the respective units 240, 320, 340, 360. The two filters 430-1, 430-2 and a valve 431 are connected in series to the liquid supply line 421 (specifically, at least one of supply line for the cleaning liquid of the pre-cleaning unit 240, supply line for the cleaning liquid of the first pretreatment unit 320, supply line for the treatment liquid of the second pretreatment unit 340 and supply line for the plating solution of the plating unit 360), which an inert gas supply line 440, a pure water supply line 445 and a waste liquid discharge line 450 are connected in parallel to the two filters 430-1, 430-2.

Valves 441, 442, 446, 447, 448, 451, 452 are mounted in the lines 440, 445, 450, respectively. By connecting the plurality of filters 430-1, 430-2 in series to the liquid supply line 421, filtering of the liquid can be effected securely. In the case of an electroless plating apparatus, secure filtering of the liquid is important, for example, for preventing short circuit between interconnects. In this connection, it is preferred that the filter disposed nearer to the point of use of the liquid (filter 430-1 in the case of FIG. 31) have a higher filtering precision. At least, the filters 430-1, 430-2 are of the same filtering precision. The filters 430-1, 430-2 can be flushed by using the pure water supply line 445 and the waste liquid discharge line 450, and can be purged with an inert gas by using the inert gas supply line 440, preventing outflow of the chemical liquid from the filters 430-1, 430-2 at the time of maintenance to ensure the safety of the maintenance operation. It is, of course, more desirable to use three or more filters.

According to the pretreatment unit 500 shown in FIG. 9, the substrate fixing head 560 is disposed above the vessel 510 provided with the spray nozzle 520, and treatment of the lower surface of the substrate W held in the substrate fixing head 560 is carried out by spraying a treatment liquid (first treatment liquid) from the nozzles 523. Depending upon the pretreatment, instead of vessel 510 provided with the spray nozzle 520, it is possible to provide the processing tank 710 shown in FIG. 15, holding a treatment liquid in it: Especially for the first pretreatment unit 320 which carries out a catalyst-imparting treatment, the processing tank 710, which can dip a substrate W in a treatment liquid, is preferably used in order to impart a catalyst uniformly and securely to the substrate W.

In order to carry out a pretreatment stably, as with the case of plating, it is essential to remove gas bubbles generated on the processing surface of a substrate W during treatment. Accordingly, in the case of a pretreatment unit using a treatment tank having the same construction as the processing tank 710, as with the plating unit 360, a tilting mechanism is provided in the substrate fixing head 560. In a preferred manner of operation, as shown in FIG. 32, about 60% of a substrate W in a tilted position is dipped in a treatment liquid while the substrate W is rotated (in the direction of arrow D), thereby discharging gas bubbles from the region of the substrate W not dipped in the liquid to the outside.

A method may be considered in which air is forced out of the region of the substrate W not dipped in the liquid by an aspirator, etc. It is also possible to dispose a plurality of not-shown circulation nozzles at desired locations within the processing tank 710, and create a flow of the treatment liquid in the one direction of arrow C shown in FIG. 32 (direction along the tilted substrate W from the deeper side toward the shallower side, i.e. gas bubble discharging direction), thereby removing gas bubbles which are to remain on the processing surface. During the operation, the liquid level of the treatment liquid rises as shown by the broken line in FIG. 32, promoting removal of gas bubbles. It is also possible to provide a gas bubble escape groove 562 radially cut off in the peripheral lower and portion of the substrate fixing head 560.

The overall operation of the substrate processing apparatus 1 shown in FIG. 2 will now be described. First, a substrate W is taken by the first substrate transfer robot 130 out of a substrate cassette mounted in the loading port 110. The substrate W is transferred to the first reversing machine 150 and reversed so that the processing surface faces downward, and is then transferred by the first transfer robot 130 to the lower temporary storage stage 219 of the temporary substrate storage stage 210 (see FIGS. 8A and 8C) and placed on the stage 219.

Next, the substrate W is transferred by the second substrate transfer robot 230 to the pre-cleaning unit 240 and pre-cleaned in the pre-cleaning unit 240 (pre-cleaning step). The substrate W after completion of the pre-cleaning is transferred by the third substrate transfer robot 310 to the first pretreatment unit 320. The pre-cleaning unit 240 is disposed in such a position that the hands of the substrate transfer robots 230, 310, respectively disposed in the cleaning area 200 and the plating area 300, are accessible to the pre-cleaning unit 240 from the opposite sides, thereof for transfer of the substrate W. The substrate W, which has transferred to the first pretreatment unit 320, is subjected to the first pretreatment (first pretreatment step).

The substrate W after completion of the first pretreatment is transferred by the third substrate transfer robot 310 to the second pretreatment unit 340, and the second pretreatment of the substrate W is carried out (second pretreatment step). The substrate W after completion of the second pretreatment is transferred by the third transfer robot 310 to the plating unit 360 to carry out plating of the substrate W.

The substrate W after completion of the plating is transferred by the third substrate transfer robot 310 to the second reversing machine 250 where the substrate W is reversed, and the substrate W is then transferred by the second substrate transfer robot 230 to the first cleaning section 270 of the post-cleaning unit 260. After cleaning, the substrate W is transferred by the second substrate transfer robot 230 to the second cleaning/drying section 290, where the substrate W is cleaned and dried. The substrate W after completion of the cleaning and drying is transferred by the second substrate transfer robot 230 to the upper temporary storage stage 217 of the temporary substrate storage stage 210 and placed on the stage 217 for temporary storage. Thereafter, the substrate W is transferred by the first substrate transfer robot 130 to a substrate cassette mounted in the loading port 110 and placed in the substrate cassette.

Figure 33:
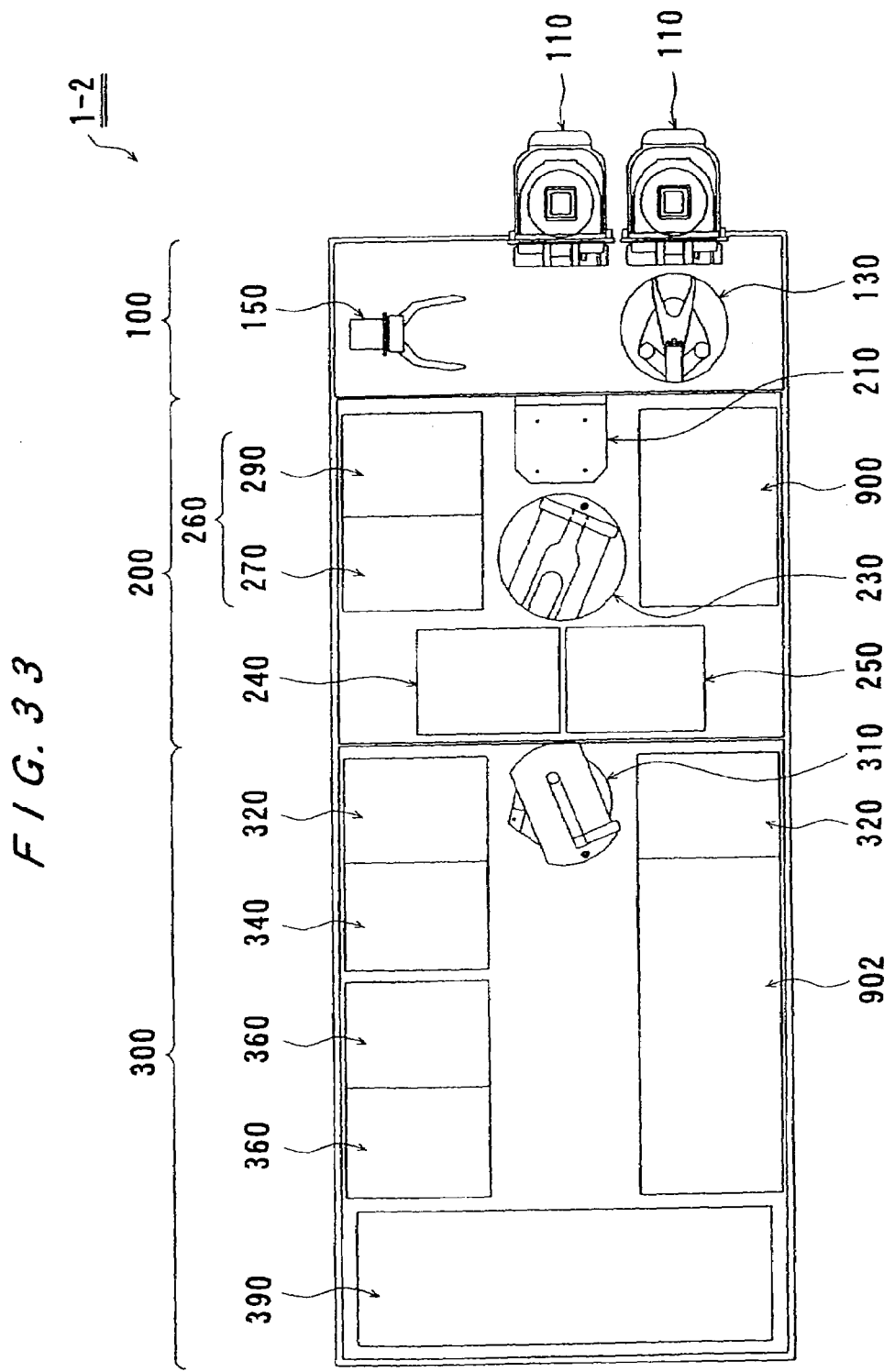
FIG. 33 is an overall plan view of a substrate processing apparatus according to another embodiment of the present invention.

FIG. 33 is a schematic overall plan view showing a substrate processing apparatus 1-2 according to another embodiment of the present invention. In the substrate processing apparatus shown in FIG. 33, components equivalent to those of the substrate processing apparatus 1 shown in FIG. 2 are given the same reference numerals, and a detailed description thereof will be omitted. The substrate processing apparatus 1-2 shown in FIG. 33 differs from the substrate processing apparatus 1 shown in FIG. 2 in that one of the two post-cleaning units 260 installed in the cleaning area 200 in the latter apparatus is replaced with a chemical liquid supply unit 900, and the respective numbers of the first pretreatment units 320, the second pretreatment units 340 and the plating units 360, all installed in the plating area 300 in the latter apparatus, are decreased and a chemical liquid supply unit 902 is installed instead.

These chemical liquid supply units 900, 902 are units for diluting chemical liquids (undiluted liquids) to operating concentrations and supplying the diluted chemical liquids to the various units. The chemical liquid supply unit 900 supplies chemical liquids for use in the pre-cleaning unit 240, the first cleaning section 270 and the second cleaning section 290 in the cleaning area 200, while the chemical supply unit 902 supplies chemical liquids for use in the first pretreatment unit 320, the second pretreatment unit 340 and the plating unit 360 in the plating area 300.

The provision of the chemical supply units 900, 902 as units within the substrate processing apparatus 1-2 avoids the need for separately providing a chemical liquid supply device, whereby the whole system can be made compact. Further, it becomes possible to supply chemical liquids (undiluted liquids) to the substrate processing apparatus 1-2 directly from a houseline, etc. of a factory.

As described hereinabove, according to the present invention, the various processing of a substrate can be carried out securely with a good product quality and, in addition, the whole apparatus can be made compact and the apparatus cost can be reduced.

Figures 34A, 34B:
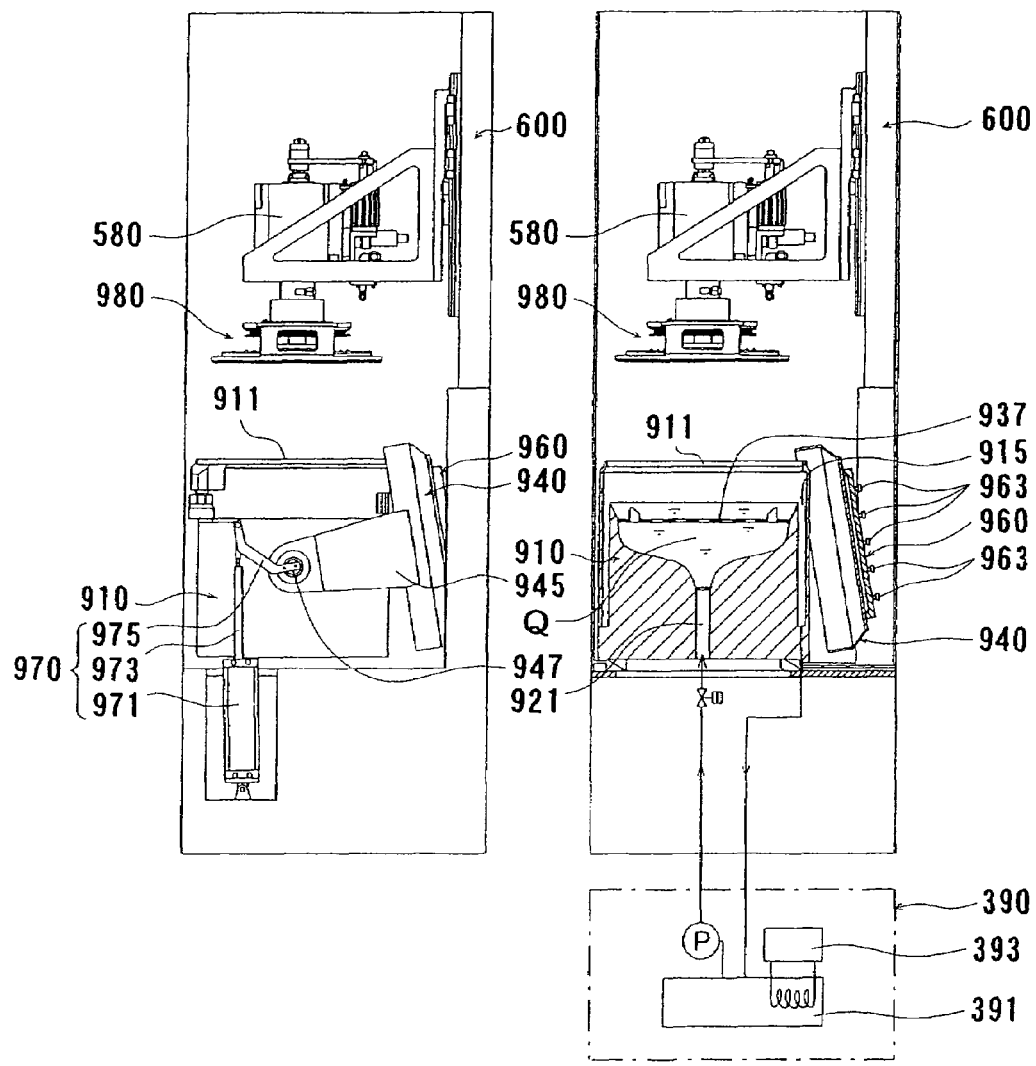
FIG. 34A is a side view of a substrate processing apparatus, adapted for use as an electroless plating unit, according to yet another embodiment of the present invention.
FIG. 34B is a sectional side view of FIG. 34A.

FIG. 34A is a side view showing a substrate processing apparatus, adapted for use as a plating unit, according to another embodiment of the present invention, and FIG. 34B is a schematic sectional side view of FIG. 34A. As shown in FIGS. 34A and 34B, the plating unit (substrate processing apparatus) comprises a processing tank 910 for holding a plating solution (processing liquid) Q therein and carrying out a dip processing, a lid member 940 for closing the opening 911 of the processing tank 910, a spray nozzle (treatment liquid spraying section) 960 mounted to the upper surface of the lid member 940, a drive mechanism 970 for driving (pivoting) the lid member 940, a substrate holding device 980 for holding a substrate W, a substrate holding device lifting mechanism 600 for raising and lowering the whole substrate holding device 980, having the same construction as that shown in FIGS. 12A and 12B, and a processing liquid circulating device 390 for circulating the plating solution Q in the processing tank 910. The respective components will now be described. Since the substrate holding device lifting mechanism 600 has the same construction as that shown in FIGS. 12A and 12B, a description thereof is omitted.

Figure 35:
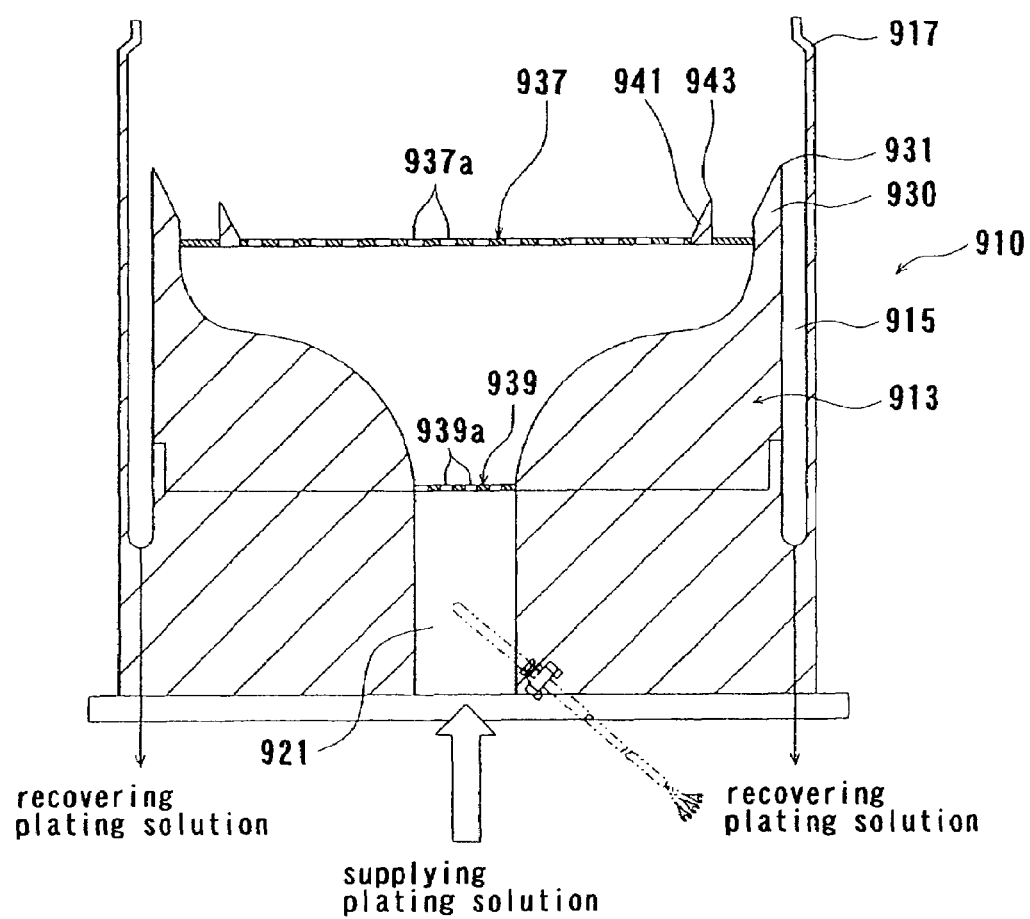
FIG. 35 is an enlarged sectional view of a processing tank.

FIG. 35 is an enlarged sectional view of the processing tank 910. As shown in FIGS. 35 and 34B, the processing tank 910 includes a vessel-shaped processing tank body 913 for holding the plating solution Q, a recovery groove (overflow groove) 915 provided around a first tank 913 constituting the upper peripheral portion of the processing tank body 913 for recovering the plating solution Q overflowing the top end portion 931 of the peripheral portion of the first tank body 930, a cover portion 917 surrounding the recovery groove 915 and projecting upwardly and cylindrically, current plates 937, 939 disposed at upper and lower positions within the processing tank body 913 for creating a uniform flow of the plating solution Q within the processing tank body 913, and a ring-shaped second tank (formed of a circular wall) 941 having a smaller outer diameter than the inner diameter of the first tank 930 and disposed inside the first tank 930 such that the second tank 941, together with the first tank 930, constitutes a double structure. A plating solution supply inlet 921 is provided at the center of the bottom of the processing tank body 913.

The current plates 937, 939 are circular flat plates which are provided with a large number of small through-holes 937a, 939a so that the plating solution Q supplied from the plating solution supply inlet 921 can form a uniform upward flow whose current speed is equal at every point. The second tank (formed of a circular wall) 941 is fixed to the current plate 937 and protrudes upwardly from the current plate 937, and is designed so that the height of the peripheral top end portion 943 is slightly lower than the height of the top end portion 931 of the first tank 930 and the diameter of the top end portion 943 is slightly smaller than the outer diameter of a substrate W. The through-holes 937a are not formed in the portion of the current plate 937 outside the second tank 941 so that all the plating solution Q passes through the portion of the current plate 937 inside the second tank 941.

Referring again to FIG. 34A, the processing liquid circulating device 390 returns the plating solution Q, which has overflowed into the recovery groove 915 of the processing tank 910, through a pipe to a supply tank 391, and supplied the plating solution Q which has been collected in the supply tank 391 to the plating solution supply inlet 921 of the processing tank body 913 by a pump P, thereby circulating the plating solution Q. The supply tank 391 is provided with a heater 393 for keeping the plating solution Q, to be supplied to the processing tank 910, at a predetermined temperature.

The lid member 940 is comprised of a plate material of such a size as to close the opening 911 of the processing tank 910. Plate-like arms 945 are mounted to the opposite side surfaces of the lid member 940, and are rotatably supported at portions near the respective ends by bearing portions 947 provided on the opposite sides of the processing tank 710. The ends of the arms 945 are fixed to the ends of coupling arms 975 of the drive mechanism 970.

The spray nozzle 960 is comprised of a plurality of nozzles 936 oriented upwardly and disposed on the upper surface of the lid member 940. According to this embodiment, a cleaning liquid (pure water) is sprayed right upwardly from the nozzles 963.

The drive mechanism 970 comprises a lid member pivoting cylinder 971, a rod 973 coupled to the piston of the lid member pivoting cylinder 971, and the coupling rod 975 swingably coupled to the end of the rod 973. The lower end of the lid member pivoting cylinder 971 is rotatably supported by a fixed member.

Figure 36:
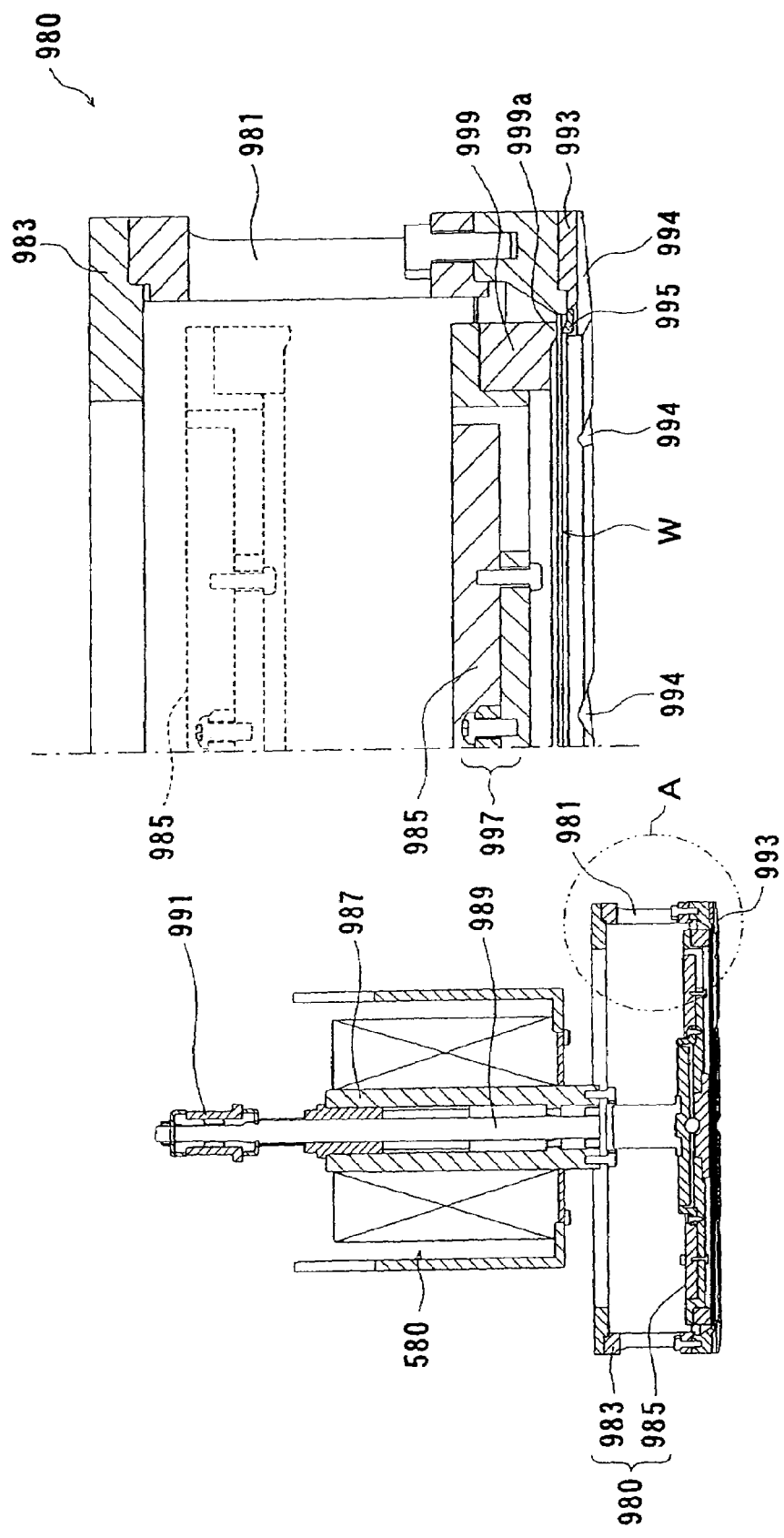
FIG. 36A is a schematic sectional side view showing a substrate holding device and a device rotating motor.
FIG. 36B is an enlarged view of the portion A of FIG. 36A.

FIG. 36A is a schematic sectional side view showing the substrate holding device 980 and the device rotating motor 580, and FIG. 36B is an enlarged view of the portion A of FIG. 36A. As shown in FIG. 36A, the substrate holding device 980 includes a downwardly-open housing 983 having openings 981 in the sidewall, and a pressing member 985 disposed within the housing 983. The housing 983 is coupled to the hollow output shaft 987 of the device rotating motor 580. The pressing member 985 is coupled at its center to the lower end of a shaft 989. The shaft 989 passes through the hollow portion of the output shaft 987 and protrudes upwardly, and the end of protrusion is rotatably supported by a bearing portion 991. The hollow portion of the output shaft 987 and the shaft 989 are in spline engagement so that they can rotate simultaneously, while the shaft 989 can move vertically independent of the output shaft 987.

Figure 37:
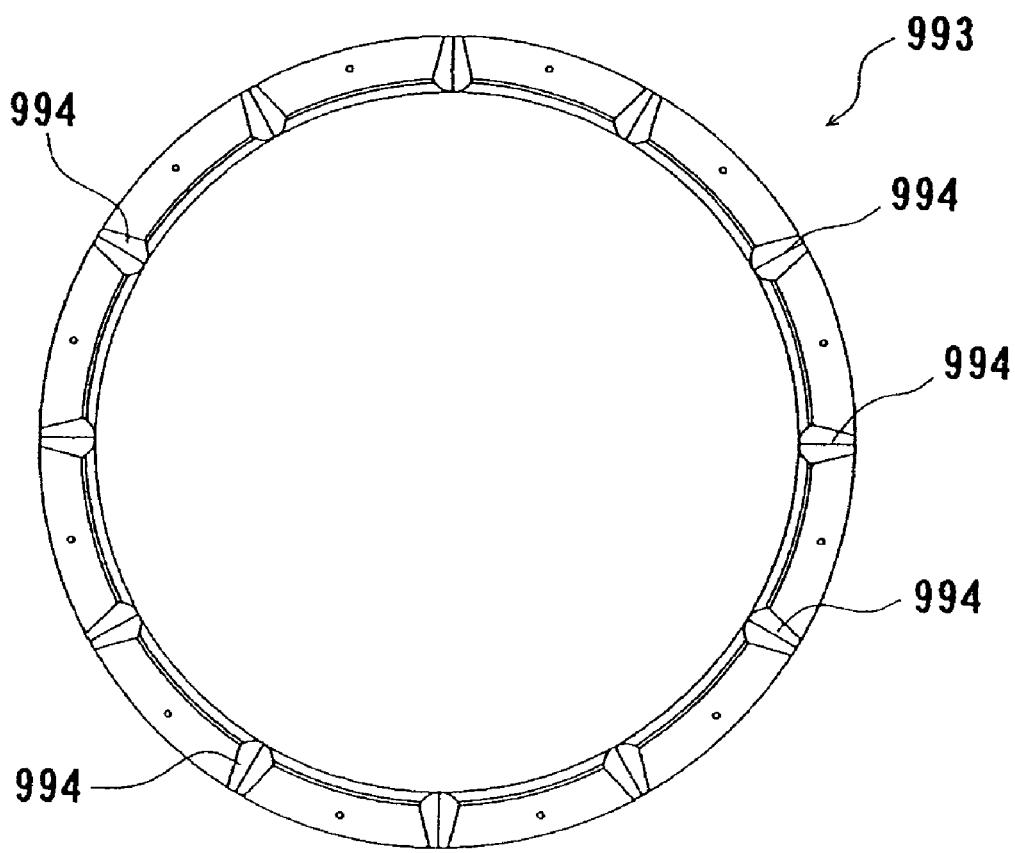
FIG. 37 is a view showing the lower surface of a substrate holder.

An inwardly-projecting ring-shaped substrate holder 993 is provided at the lower end of the housing 983. A ring-shaped sealing member 995 for placing thereon and sealing a substrate W is mounted to the inner upper portion of the substrate holder 993. In the lower surface of the substrate holder 993, as shown in FIG. 37, a plurality of escape grooves 994 are formed in the radial direction (normal direction). The housing 983 is designed so that its outer diameter is slightly smaller than the diameter of the top end portion 931 shown in FIG. 35, so that the housing 983 can almost close the opening of the processing tank body 913. On the other hand, the pressing member 985 includes a disc-shaped holder 997 and a substrate fixing ring 999 mounted to the peripheral lower surface of the holder 997. A downwardly-projecting pressing portion 999a is provided in the peripheral lower surface of the substrate fixing ring 999.

The bearing portion 991 is fixed to the rod 578 of the cylinder mechanism 577 (see FIGS. 12A and 12B) that moves the bearing portion 991 vertically, and the cylinder mechanism 577 itself is fixed to the mounting bases 579 (see FIGS. 12A and 12B) mounting the device rotating motor 580, etc.

The operation of the plating unit (substrate processing apparatus) will now be described. First, the substrate holding device 980 is set at a position above the processing tank 910, as shown in FIGS. 34A and 34B, and the pressing member 985 is set a raised portion within the substrate holding device 980, as shown by the broken line in FIG. 36B. A substrate W, which is held face down by the vacuum hand 337 or 339 (see FIGS. 5A through 5C), is inserted from the opening 981 of the sidewall of the housing 983 into the housing 983 and the vacuum attraction is released, thereby placing the substrate W on the ring-shaped sealing member 995 having a diameter smaller by several mm than the diameter of the substrate W. The cylinder mechanism 577 is then driven to lower the pressing member 985 so that, as shown by the solid line in FIG. 36B, the pressing portion 999a of the substrate fixing ring 999 of the pressing member 985 is pressed against a peripheral region of the upper surface of the substrate W whereby a peripheral region of the lower surface (processing surface) of the substrate W is pressed against the sealing member 995, thereby fixing the substrate W. The sealing member 995 also functions as a seal for preventing the plating solution from intruding into the back surface (upper surface) of the substrate W.

In the processing tank 910, by the actuation of the pump P shown in FIG. 34, the plating solution Q is supplied from the plating solution inlet 921 and circulated in the processing tank 910, and the plating solution Q is then forced to overflow the top end portion 931 of the peripheral portion of the first tank 930 and recovered in the recovery groove 915, and is returned to the supply tank 391. FIGS. 38A and 38B show the state of the flow of plating solution Q in the processing tank 910. FIGS. 38A and 38B show the flow state immediately before the substrate holding device 980, which is being lowered, is dipped into the plating solution Q. As shown in FIGS. 38A and 38B, the plating solution Q flows such that it is supplied upwardly from the plating solution supply inlet 921 and passes through the current plates 939, 937 whereby the flow of plating solution Q is made uniform, and the plating solution Q passes over the top end portion 943 of the second tank 941 and then overflows the top end portion 931 of the first tank 930, and is recovered in the recovery groove 915.

Next, as shown in FIGS. 39A and 39B, the lifting motor 661 (see FIG. 12B) is driven to lower the substrate holding device 980 while keeping the substrate W horizontal so as to dip the lower surface (processing surface) of the substrate W into the plating solution Q, and the substrate holding device 980 is further lowered to a position which is lower than the below-described substrate processing position (the position shown in FIGS. 40A and 40B) and at which the processing surface of the substrate W is close to the top end portion 943 of the second tank 941, thereby forming a narrow (clearance of about 1 mm) circular slit between a peripheral portion of the processing surface of the substrate W and the top end portion 943. Thus, the plating solution Q, which has passed through the current plate 937, passes through the slit. The flow speed of the plating solution Q increases at the slit and a fast flow is created.

As described above, the radial escape grooves 994 are formed in the lower surface of substrate holder 993 positioned at the bottom of the substrate holding device 980 and around the substrate W held. Accordingly, the plating solution Q, which has passed through the slit, passes through the escape grooves 994 and flows out rapidly and smoothly from the bottom of the substrate holding device 980. Accordingly, as shown by arrow B, a fast flow of plating solution Q is created over the processing surface of the substrate W, flowing along the processing surface from the center toward the periphery. Gas bubbles which are caught on the processing surface (lower surface) of the substrate W upon dipping the substrate W into the plating solution Q can be removed along with the fast flow of plating solution.

Thus, according to this embodiment, the circular top end portion 943 is provided as a gas bubble removing section in the processing tank 910 so that a circular slit can be formed in the vicinity of the periphery of the processing surface of the substrate W dipped in the plating solution Q, and the plating solution Q, which has flowed from below the processing surface of the substrate W to the processing surface and flows along the processing surface, is allowed to pass through the slit, thereby increasing the flow speed of the flow of plating solution Q along the processing surface and removing gas bubbles on the processing surface.

After completion of the removal of gas bubbles, the lifting motor 661 (see FIG. 12B) is driven to raise the substrate holding device 980 to the substrate processing position shown in FIGS. 40A and 40B, thereby widening the clearance between the processing surface of the substrate W and the top end portion 943 of the second tank 941. Electroless plating of the substrate W is then carried out while allowing the plating solution Q to flow along the processing surface. At the substrate processing position, there is a sufficiently wide clearance between the substrate W and the top end portion 943, whereby a stable flow of plating solution Q is formed.

Next, the lifting motor 661 (see FIG. 12A) is driven to raise the substrate holding device 980 to the position shown in FIGS. 34A and 34B, i.e. above the processing tank 910, thereby terminating the electroless plating. Thereafter, the drive mechanism 970 is driven to pivot the lid member 940 so as to close the opening 911 of the processing tank 910 with the lid member 940, as shown in FIGS. 41A and 41B. Next, a cleaning liquid (pure water) is sprayed right upwardly from the nozzles 963 of the spray nozzle 960 fixed on the upper surface of the lid member 940 to clean the processed surface (plated surface). Since the opening 911 of the processing tank 910 is covered with the lid member 940, the cleaning liquid does not enter the processing tank 910, and therefore the plating solution Q in the processing tank 910 is not diluted, enabling use of the plating solution Q during circulating. The cleaning liquid after the cleaning of substrate W is discharged from a not-shown discharge outlet.

After completion of the cleaning of the substrate W, as described above, the pressing member 985 rises as shown by the broken lines in FIG. 36B. The vacuum hand 337 or 339 (see FIGS. 5A through 5C) of the third substrate transfer robot 310 is inserted from the opening 981 in the sidewall of the housing 983 into the housing 983, attracts the center portion of the back surface of the substrate W and takes the substrate W out through the opening 981. The next unprocessed substrate W is set in the substrate holding device 980, which substrate is subjected to the above-described plating and cleaning steps.

Though in this embodiment electroless plating is carried out with the plating solution Q held in the processing tank 910, it is also possible to carry out electroplating of a processing surface of a substrate W by providing an anode within the processing tank 910 and connecting a cathode electrode to the substrate W. Further, it is possible to use the substrate processing apparatus, not as a plating unit, but as a substrate processing unit for carrying out other chemical processing or treatment (e.g. pre-plating treatment or post-plating treatment). Furthermore, treatment of a substrate W by the spray nozzle 960 is not limited to the cleaning treatment with a cleaning liquid, but is also applicable to other chemical treatments.

FIG. 42A is a schematic sectional view of the processing tank 910-2 and the substrate holding device 980 of a substrate processing apparatus (plating unit) according to another embodiment of the present invention, showing the state when the substrate holding device 980 is lowering and is about to dip into the plating solution Q, and FIG. 42B is an enlarged sectional view showing the vicinity of the top end portion 931 of the first tank 930 of the processing tank 910-2 shown in FIG. 42A. As shown in FIGS. 42A and 42B, according to the processing tank 910-2, the second tank 941 shown in FIGS. 38A and 38B is omitted, and the first tank 930 is designed to have the function of the second tank 941. Thus, according to the processing tank 910-2, the diameter of the top end portion 931 of the first tank 930 is made slightly smaller than the diameter of a substrate W so that a slit can be formed between the top end portion 931 of the first tank 930 and a peripheral portion of the back surface of the substrate W. The construction of the substrate processing apparatus of this embodiment other than the processing tank 910-2 is the same as the substrate processing apparatus shown in FIGS. 34A and 34B.

The operation of the substrate processing apparatus of this embodiment will now be described. First, as shown in FIGS. 42A and 42B, the pump P shown in FIG. 34 is driven to supply the plating solution Q from the plating solution supply inlet 921 into the processing tank 910-2, circulate the plating solution Q within the processing tank 910-2 and allows the plating solution Q to overflow the top end portion 931 of the outer peripheral portion of the first tank 930. At this moment, as shown in FIG. 42B, the surface of the plating solution Q rises to above the top end portion 931 due to the surface tension. Next, the substrate holding device 980 with the substrate W held horizontally therein is lowered to dip the substrate W into the plating solution Q while keeping the substrate W horizontally, and to form a narrow (e.g. clearance of about 1 mm) circular slit between a peripheral portion of the processing surface of the substrate W and the top end portion 931, as shown in FIGS. 43A and 43B. Thus, the plating solution Q, which has passed through the current plate 937, passes through the slit. The flow speed of the plating solution Q increases at the slit and a fast flow is created.

The radial escape grooves 994 are formed in the lower surface of the substrate holder 993 positioned at the bottom of the substrate holding device 980 and around the substrate W held. Accordingly, the plating solution Q, which has passed through the slit, passes through the escape grooves 994 and flows out rapidly and smoothly from the bottom of the substrate holding device 980. Accordingly, as shown by arrow C, a fast flow of plating solution Q is created over the processing surface of the substrate W, flowing along the processing surface from the center toward the periphery. Gas bubbles which are caught on the processing surface (lower surface) of the substrate W upon dipping the substrate W into the plating solution Q can be removed along with the fast flow of plating solution.

Thus, also according to this embodiment, the circular top end portion 931 is provided as a gas bubble removing section in the processing tank 910-2 so that a circular slit can be formed in the vicinity of the periphery of the processing surface of the substrate W dipped in the plating solution Q, and the plating solution Q, which has flowed from below the processing surface of the substrate W to the processing surface and flows along the processing surface, is allowed to pass through the slit, thereby increasing the flow speed of the flow of plating solution Q along the processing surface and removing gas bubbles on the processing surface.

After completion of the removal of gas bubbles, the substrate holding device 980 is slightly raised from the position shown in FIGS. 43A and 43B, thereby widening the clearance between the processing surface of the substrate W and the top end portion 931. Electroless plating is then carried out while allowing the plating solution Q to flow along the processing surface of the substrate W.

Next, the substrate holding device 980 is raised (see FIGS. 34A and 34B) to the position above the processing tank 910-2, thereby terminating the electroless plating. The subsequent step is the same as the preceding embodiment, and hence a description thereof is omitted.

As described in detail herein above, according to the present invention, gas bubbles remaining on the processing surface of a substrate can be removed with ease even when the substrate in a horizontal position is dipped in a processing liquid.

Figures 44A, 44B:
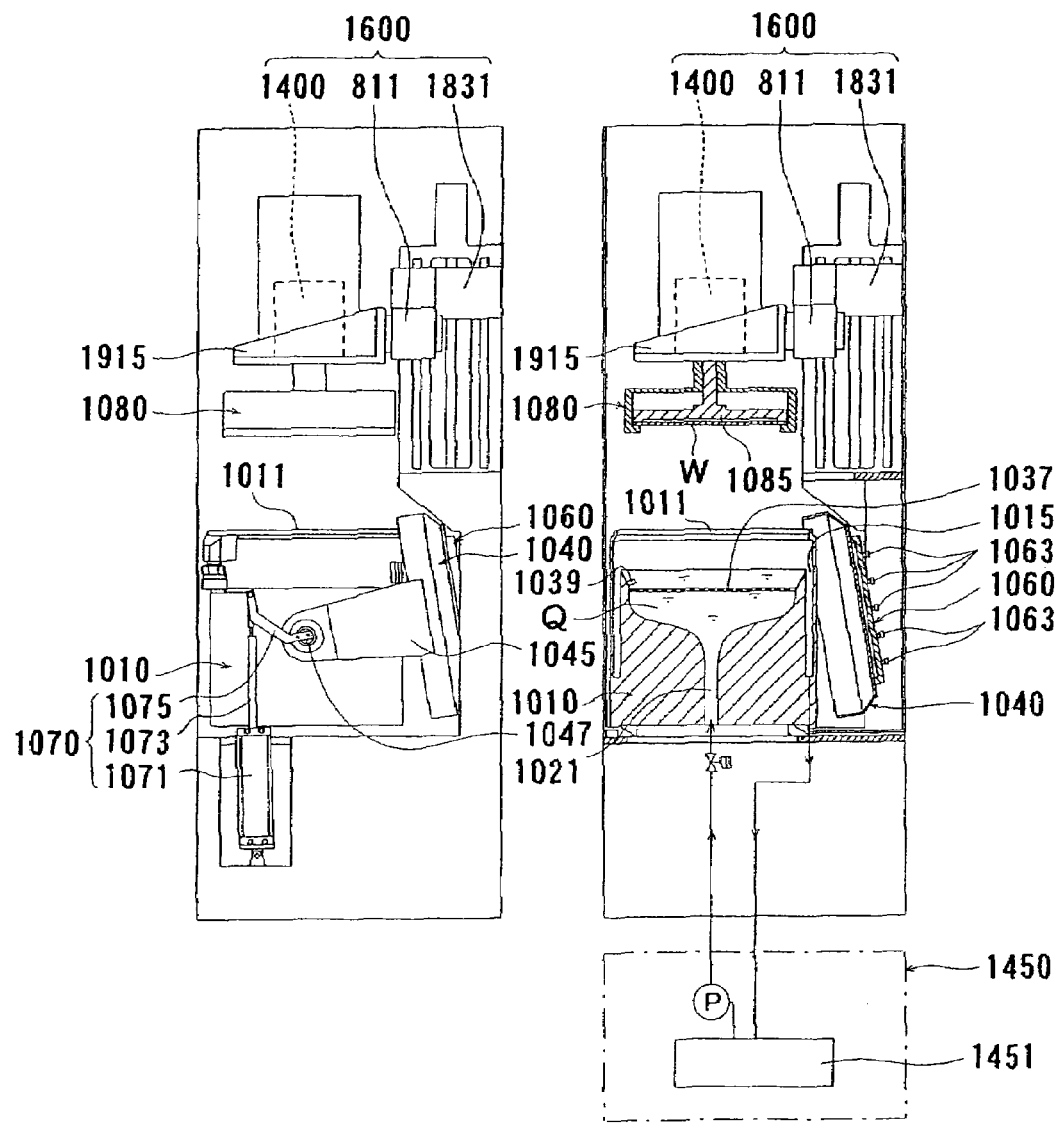
FIG. 44A is a side view showing a substrate processing apparatus, adapted for pretreatment unit, according to yet another embodiment of the present invention.
FIG. 44B is a schematic sectional side view of FIG. 44A.

FIG. 44A is a side view showing a substrate processing apparatus, adapted for various pretreatment units, according to yet another embodiment of the present invention, and FIG. 44B is a schematic sectional side view of FIG. 44A. As shown in FIGS. 44A and 44B, the substrate processing apparatus (pretreatment unit) comprises a processing tank 1010 for holding a processing liquid (first pretreatment liquid) Q therein and carrying out a dip processing of a substrate W, a lid member 1040 for closing the opening 1011 of the processing tank 1010, a spray nozzle (treatment liquid spraying section) 1060 mounted to the upper surface of the lid member 1040, a drive mechanism 1070 for driving (pivoting) the lid member 1040, a substrate holding device 1080 for holding the substrate W, a substrate holding device drive section 1600 for rotating, pivoting and vertically moving the whole substrate holding device 1080, and a processing liquid circulating section 1450 for circulating the processing liquid Q in the processing tank 1010. The respective components will now be described.

FIG. 45 is an enlarged sectional view of the processing tank 1010. As shown in FIGS. 45 and 44B, the processing tank 1010 includes a vessel-shaped processing tank body 1013 for holding the processing liquid Q, a recovery groove (overflow groove) 1015 for recovering the processing liquid Q overflowing the top end portion 1031 of the peripheral portion of the processing tank body 1013, a cover portion 1017 surrounding the recovery groove 1015 and projecting upwardly and cylindrically, and a current plate 1037 disposed within the processing tank body 1013 for creating a uniform flow of the processing liquid Q within the processing tank body 1013. A processing liquid supply inlet 1021 is provided at the center of the bottom of the processing tank body 1013. The current plate 1037 is a circular flat plate which is provided with a large number of small through-holes 1037a so that the processing liquid Q supplied from the plating solution supply inlet 1021 can form a uniform upward flow whose current speed is equal at every point. Further, in the upper inner surface of the processing tank body 1013 is provided a processing liquid supply nozzle (processing liquid supply section) 1039 for jetting the processing liquid Q, held in the processing tank body 1013, obliquely upwardly toward the center of the processing tank body 1013.

Referring again to FIGS. 44A and 44B, the processing liquid circulating section 1450 returns the processing liquid Q, which has overflowed into the recovery groove 1015 of the processing tank 1010, through a pipe to a supply tank 1451, and supplies the processing liquid Q which has been collected in the supply tank 1451 to the plating solution supply inlet 1021 of the processing tank body 1013 by a pump P, thereby circulating the processing liquid Q. Thus, in the substrate processing apparatus, the processing liquid Q is circulated within the processing tank 1010 by constantly supplying the processing liquid from the bottom of the processing tank 1010, and the liquid which has overflowed is recovered in the recovery groove 1015 provided around the processing tank body 1013 and returned to the supply tank 1451.

The lid member 1040 is comprised of a plate material of such a size as to close the opening 1011 of the processing tank 1010. Plate-like arms 1045 are mounted to the opposite side surfaces of the lid member 1040, and are rotatably supported at portions near the respective ends by bearing portions 1047 provided on the opposite sides of the processing tank 1010. The ends of the arms 1045 are fixed to the ends of coupling arms 1075 of the drive mechanism 1070.

The spray nozzle 1060 is comprised of a plurality of nozzles 1036 oriented upwardly and disposed on the upper surface of the lid member 1040. According to this embodiment, a cleaning liquid (pure water) is sprayed right upwardly from the nozzles 1063.

The drive mechanism 1070 comprises a lid member pivoting cylinder 1071, a rod 1073 coupled to the piston of the lid member pivoting cylinder 1071, and the coupling arm 1075 swingably coupled to the end of the rod 1073. The lower end of the lid member pivoting cylinder 1071 is rotatably supported by a fixed member.

The substrate holding device drive section 1600 comprises a device rotating motor 1400 for rotationally driving the substrate holding device 1080, a tilting mechanism 811, having the same construction as the tilting mechanism shown in FIGS. 22A and 22B, for swinging the substrate holding device 1080, and a lifting mechanism 1831 for raising and lowering the substrate holding device 1080.

FIG. 46A is a schematic sectional side view showing the substrate holding device 1080 and the device rotating motor 1400, and FIG. 46B is an enlarged view of the portion A of FIG. 46A. As shown in FIG. 46A, the substrate holding device 1080 includes a downwardly-open housing 1083 having openings 1081 in the sidewall, and a pressing member 1085 disposed within the housing 1083. The housing 1083 is coupled to the hollow output shaft 1087 of the rotating motor (rotating section) 1400 composed of servomotor. The pressing member 1085 is coupled at its center to the lower end of a shaft 1089. The shaft 1089 passes through the hollow portion of the output shaft 1087 and protrudes upwardly, and the end of protrusion is rotatably supported by a bearing portion 1091. The hollow portion of the output shaft 1087 and the shaft 1089 are in spline engagement so that they can rotate simultaneously, while the shaft 1089 can move vertically independent of the output shaft 1087.

An inwardly-projecting ring-shaped substrate holder 1093 is provided at the lower end of the housing 1083. A ring-shaped sealing member 1095 for placing thereon and sealing a substrate W is mounted to the inner upper portion of the substrate holder 1093. In the lower surface of the substrate holder 1093, as shown in FIG. 47, a plurality of escape grooves 1094 are formed in the radial direction (normal direction). The housing 1083 is designed so that its outer diameter is slightly smaller than the inner diameter of the upper portion of the processing tank body 1013 shown in FIG. 45, so that the housing 1083 can almost close the opening of the processing tank body 1013.

On the other hand, as shown in FIGS. 46A and 46B, the pressing member 1085 includes a disc-shaped holder 1097, and a substrate fixing ring 1099 mounted to the peripheral lower surface of the holder 1097 and having in its interior a housing portion 1098. The housing portion 1098 houses a spring 1981 and a ring-shaped pusher 1983 with a pressing portion 1985 disposed under the spring 1981. The pressing portion 1985 of the pusher 1983 protrudes from a hole provided in the lower surface of the substrate fixing ring 1099. The bearing portion 1091 is coupled to a vertical drive mechanism 1911 that moves the bearing portion 1091 vertically, and the vertical drive mechanism 1911 itself is fixed to a mounting base 1915 mounting the rotating motor 1400, etc. The pressing member 1085 can move vertically independent of the housing 1083, etc. by the vertical drive mechanism 1911. The housing 1083 is rotationally driven by the rotating motor 1400.

The lifting mechanism 1831 shown in FIGS. 44A and 44B is a mechanism for moving the tilting mechanism 811 vertically. The whole of the substrate holding device 1080, the mounting base 1915 mounting the device rotating motor, etc., and the tilting mechanism 811 moves vertically by the actuation of the lifting mechanism 1831. The vertical movement is controlled by the lifting mechanism 1831. The tilting mechanism 811, the rotating motor 1400 and the lifting mechanism 1831 constitute the substrate holding device drive section 1600 that allows a substrate W held in the substrate holding device 1080 to be dipped into the processing liquid Q while the processing surface of the substrate W is tilted relative to the liquid surface. The lifting mechanism 1831, constituting the drive section 1600, also functions as a substrate-liquid contact region adjusting section. Thus, the lifting mechanism is so designed that it can adjust the region, to be in contact with the liquid, of the processing surface of a tilted substrate W within the range of 0-100%.

Figure 48:
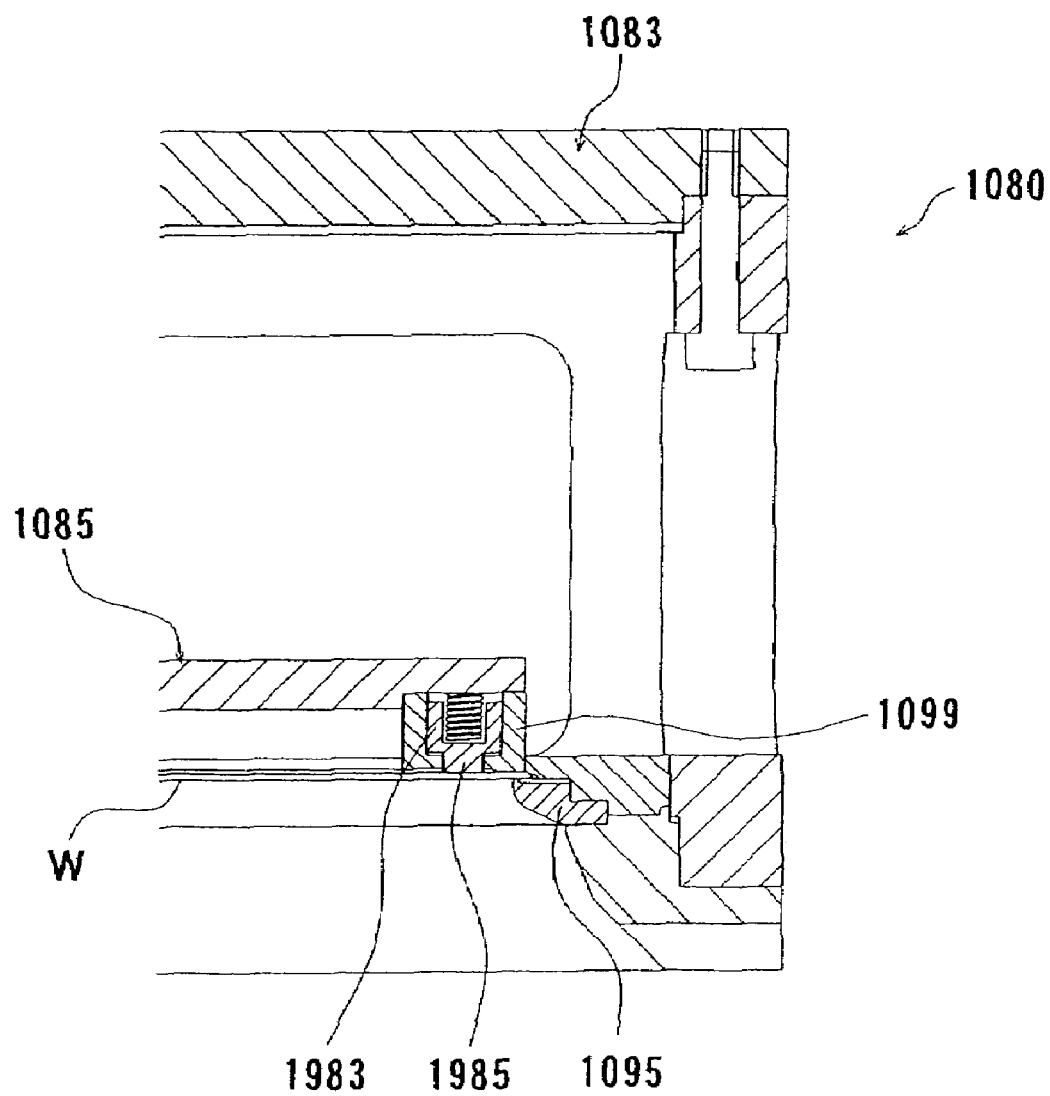
FIG. 48 is a diagram illustrating the operation of the substrate holding device.

The operation of the substrate processing apparatus (pretreatment unit) will now be described. First, the substrate holding device 1080 is set at a position above the processing tank 1010, as shown in FIGS. 44A and 44B, and the pressing member 1085 is set at a raised portion within the substrate holding device 1080, as shown in FIGS. 46A and 46B. A substrate W, which is held face down by the vacuum hand 337 or 339 (see FIGS. 5A through 5C), is inserted from the opening 1081 in the sidewall of the housing 1083 into the housing 1083 and the vacuum attraction is released, thereby placing the substrate W on the ring-shaped sealing member 1095 having a diameter smaller by several mm than the diameter of the substrate W. The vertical drive mechanism 1911 is then driven to lower the pressing member 1085 so that, as shown in FIG. 48, the pressing portion 1985 of the substrate fixing ring 1099 of the processing member 1085 is pressed against a peripheral region of the upper surface of the substrate W whereby a peripheral region of the lower surface (processing surface) of the substrate W is pressed against the sealing member 1095, thereby fixing the substrate W. The sealing member 1095 also functions as a seal for preventing the processing liquid from intruding into the back surface of the substrate W.

In the processing tank 1010, the pump P shown in FIG. 44B is driven so that the processing liquid Q is supplied from the processing liquid inlet 1021 and circulated within the processing tank 1010, and is allowed to overflow the top end portion 1031 of the processing tank 1010, recovered in the recovery groove 1015 and returned to the supply tank 1451.

Figure 49:
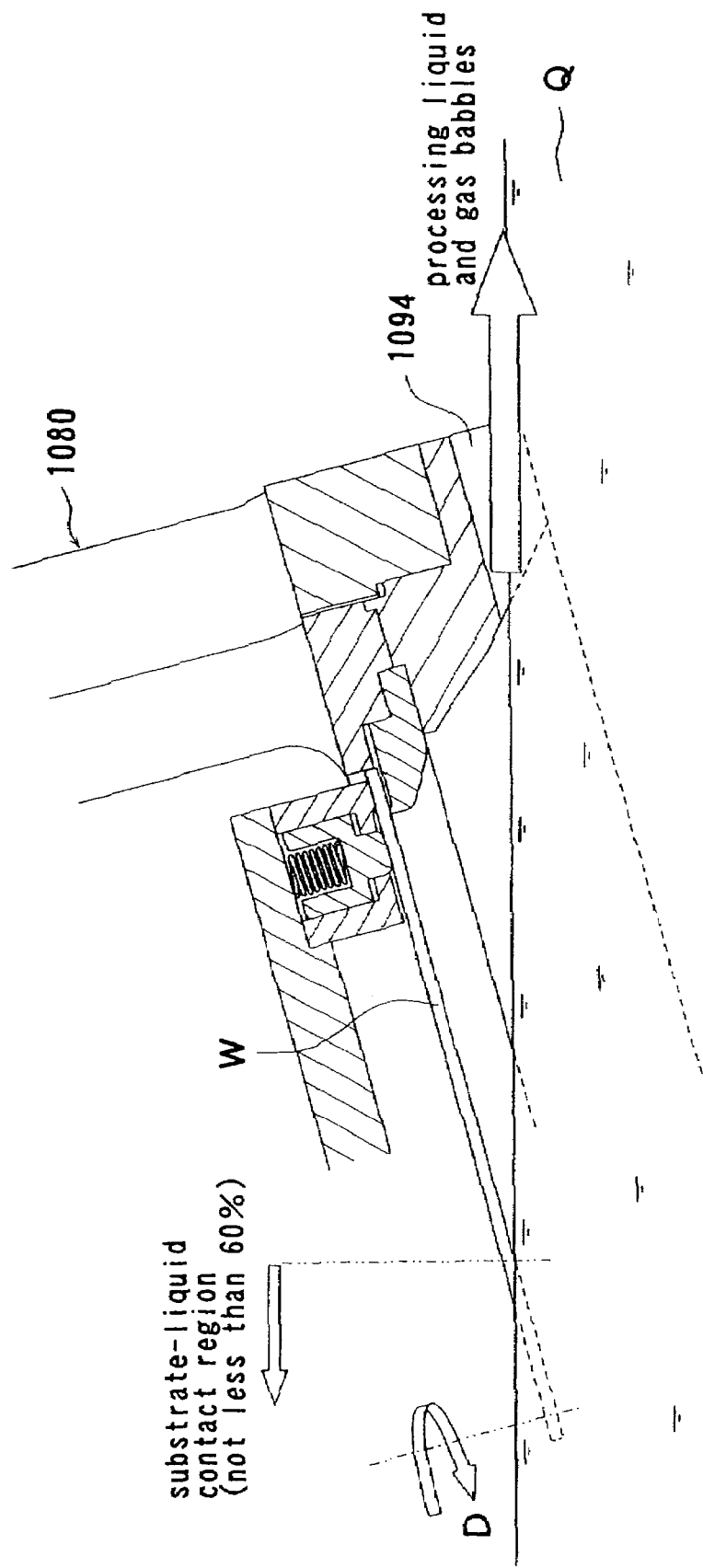
FIG. 49 is a diagram illustrating a method of dip-processing a substrate.

Next, the head tilting cylinder 817 (see FIGS. 22A and 22B) is driven to swing the whole of the mounting base 1915 and the substrate holding device 1080 to tilt the substrate W held in the substrate holding device 1080 at a predetermined angle relative to the horizontal position, and the device rotating motor 1400 shown in FIG. 46A is then driven to rotate the substrate holding device 1080 and the substrate W. By driving the lifting mechanism 1831 shown in FIGS. 44A and 44B, the tilted substrate holding device 1080 is lowered to dip the substrate W into the processing liquid Q in the processing tank 1010. FIG. 49 shows the state of the substrate W when it is dipped into the processing liquid. As shown in FIG. 49, not the whole, but part of the substrate W is dipped into the processing liquid Q. The substrate-liquid contact region (area) of the substrate W may be not less than 50%, preferably not less than 60% of the total area of the substrate W. The substrate-liquid contact area can be set arbitrarily by the lifting mechanism 1831. The substrate W is rotating while it is dipped into the processing liquid. When thus carrying out processing of the substrate W by dipping only part of the substrate W, which is in the tilted position, in the processing liquid Q while rotating the substrate W, a point in the lower processing surface of the substrate W comes into contact with the liquid and then releases the liquid repeatedly.

During processing, because of the tilt of the processing surface, gas bubbles on the processing surface of the substrate W are discharged spontaneously from the deeper side toward the shallower side (this action applies equally to gas bubbles which are caught on the processing surface when dipping the substrate W into the liquid and to gas bubbles which adhere to the processing surface after dipping of the substrate W). According to this embodiment, even if gas bubbles remain adhering on the processing surface of the tilted substrate W in the processing liquid Q (i.e. in the case of gas bubbles not removable merely by the tilt), due to rotation of the substrate W, such bubbles make contact with the air when the processing surface is released from the liquid, whereby the gas bubbles can be removed. Further according to this embodiment, with the provision of the escape grooves 1094 extending radially (in the normal direction) in the peripheral bottom portion of the substrate holding device 1080, air which is to remain on the lower surface of the substrate W when the substrate W is dipped in the processing liquid Q, can be escaped smoothly without impeding the flow of processing liquid Q. The escape grooves 1094 also provide escape routes for gas bubbles discharged from the processing surface of the substrate W.

Further according to this embodiment, during dip processing of the substrate W, the processing liquid Q held in the processing tank body 1013 is jetted obliquely upwardly from the processing liquid supply nozzle 1039 shown in FIG. 45 toward the center of the processing tank body 1013, thereby creating a flow of processing liquid Q in the jet direction. The direction of the flow of processing liquid Q is made consistent with the direction along the tilted processing surface of the substrate W dipped in the processing liquid Q whereby, as shown by arrow C in FIG. 50, a flow of processing liquid Q is created along the tilted processing surface of the substrate W, flowing from the deeper side to the shallow side. The flow of processing liquid Q, flowing toward the side of the substrate W not in contact with the liquid, is thus formed. Accordingly, gas bubbles on the processing surface of the substrate W in the processing liquid Q are forced to flow to the space around the liquid-free region of the substrate W, whereby the gas bubbles can be discharged to the air more effectively.

As the embodiment shown in FIG. 51, a suction means, such as an aspirator 570, may be disposed in the space around the liquid-free region of the substrate W. This makes it possible to forcibly discharge air collected between the processing surface (liquid-free region) of the substrate W and the processing liquid Q to the outside, facilitating smooth contact of the liquid to the processing surface of the substrate W.

Figure 52A:
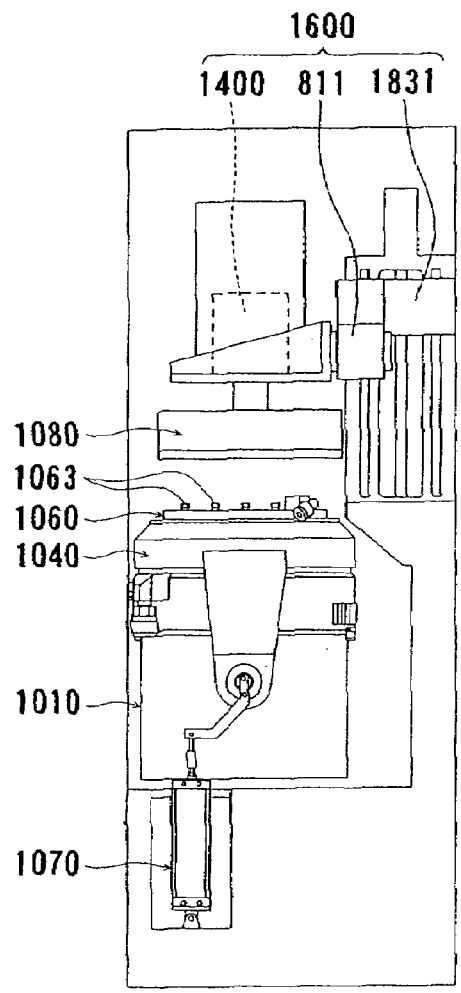
FIG. 52A is a side view illustrating the operation of the substrate processing apparatus.
Figure 52B:
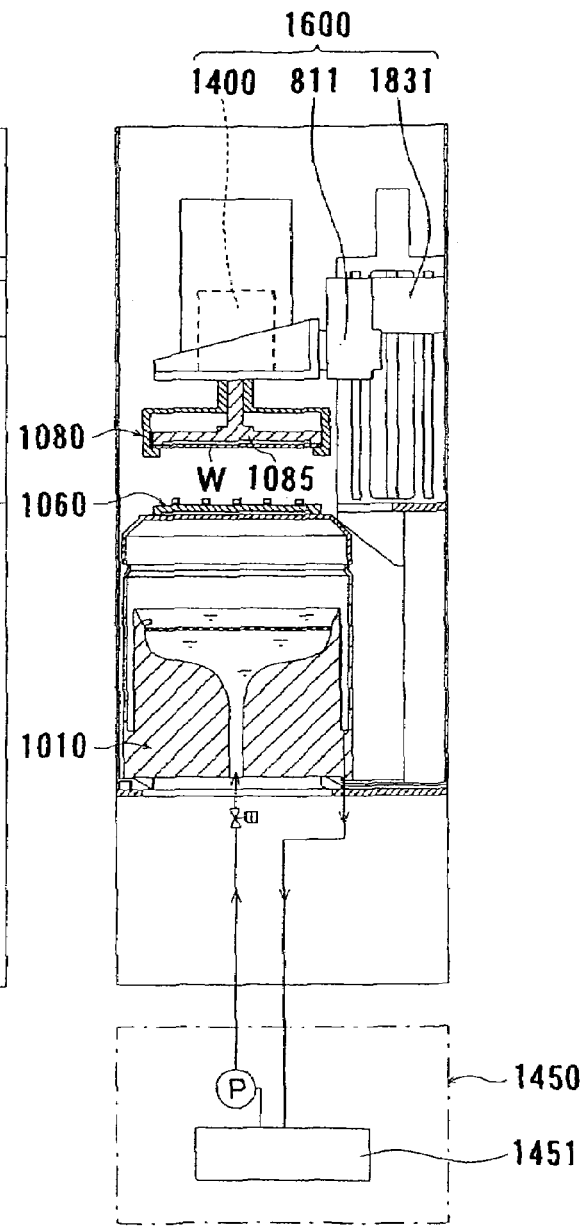
FIG. 52B is a schematic sectional side view of FIG. 52A.

After thus carrying out the first pre-plating treatment for a predetermined time by allowing the processing liquid Q to flow along the processing surface of the substrate W, the lifting mechanism 1831 is driven to raise the substrate holding device 1080 to the position shown in FIGS. 44A and 44B, thereby terminating the first pretreatment, while the tilting mechanism 811 is driven to return the substrate holding device 1080 to the horizontal position. Thereafter, the drive mechanism 1070 is driven to pivot the lid member 1040 so as to close the opening 1011 of the processing tank 1010, as shown in FIG. 52. Next, a cleaning liquid (pure water) is sprayed right upwardly from the nozzles 1063 of the spray nozzle 1060 fixed on the upper surface of the lid member 1040 to clean the processing surface of the substrate W. Since the opening 1011 of the processing tank 1010 is covered with the lid member 1040, the cleaning liquid does not enter the processing tank 1010, and therefore the processing liquid Q in the processing tank 1010 is not diluted, enabling use of the processing liquid Q during circulating.

The cleaning liquid after the cleaning of substrate W is discharged from a not-shown discharge outlet. After completion of the cleaning of substrate W, the pressing member 1085 rises as shown in FIG. 46B. The vacuum hand 337 or 339 (see FIGS. 5A through 5C) of the third substrate transfer robot 310 is inserted from the opening 1081 in the sidewall of the housing 1083 into the housing, attracts the center portion of the back surface of the substrate W, and takes the substrate W out through the opening 1081. The next unprocessed substrate W is set in the substrate holding device 1080, which substrate is subjected to the above-described plating and cleaning steps.

Though in this embodiment the first pretreatment is carried out with the first treatment liquid as the processing liquid Q held in the processing tank 1010, it is also possible to carry out a second pretreatment of a substrate W with a second pretreatment liquid held in the processing tank 1010. Further, it is possible to use the substrate processing apparatus, not as a pre-plating treatment unit, but as a substrate processing unit for carrying out other chemical processing or treatment. Further, treatment of a substrate W by the spray nozzle 1060 is not limited to the cleaning treatment with a cleaning liquid, but is also applicable to other chemical processings or treatments. Furthermore, application of the present invention is not limited to the substrate processing apparatus of the above-described construction. For example, the present invention is applicable to a substrate processing apparatus having such a construction that a pretreatment with a pretreatment liquid and a cleaning treatment are carried out, not in the upper and lower positions as in this embodiment, but at separate sites.

Though in this embodiment dip processing of a substrate W in the processing liquid Q is carried out while the processing surface of the substrate W held in the substrate holding device 1080 is kept tilted, it is also possible to dip a substrate W in a tilted position into the processing liquid Q and then return the substrate W to the horizontal position, and carry out dip processing while the processing surface is kept horizontal.

Thus, in the substrate processing apparatus shown in FIGS. 44A and 44B, the substrate holding device 1080 holding an unprocessed substrate W is tilted at a predetermined angle relative to the horizontal position by the tilting mechanism 811. Next, while rotating the substrate holding device 1080 and the substrate W by the rotating motor 1400, the substrate holding device 1080 in the tilted position is lowered by the lifting mechanism 831 to dip the substrate W into the processing liquid Q in the processing tank 1010. Next, the substrate holding device 1080 and the processing surface of the substrate W are returned to the horizontal position by the tilting mechanism 811, and dip processing of the processing surface of the substrate W is carried out while the substrate W is kept horizontal. After completion of the dip processing, the lifting mechanism 831 is driven to raise the substrate holding device 1080 to the position shown in FIGS. 44A and 44B, thereby terminating the dip processing. The drive mechanism 1070 is then driven to pivot the lid member 1040 so as to close the opening 1011 of the processing tank 1010. The subsequent cleaning step is the same as described above, and hence a description thereof is omitted.

With the provision of the escape grooves 1094 at the bottom of the substrate holding device 1080 and around the substrate W held, when returning the substrate W in the tilted position to the horizontal position after dipping the substrate W into the processing liquid Q, air which has collected between the processing surface of the substrate W and the processing liquid Q can escape to the outside smoothly, as shown in FIG. 49. This prevents air bubbles from remaining on the processing surface of the substrate W after returning the substrate W to the horizontal position, enabling smooth contact of the liquid with the processing surface of the substrate W and thus smooth processing of the processing surface.

Further, with the provision of the processing liquid supply nozzle (processing liquid supply section) 1039 shown in FIG. 45, when dipping the substrate W into the processing liquid Q, a flow of processing liquid Q along the tilted processing surface of the substrate W, flowing from the deeper side to the shallower side, i.e. flowing toward the liquid-free side of the substrate W, can be created as shown in FIG. 50. Accordingly, gas bubbles on the processing surface of the substrate W in the processing liquid Q are forced to flow to the space around the liquid-free region of the substrate W. This prevents gas bubbles from remaining on the processing surface of the substrate W after returning the substrate W to the horizontal position, enabling smooth contact of the processing liquid with the processing surface of the substrate W.

Further, provision of a suction means, such as an aspirator 1570 as shown in FIG. 51, makes it possible to return the substrate W in the tilted position to the horizontal position while forcibly discharging air, which has collected between the processing surface of the substrate W and the processing liquid Q after dipping the substrate W in the tilted position into the processing liquid Q, to the outside. This prevents air bubbles from remaining between the processing surface of the horizontal substrate W and the processing liquid Q, enabling smooth contact of the liquid with the processing surface of the substrate W.

As described hereinabove, according to the present invention, when dipping a substrate into a processing liquid to carry out dip processing of the substrate W, gas bubbles adhering to the processing surface of the substrate in the processing liquid can be removed easily and securely, whereby dip processing of the processing surface can be carried out stably and securely.

FIG. 53A is a schematic sectional view of a substrate holding device 2080, according to an embodiment of the present invention, which is usable for various units such as a pretreatment unit and a plating unit, and FIG. 53B is an enlarged view of the portion A of FIG. 53A. As shown in FIG. 53A, the substrate holding device 2080 includes a substrate holder 2081 and a substrate holder drive section 2120. The substrate holder 2081 comprises a downwardly-open, generally cylindrical substrate receiver 2083, and a generally circular attracting head 2089 housed in the substrate receiver 2083. The substrate receiver 2083 has at its lower end an inwardly projecting temporary retaining portion 2085 for temporarily retaining a substrate W, and has in the circumferential wall substrate insertion openings 2087.

Figure 54:
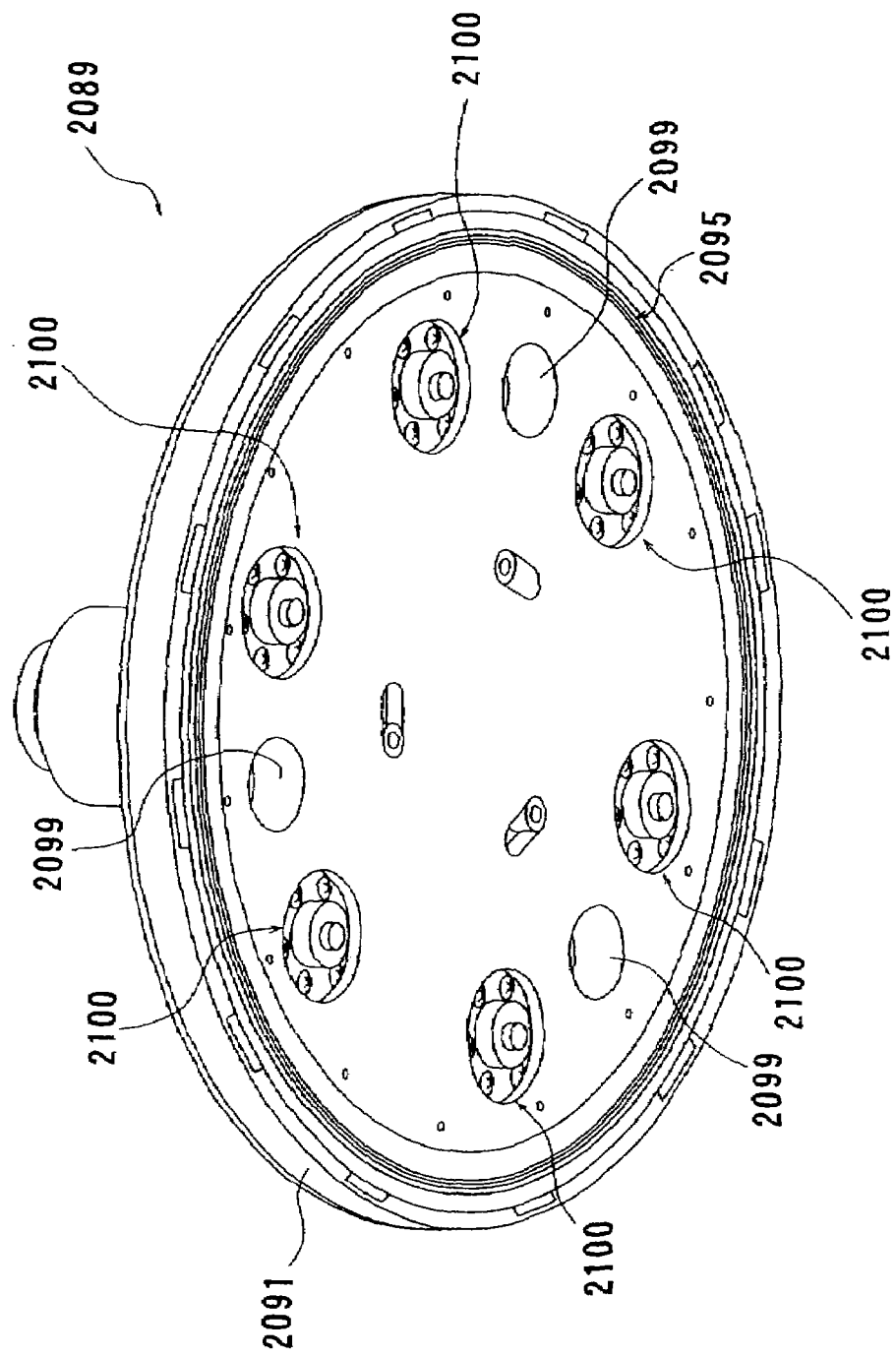
FIG. 54 is a perspective view of an attracting head as viewed from the lower surface side of the head.

FIG. 54 is a perspective view of the attracting head 2089 as viewed from the lower surface side of the head. As shown in FIGS. 54, 53A and 53B, the attraction head 2089 comprises a generally circular base 2091 having in its interior a vacuum supply line (vacuum/gas supply line) 2093, a ring-shaped substrate attracting portion 2095 mounted to the lower surface of the base 2091, pushers 2100 mounted inside the ring-shaped substrate attracting portion 2095, and air vent portions 2099 comprised of openings penetrating the base 2091.

The substrate attracting portion 2095 is formed of a sealing material (e.g. rubber). With the end portion protruding downwardly from the lower surface of the base 2091, the substrate attracting portion 2095 attracts the back surface of the substrate W in contact therewith with a ring-shaped attraction portion, and also functions as a seal for preventing intrusion of the plating solution into the back surface (inside of the ring-shaped vacuum-attracted portion of the back surface) of the substrate W. In particular, the substrate attracting portion 2095 has, in the portion to be in contact with the substrate W, a substrate attracting groove (slit for attraction and release of substrate) 2097. The substrate attracting groove 2097 is connected to the vacuum supply line 2093 so that the substrate W is attracted to and released from the substrate attracting groove 2097. The substrate attracting portion 2095 is not limited to the shape shown in FIGS. 53A and 53B, but may be of any shape insofar as it can attract a substrate with a ring-shaped attraction portion of certain width.

Each push 2100 is comprised of a pusher body 2110 housed in a housing portion 2103 provided in the inside of an upwardly-open cylindrical box-shaped case 2101, and a flange portion 2105, overhanging from the periphery of the case 2101, fixed to the base 2091 by a fixing tool 2107. The pusher body 2110 is formed of a flexible elastic material (fluororesin, synthetic rubber, etc.), and has a pressing portion 2113 at the end of a bellows-shaped circumferential wall 2111. The pressing portion 2113 is retractably inserted in a through-hole 2109 provided in the case 2101. The lower surface of the pressing portion 2113 is positioned slightly above the lower surface of the substrate attracting portion 2095.

The back surface side of the pusher body 2110 is connected to the vacuum supply line 2093. When a vacuum pressure is supplied to the vacuum supply 2093, the interior of the pusher body 2110 becomes a vacuum state and the circumferential wall 2111 of the pusher body 2110 shrinks, whereby the pressing portion 2113 retracts into the case 2101 (see FIG. 53B). When a gas is supplied to the vacuum supply line 2093, on the other hand, the circumferential wall 2111 of the pusher body 2110 extends and the pressing portion 2113 protrudes out of the case 2101 (see FIG. 57).

The substrate holder drive section 2120 internally includes a substrate rotating motor 2121 for rotationally driving the attracting head 2089, and a substrate receiver driving cylinder 2123 for vertically moving the substrate receiver 2083 between predetermined positions (at least three positions). The attracting head 2089 is rotated by the substrate rotating motor 2121, and the substrate receiver 2083 is moved vertically by the substrate receiver driving cylinder 2123. Thus, the attracting head 2089 only rotates and does not move vertically, while the substrate receiver 1083 only moves vertically and does not rotate.

The operation of the substrate holding device 2080 will now be described. First, as shown in FIG. 53A, while the attracting head 2089 is not rotated, the substrate receiver 2083 is moved to the lowermost position (substrate transfer position), and a substrate W, which is attracted and held by a substrate transfer hand 2127, is inserted from the substrate insertion opening 2087 into the substrate receiver 2083, and then the attraction of the substrate transfer hand 2127 is released to thereby place the substrate W on the temporary retaining portion 2085. At this time, the processing surface of the substrate W is facing downward. Thereafter, the substrate transfer hand 2127 is withdrawn through the substrate insertion opening 2087.

Figure 55B:
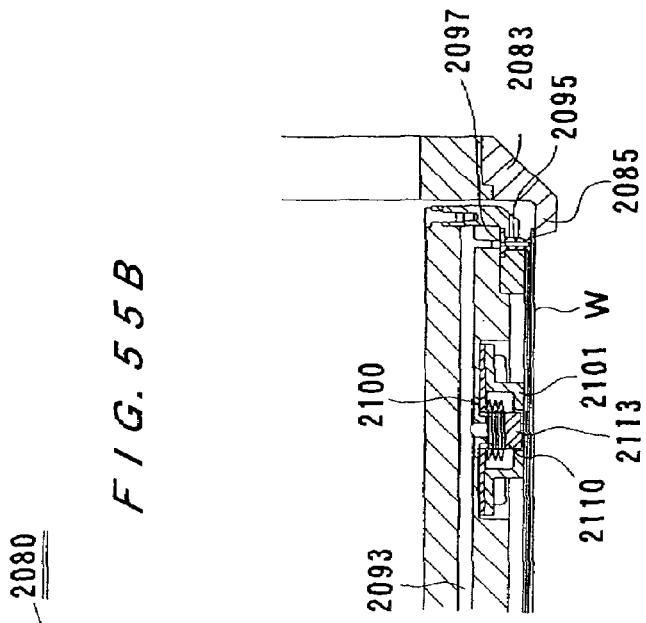
FIG. 55B is an enlarged view of the main portion of FIG. 55A.
Figure 55A:
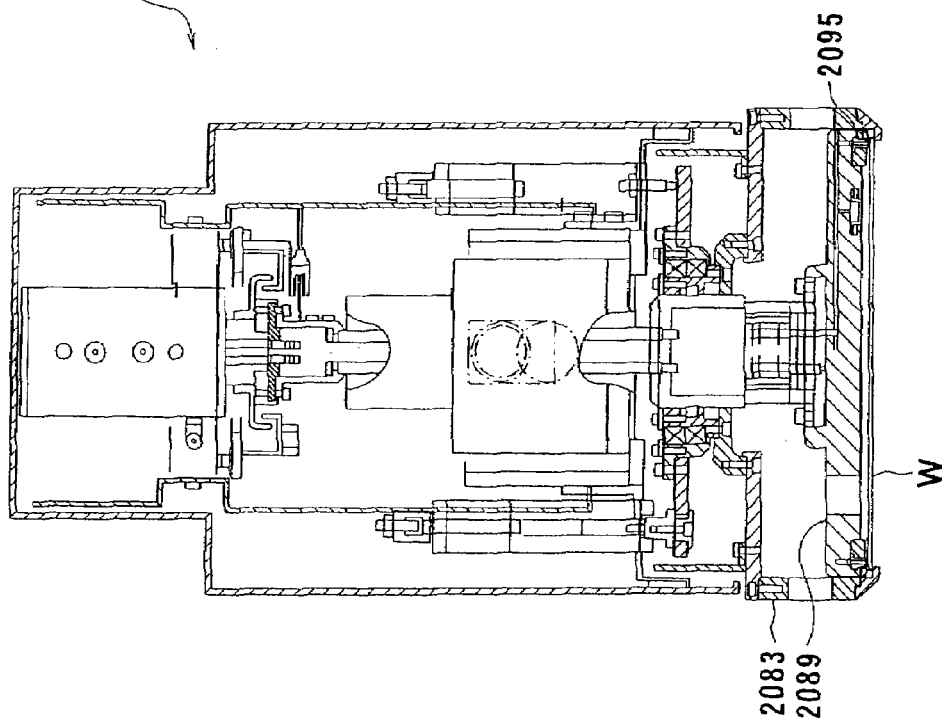
FIG. 55A is a diagram illustrating the operation of the substrate holding device.

Next, as shown in FIGS. 55A and 55B, the substrate receiver 2083 is raised so as to bring the end of the substrate attracting portion 2095 into pressure contact with the peripheral back surface (upper surface) of the substrate W while the substrate W is attracted by vacuuming via the substrate attracting groove 2097, thereby attracting the substrate W to the substrate attracting portion 2095. The vacuum force is generated within the substrate attracting groove 2097 inside the portion of the substrate attracting portion 2095 in contact with the substrate W. The position of the substrate receiver 2083 at this moment is herein called substrate fixing position. The portion of the back surface (the opposite surface to the processing surface) of the substrate W surrounded by the substrate attracting portion 2095 is shut off from the processing surface by the sealing of the substrate attracting portion 2095.

As described previously, in the case of attracting a substrate W by vacuum, a suction pad has conventionally been employed in general. A suction pad, the whole inside space of which becomes vacuum upon operation, has the problems that the substrate W can deform largely from the center to a peripheral portion, whereby uniform plating cannot be effected and, what is worse, the substrate W would be broken.

According to the present invention, a peripheral region of a substrate W is sealed and attracted by the ring-shaped substrate attracting portion 2095 of very small width (in the radial direction), thereby minimizing the attraction width and eliminating the adverse influence (such as deformation) on the substrate W. In particular, the width of the substrate attracting is very narrow, and the portion of the substrate W in contact with the substrate attracting portion 2095 is a peripheral region, whose width in the radial direction is within 5 mm. Since the substrate attraction portion 2095 is in contact with only the peripheral portion of the back surface of the substrate W, there is little fear of a lowering of chemical liquid temperature due to heat transmission through the surface of the substrate attracting portion 2095 in contact with the substrate W.

Next, as shown in FIGS. 56A and 56B, the substrate receiver 2083 is lowered slightly (e.g. several mm) to detach the substrate W from the temporary retaining portion 2085. The position of the substrate receiver 2083 at this moment is herein called the substrate processing position. When the whole substrate holding device 2080 is lowered to dip the substrate W into a not-shown plating solution, since only the back surface of the substrate W is attracted and held, the entire processing surface as well as the edge portion of the substrate W can be dipped in the plating solution and can be processed.

Further, since only the back surface of the substrate W is attracted and held, the flow L of plating solution Q (see FIG. 56B) is not impeded and a uniform flow of plating solution Q is created over the entire processing surface of the substrate W when the substrate is dipped into the plating solution Q. With the flow of plating solution Q, gas bubbles caught on the processing surface of the substrate W and gas bubbles generated during plating can be discharged upward from the processing surface of the substrate W.

Thus, a non-uniform flow of plating solution that may adversely affect plating can be prevented and the influence of gas bubbles can be eliminated, thereby enabling uniform plating to be carried out over the entire processing surface, including the edge, of the substrate. Further, since the inside of the ring-shaped vacuum-attracted portion of the back surface of the substrate W is shut off from the processing surface by the sealing of the substrate attracting portion 2095, the processing liquid can be prevented from intruding into the inside of the substrate attracting portion 2095 on the back surface of the substrate W.

During processing, the pressing portion 2113 of the pusher body 2110 of the pusher 2100 which is connected to the vacuum supply line 2093, due to vacuuming, is retracted in the case 2102 and is apart from the back surface of the substrate W at a certain small distance. Accordingly, there is no fear of heat transfer between the chemical liquid and the pressing portion 2113 through contact therebetween during processing.

According to the present invention, with the provision of the openings 2099 in the base 2091 of the attracting head 2089, the space defined by the base 2091, the substrate attracting portion 2095 and the substrate W is not hermetically closed. Accordingly, if a gas within the space expands or contracts by, for example, dipping of the substrate W in a plating solution, there is no fear of deformation of the substrate W due to the gas expansion or contraction.

After the completion of plating of the substrate W, the substrate receiver 2083 is raised to the substrate fixing position shown in FIGS. 55A and 55B to place the substrate W on the temporary retaining portion 2085. A gas (inert gas, e.g. nitrogen gas) is supplied to the vacuum supply line 2093 to emit the gas from the substrate attracting groove 2097 and, at the same time, pressurize the interior of the pusher body 2110 of the pusher 2100 so as to force the pressing portion 2113 to protrude from the case 2101, thereby pressing on the back surface of the substrate W. At the same time, the substrate receiver 2083 is lowered whereby the substrate W is separated from the substrate attracting portion 2095, as shown in FIG. 57. The substrate receiver 2083 is further lowered to the substrate transfer position shown in FIGS. 53A and 53B. The substrate transfer hand 2127 is then inserted from the substrate insertion opening 2087, and the substrate W is taken out.

By thus emitting a gas from the substrate attracting groove 2097 and, at the same time, allowing the pressing portion 2113 of the pusher 2100 to press on the back surface of the substrate W, the substrate W can be detached from the substrate attracting portion 2095 easily and securely even when if the substrate attracting portion 2095 formed of a sealing material (e.g. rubber), due to a change in the quality with time, etc., is sticky to a substrate and therefore the substrate W attracted to the substrate attracting portion 2095 is hard to detach from it only by the gas emission from the substrate attracting groove 2097. Thus, it becomes possible to securely detach the substrate W after processing from the substrate attracting portion 2095 by the combination of the pressing of the pusher 2100 and the gas emission from the substrate attracting portion 2095 also as an annular seal, simply by supplying a gas to the vacuum supply line 2093.

The substrate holding device of the present invention may be used not only for the pre-cleaning unit 240, the pretreatment units 320, 340 and the plating unit 360 shown in FIG. 2, but also for various other substrate processing apparatuses and systems.

Further, it will be evident that various modifications may be made to the shape and the structure of the pusher 2100. For example, it is possible to provide in the pusher body 2110 a spring means, such as a helical spring, for forcing the pressing portion 2113 to protrude from the case 2102 or retract into the case 2102.

As described hereinabove, the present invention has the advantage that a substrate can be securely detached from a seal member regardless of the material of the seal member and without deformation of the substrate.

What is claimed is:

1. A substrate processing apparatus, comprising:
   a substrate holding device for holding a substrate in a horizontal position, said substrate holding device being operable to lower the substrate into a processing liquid and to hold the substrate within the processing liquid in a bubble removal position and a substrate processing position; and
   a processing tank for holding the processing liquid, said processing tank including:
      a gas bubble removing section including a circular wall having a circular top end portion with an outer diameter smaller than an outer diameter of the substrate to be held by said substrate holding device; and
      a processing liquid supply inlet for supplying the processing liquid into said processing tank such that the processing liquid must flow through a center area surrounded by said circular wall toward a lower surface of the substrate to be held by said substrate holding device and then radially along the lower surface of the substrate toward a periphery of the substrate;

wherein said substrate holding device and said gas bubble removing section are arranged such that, when the substrate is lowered into the processing liquid in said processing tank to the bubble removal position which is lower than the substrate processing position, a circular slit is formed between said circular top end portion of said circular wall and a periphery of the lower surface of the substrate to thereby increase a flow speed of the processing liquid flowing radially along the lower surface of the substrate through the circular slit so as to remove gas bubbles resting against the lower surface of the substrate; and wherein said substrate holding device and said gas bubble removing section are arranged such that, when the substrate is raised to the substrate processing position within the processing liquid from the bubble removal position, a sufficiently wide clearance is formed between said circular top end portion of said circular wall and the periphery of the lower surface of the substrate to thereby form a stable flow of the processing solution.

2. The substrate processing apparatus of claim 1, wherein said gas bubble removing section further includes a current plate arranged horizontally within said processing tank, said circular wall extending upward from said current plate, a plurality of through-holes being formed in said current plate within said center area surrounded by said circular wall.

3. The substrate processing apparatus of claim 2, wherein said processing tank further including a first tank surrounding said circular wall, said circular wall forming a second tank within said processing tank, said first tank having an outer circular wall with a circular top end portion located higher than said circular top end portion of said circular wall of said second tank.

4. The substrate processing apparatus of claim 3, wherein said processing tank further includes a cover portion surrounding said first tank such that an overflow groove is formed between said first tank and said cover portion, a portion of the processing liquid flowing over said circular top end portion of said circular wall of said first tank flows into said overflow groove to be recovered.

5. The substrate processing apparatus of claim 1, wherein said processing tank further including a first tank surrounding said circular wall, said circular wall forming a second tank within said processing tank, said first tank having an outer circular wall with a circular top end portion located higher than said circular top end portion of said circular wall of said second tank.

6. The substrate processing apparatus of claim 5, wherein said processing tank further includes a cover portion surrounding said first tank such that an overflow groove is formed between said first tank and said cover portion, a portion of the processing liquid flowing over said circular top end portion of said circular wall of said first tank flows into said overflow groove to be recovered.

7. The substrate processing apparatus of claim 1, wherein said circular top end portion of said circular wall comprises a circular top end portion of a peripheral portion of said processing tank.

8. The substrate processing apparatus of claim 1, wherein said circular top end portion of said circular wall comprises a circular top end portion of an inner tank located inside a peripheral portion of said processing tank such that said inner tank and said peripheral portion of said processing tank form a double-tank structure.

9. The substrate processing apparatus of claim 1, wherein said substrate holding device has an escape groove passing through a bottom portion thereof for allowing the processing liquid flowing along the lower surface of the substrate to pass through the substrate holding device.

10. The substrate processing apparatus of claim 9, wherein said escape groove comprises one of a plurality of escape grooves passing radially through said bottom portion of said substrate holding device, said plurality of escape grooves being evenly spaced around said bottom portion of said substrate holding device.

11. A substrate processing apparatus, comprising:

a substrate holding device for holding a substrate in a horizontal position, said substrate holding device being operable to lower the substrate into a processing liquid; and a processing tank for holding the processing liquid, said processing tank including:

a gas bubble removing section including a circular wall having a circular top end portion with an outer diameter smaller than an outer diameter of the substrate to be held by said substrate holding device, and a current plate arranged horizontally within said processing tank, said circular wall extending upward from said current plate, a plurality of through-holes being formed in said current plate within said center area surrounded by said circular wall, said current plate extending radially outward of said circular wall, a portion of said current plate located radially outward of said circular wall being free of any through-holes; and a processing liquid supply inlet for supplying the processing liquid into said processing tank such that the processing liquid must flow through a center area surrounded by said circular wall toward a lower surface of the substrate to be held by said substrate holding device and then radially along the lower surface of the substrate toward a periphery of the substrate so as to remove gas bubbles resting against the lower surface of the substrate;

wherein said substrate holding device and said gas bubble removing section are arranged such that, when the substrate is lowered into the processing liquid in said processing tank, a circular slit is formed between said circular top end portion of said circular wall and a periphery of the lower surface of the substrate to thereby increase a flow speed of the processing liquid flowing radially along the lower surface of the substrate through the circular slit.

12. The substrate processing apparatus of claim 11, wherein said substrate holding device has an escape groove passing through a bottom portion thereof for allowing the processing liquid flowing along the lower surface of the substrate to pass through the substrate holding device.

13. The substrate processing apparatus of claim 12, wherein said escape groove comprises one of a plurality of escape grooves passing radially through said bottom portion of said substrate holding device, said plurality of escape grooves being evenly spaced around said bottom portion of said substrate holding device.

* * * * *